US012289894B1

(12) United States Patent
Dokania et al.

(10) Patent No.: US 12,289,894 B1
(45) Date of Patent: Apr. 29, 2025

(54) METHOD OF FABRICATING TRANSISTORS AND STACKED PLANAR CAPACITORS FOR MEMORY AND LOGIC APPLICATIONS

(71) Applicant: Kepler Computing Inc., San Francisco, CA (US)

(72) Inventors: Rajeev Kumar Dokania, Beaverton, OR (US); Noriyuki Sato, Hillsboro, OR (US); Rafael Rios, Austin, TX (US); Amrita Mathuriya, Portland, OR (US); Niloy Mukherjee, San Ramon, CA (US); Somilkumar J. Rathi, San Jose, CA (US); Sasikanth Manipatruni, Portland, OR (US); Tanay Gosavi, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 345 days.

(21) Appl. No.: 17/807,655

(22) Filed: Jun. 17, 2022

Related U.S. Application Data

(63) Continuation of application No. 17/807,637, filed on Jun. 17, 2022.

(51) Int. Cl.
*H10B 53/20* (2023.01)
*H01L 23/522* (2006.01)
(Continued)

(52) U.S. Cl.
CPC ......... *H10B 53/30* (2023.02); *H01L 23/5226* (2013.01); *H01L 23/5283* (2013.01); *H10B 53/10* (2023.02); *H10B 53/20* (2023.02)

(58) Field of Classification Search
CPC ............. H01L 23/5223; H01L 23/5226; H01L 23/5283; H01L 28/55; H01L 28/56;
(Continued)

(56) References Cited

U.S. PATENT DOCUMENTS 5,086,412 A 2/1992 Jaffe et al.
5,539,279 A 7/1996 Takeuchi et al.
(Continued)

FOREIGN PATENT DOCUMENTS

CN 107710412 A * 2/2018 ........ H01L 27/11507
JP H0982907 A 3/1997
(Continued)

OTHER PUBLICATIONS

Final Office Action notified Aug. 15, 2022 for U.S. Appl. No. 17/346,083.
(Continued)

*Primary Examiner* — Matthew E Warren
(74) *Attorney, Agent, or Firm* — MUGHAL GAUDRY & FRANKLIN PC

(57) ABSTRACT

A method of fabricating a system includes fabricating a plurality of transistors and coupling a forming a bridge structure connected between a gate contact of a first transistor with a drain contact of a second transistor. The method further includes fabricating a multi-level memory structure including capacitors that comprise a ferroelectric material or a paraelectric material. The capacitors within a given level are coupled together by a plate electrode. The method further includes forming a signal electrode coupled with the plate electrode.

20 Claims, 39 Drawing Sheets

(51) Int. Cl.
  *H01L 23/528* (2006.01)
  *H10B 53/10* (2023.01)
  *H10B 53/30* (2023.01)

(58) Field of Classification Search
  CPC ......... H01L 28/57; H01L 28/40; H01L 28/60; H01L 2924/19102; H10B 12/03; H10B 12/033; H10B 12/035; H10B 12/30; H10B 12/31; H10B 53/10; H10B 53/20
  See application file for complete search history.

(56) References Cited

U.S. PATENT DOCUMENTS

| | | | |
|---|---|---|---|
| 5,739,563 | A | 4/1998 | Kawakubo et al. |
| 6,368,910 | B1 | 4/2002 | Sheu et al. |
| 6,656,301 | B2 | 12/2003 | Kirby |
| 6,798,686 | B2 | 9/2004 | Takashima |
| 6,873,536 | B2 | 3/2005 | Komatsuzaki |
| 6,906,944 | B2 | 6/2005 | Takeuchi et al. |
| 7,075,134 | B2 * | 7/2006 | Paz de Araujo ...... H01L 23/642 257/295 |
| 7,169,621 | B2 | 1/2007 | Hasegawa et al. |
| 7,405,959 | B2 | 7/2008 | Koide et al. |
| 7,791,922 | B2 | 9/2010 | Doumae et al. |
| 8,300,446 | B2 | 10/2012 | Qidwal |
| 8,865,628 | B2 | 10/2014 | Manabe et al. |
| 9,472,560 | B2 | 10/2016 | Ramaswamy et al. |
| 9,601,545 | B1 * | 3/2017 | Tu .................... H01L 21/76895 |
| 10,847,201 | B2 | 11/2020 | Manipatruni et al. |
| 10,998,025 | B2 | 5/2021 | Manipatruni et al. |
| 11,482,270 | B1 | 10/2022 | Dokania et al. |
| 2002/0079520 | A1 * | 6/2002 | Nishihara ............... H10B 53/30 257/245 |
| 2003/0012984 | A1 | 1/2003 | Ueda |
| 2003/0112650 | A1 | 6/2003 | Kang |
| 2004/0089854 | A1 | 5/2004 | Chen et al. |
| 2004/0195601 | A1 * | 10/2004 | Kumura ................. H10B 53/30 257/295 |
| 2004/0245547 | A1 | 12/2004 | Stipe |
| 2006/0002170 | A1 | 1/2006 | Kumura et al. |
| 2012/0127776 | A1 | 5/2012 | Kawashima |
| 2017/0069735 | A1 | 3/2017 | Oh et al. |
| 2017/0277459 | A1 | 9/2017 | Rodriguez et al. |
| 2018/0331113 | A1 | 11/2018 | Liao et al. |
| 2020/0051607 | A1 | 2/2020 | Pan et al. |
| 2021/0142837 | A1 | 5/2021 | Yu et al. |
| 2021/0193209 | A1 | 6/2021 | Swami et al. |
| 2023/0284456 | A1 * | 9/2023 | Dokania ............. G11C 11/2273 257/5 |
| 2023/0301113 | A1 * | 9/2023 | Sato ....................... H10B 53/30 257/295 |
| 2024/0373645 | A1 * | 11/2024 | Chen .................... G11C 11/221 |

FOREIGN PATENT DOCUMENTS

| | | | |
|---|---|---|---|
| JP | H10242426 | A | 9/1998 |
| JP | H1174488 | A | 3/1999 |
| JP | 2000174224 | A | 6/2000 |
| JP | 2001237393 | A | 8/2001 |
| JP | 2002026256 | A | 1/2002 |
| JP | 2002158339 | A | 5/2002 |
| JP | 2005142322 | A | 6/2005 |
| JP | 2005322925 | A | 11/2005 |
| JP | 2008210955 | A | 9/2008 |
| JP | 2010021544 | A | 1/2010 |
| JP | 2011151370 | A | 8/2011 |
| JP | 2011199071 | A * | 10/2011 |
| JP | 2017518632 | A | 7/2017 |
| KR | 100481867 | B1 | 4/2005 |
| KR | 20050105695 | A | 11/2005 |
| KR | 100895740 | B1 | 4/2009 |
| WO | WO-03041172 | A1 * | 5/2003 ............. G11C 11/22 |

OTHER PUBLICATIONS

Office Action notified Sep. 12, 2022 for U.S. Appl. No. 17/367,217.
Non-Final Office Action notified Aug. 16, 2022 for U.S. Appl. No. 17/367,217.
Office Action notified Nov. 4, 2022 for U.S. Appl. No. 17/530,362.
Office Action notified Nov. 21, 2022 for U.S. Patent Application No. 7/532,657.
Non-Final Office Action notified Nov. 28, 2022 for U.S. Appl. No. 17/532,552.
Non-Final Office Action notified Oct. 12, 2022 for U.S. Appl. No. 17/530,365.
Non-Final Office Action notified Oct. 26, 2022 for U.S. Appl. No. 17/531,577.
Non-Final Office Action notified Sep. 1, 2022 for U.S. Appl. No. 17/339,850.
Non-Final Office Action notified Sep. 7, 2022 for U.S. Appl. No. 17/530,360.
Notice of Allowance notified Apr. 4, 2023 for U.S. Appl. No. 17/532,552.
Notice of Allowance notified Aug. 17, 2022 for U.S. Appl. No. 17/346,087.
Notice of Allowance notified Aug. 22, 2022 for U.S. Appl. No. 7/390,791.
Notice of Allowance notified Aug. 25, 2022 for U.S. Appl. No. 17/367,101.
Notice of Allowance notified Aug. 31, 2022 for U.S. Appl. No. 17/359,325.
Notice of Allowance notified Jan. 20, 2023 for U.S. Appl. No. 17/532,657.
Notice of Allowance notified Jan. 30, 2023 for U.S. Appl. No. 17/531,535.
Notice of Allowance notified Mar. 13, 2023 for U.S. Appl. No. 17/516,577.
Notice of Allowance notified Mar. 15, 2023 for U.S. Appl. No. 17/516,293.
Notice of Allowance notified Mar. 17, 2023 for U.S. Appl. No. 17/532,545.
Notice of Allowance notified Mar. 22, 2023 for U.S. Appl. No. 17/531,535.
Notice of Allowance notified Nov. 17, 2022 for U.S. Appl. No. 17/530,363.
Notice of Allowance notified Nov. 22, 2022 for U.S. Appl. No. 17/530,362.
Notice of Allowance notified Nov. 25, 2022 for U.S. Appl. No. 17/531,577.
Notice of Allowance notified Oct. 20, 2022 for Taiwan Patent Application No. 110129115.
Notice of Allowance notified Oct. 31, 2022 for U.S. Appl. No. 17/390,796.
Notice of Allowance notified Sep. 21, 2022 for U.S. Appl. No. 17/530,366.
Notice of Allowance notified Sep. 23, 2022 for U.S. Appl. No. 17/339,850.
Notice of Allowance notified Sep. 26, 2022 for U.S. Appl. No. 17/367,217.
Notice of Preliminary Rejection notified Oct. 28, 2022 for Korean Patent Application No. 10-2021-7027303.
Notice of Reasons for Rejection notified Dec. 6, 2022 for Japanese Patent Application No. 2021-546823.
Notice of Reasons for Rejection notified Nov. 22, 2022 for Japanese Patent Application No. 2021-546864.
Restriction Requirement notified Aug. 26, 2022 for U.S. Appl. No. 17/390,796.
Gupta et al., "Buried Power Rail Integration with Si FinFETs for CMOS Scaling beyond the 5 nm Node," 2020 IEEE Symposium on VLSI Technology, Jun. 16-19, 2020, Honolulu, HI, US. 2 pages. DOI: 10.1109/VLSITechnology18217.2020.9265113.

(56) References Cited

OTHER PUBLICATIONS

Gupta et al., "Buried Power Rail Scaling and Metal Assessment for the 3 nm Node and Beyond," 2020 IEEE International Electron Devices Meeting (IEDM), Dec. 12-18, 2020, San Francisco, CA, US. 4 pages. DOI: 10.1109/IEDM13553.2020.9371970.

Mathur et al., "Buried Bitline for sub-5nm SRAM Design," 2020 IEEE International Electron Devices Meeting (IEDM), San Francisco, CA, US. 4 pages. DOI: 10.1109/IEDM13553.2020.9372042.

Ryckaert et al., "Extending the Roadmap Beyond 3nm Through System Scaling Boosters: A Case Study on Buried Power Rail and Backside Power Delivery," 2019 Electron Devices Technology and Manufacturing Conferences (EDTM), IEEE. pp. 50-52 (3 pages).

Salahuddin et al., "Buried Power SRAM DTCO and System-Level Benchmarking in N3," 2020 Symposium on VLSI Technology Digest of Technical Papers—JFS3.3 IEEE. 2 pages.

Salahuddin et al., "SRAM with Buried Power Distribution to Improve Write Margin and Performance in Advanced Technology Nodes," IEEE Electron Device Letters, vol. 40, Issue: 8, Aug. 2019. 4 pages. DOI: 10.1109/LED.2019.2921209.

Yeh et al. "Fabrication and Investigation of Three-Dimensional Ferroelectric Capacitors for the Application of FeRAM," AIP Advances 6, 035128 (2016); https://doi.org/10.1063/1.4945405, Published Online: Mar. 30, 2016, 13 pages.

Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.

\* cited by examiner

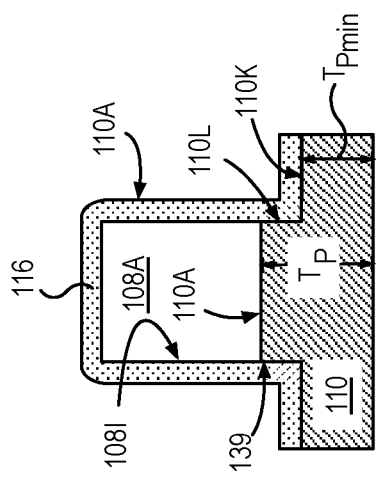
FIG. 1E
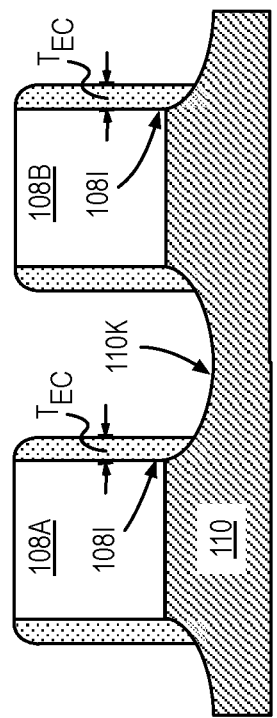
FIG. 1F
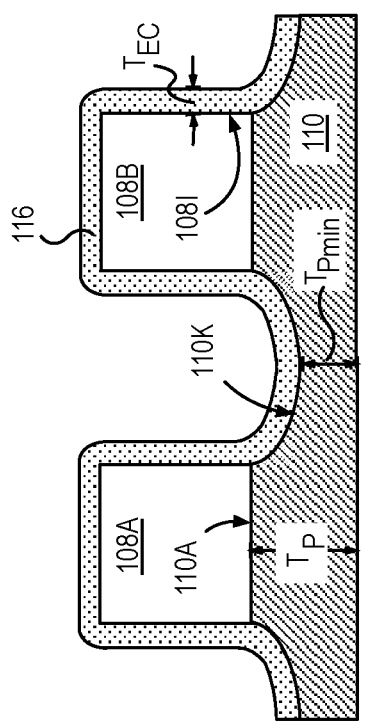
FIG. 1H
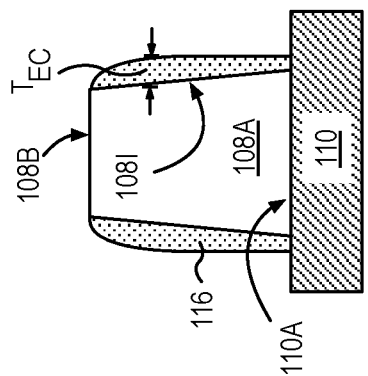
FIG. 1G
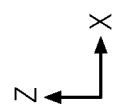

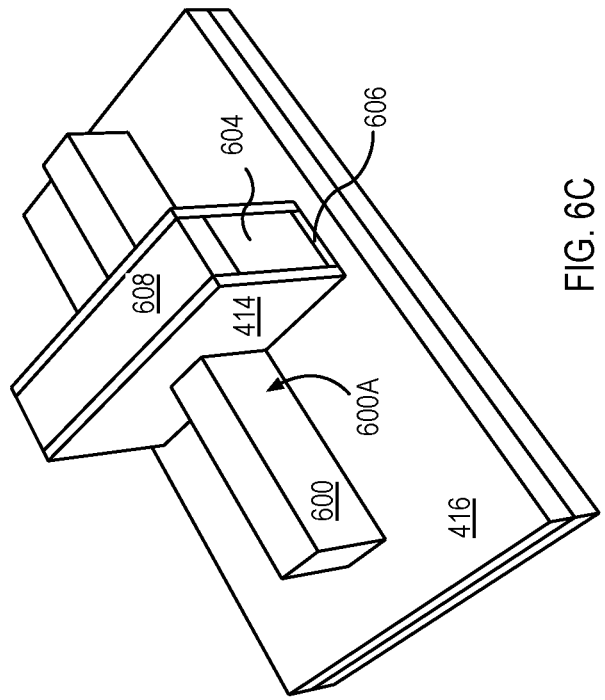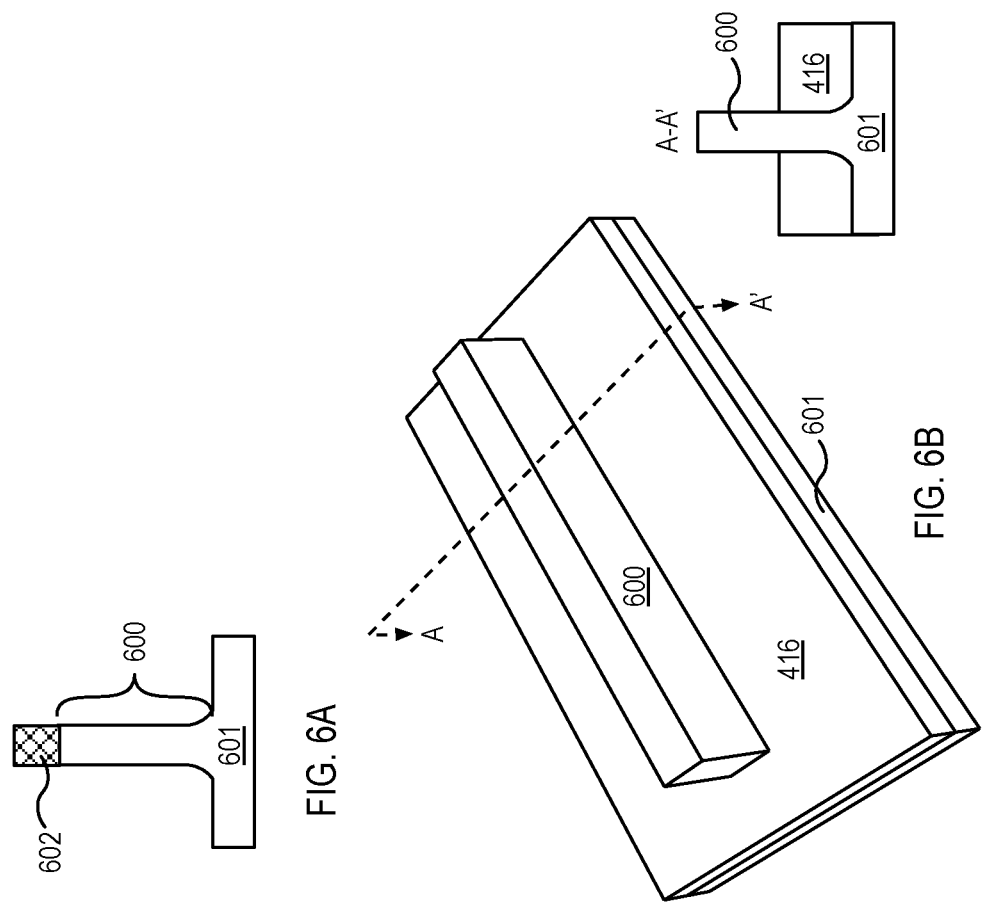

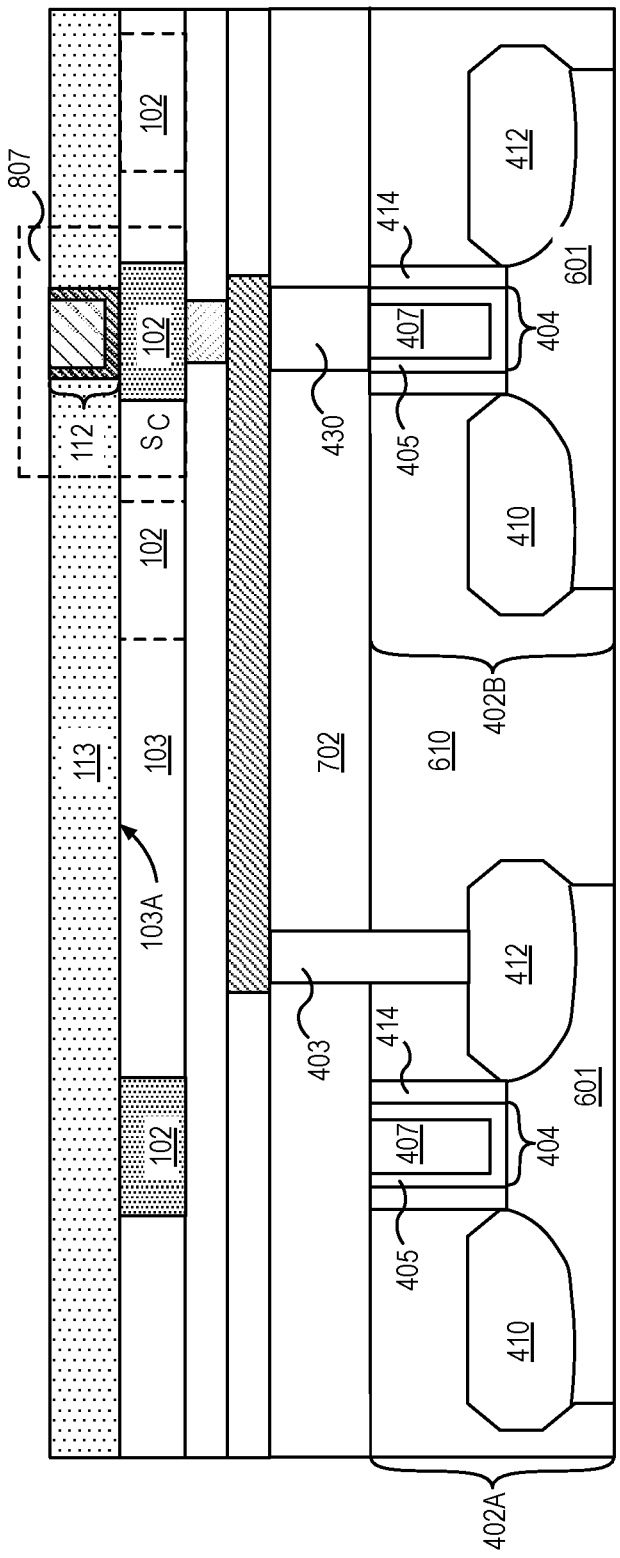
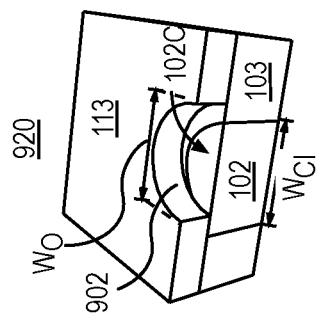
FIG. 9C
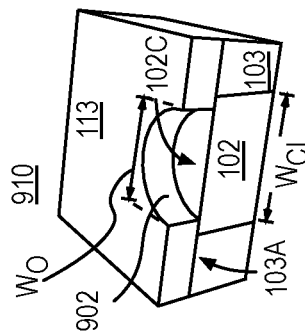
FIG. 9B
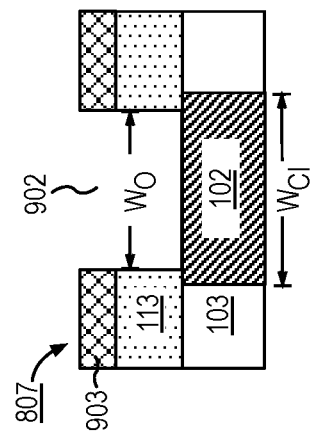
FIG. 9A
FIG. 8E

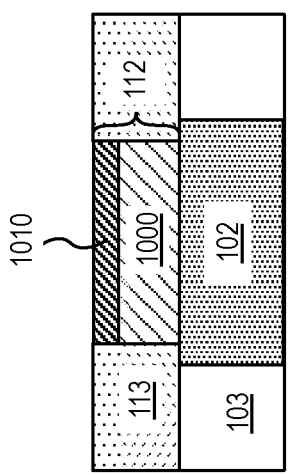
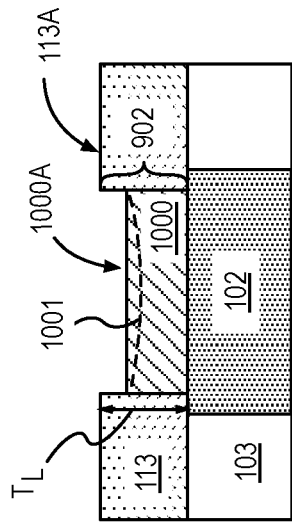
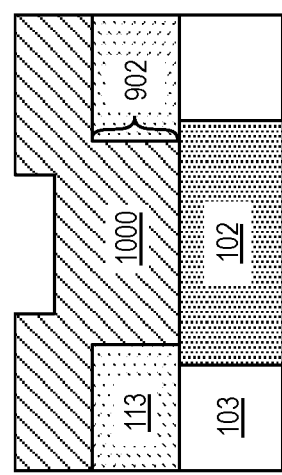
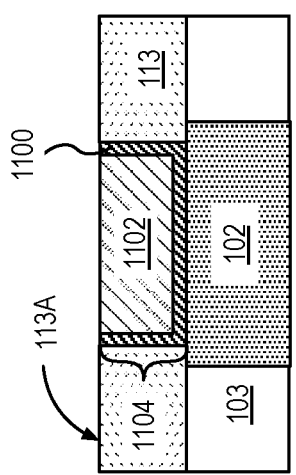
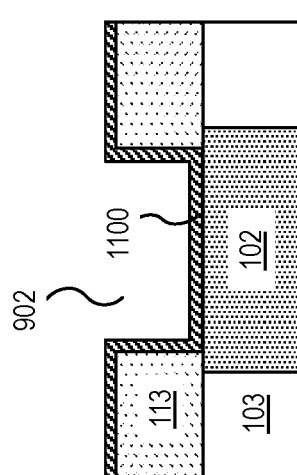

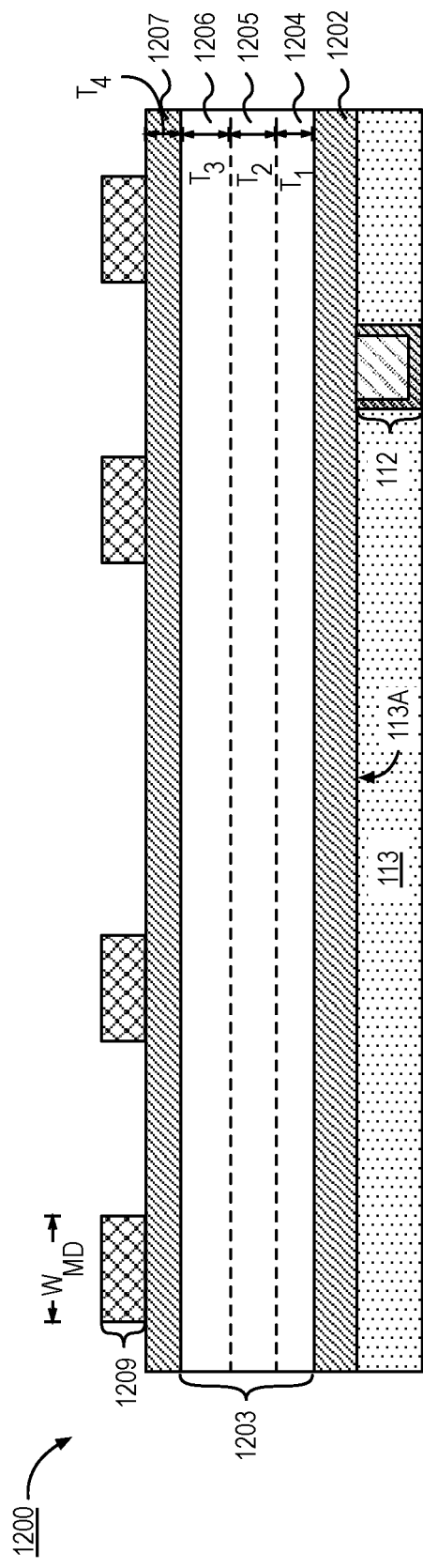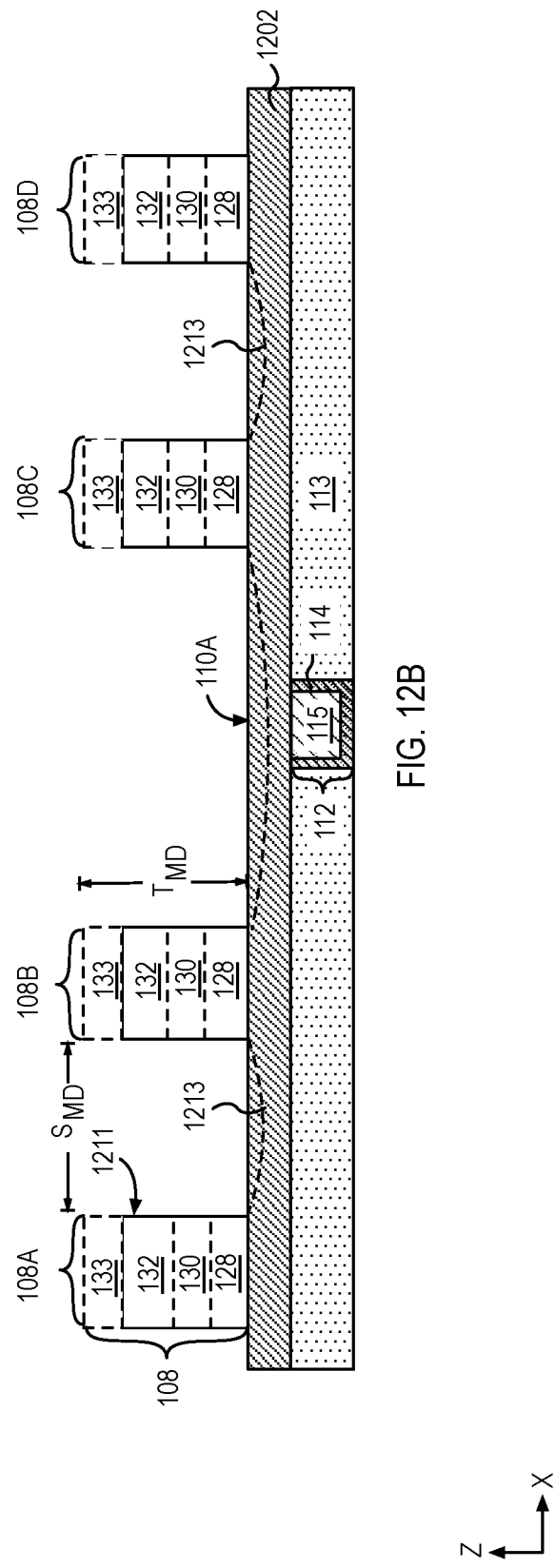
FIG. 12A
FIG. 12B

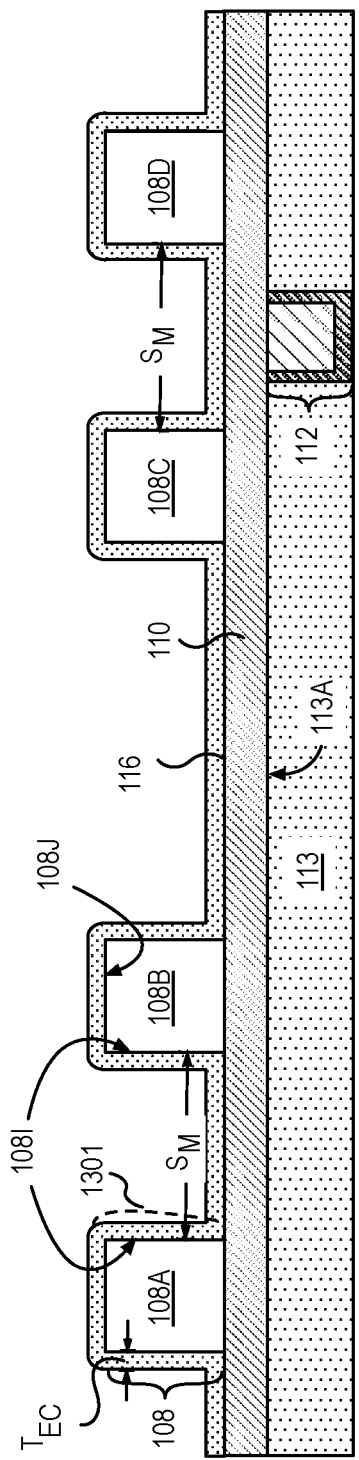
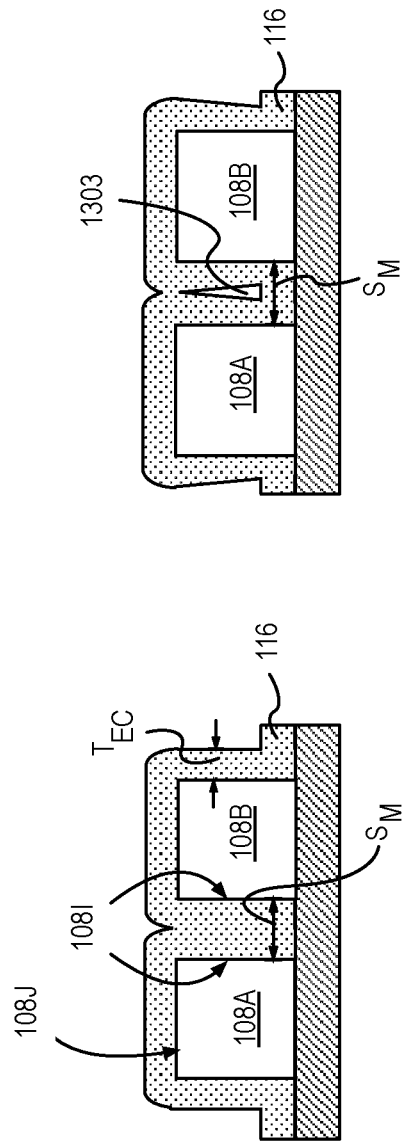
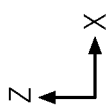
FIG. 13A
FIG. 13B
FIG. 13C

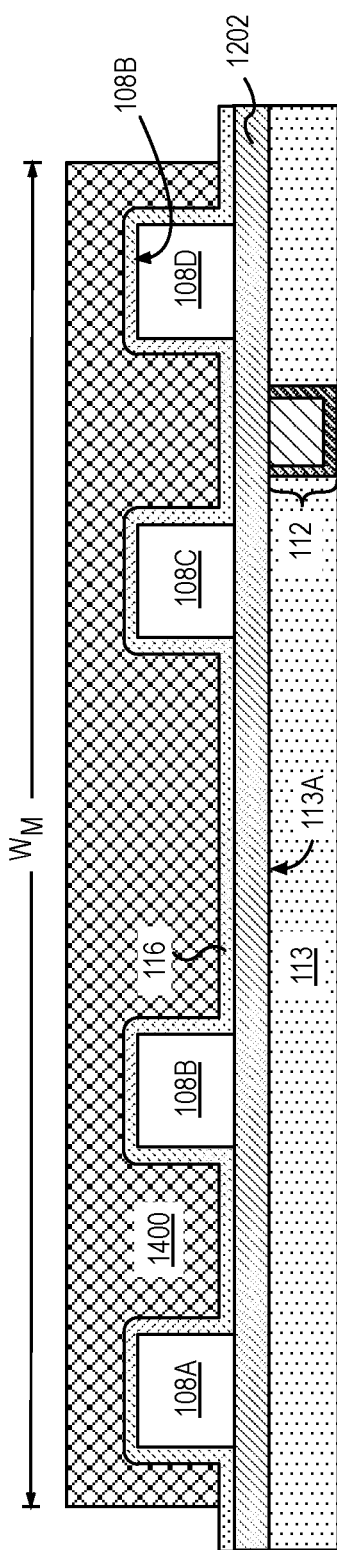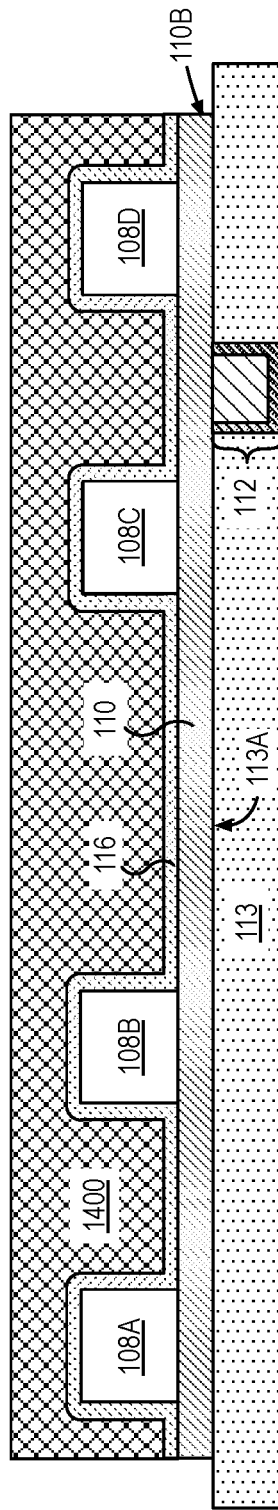
FIG. 14A
FIG. 14B

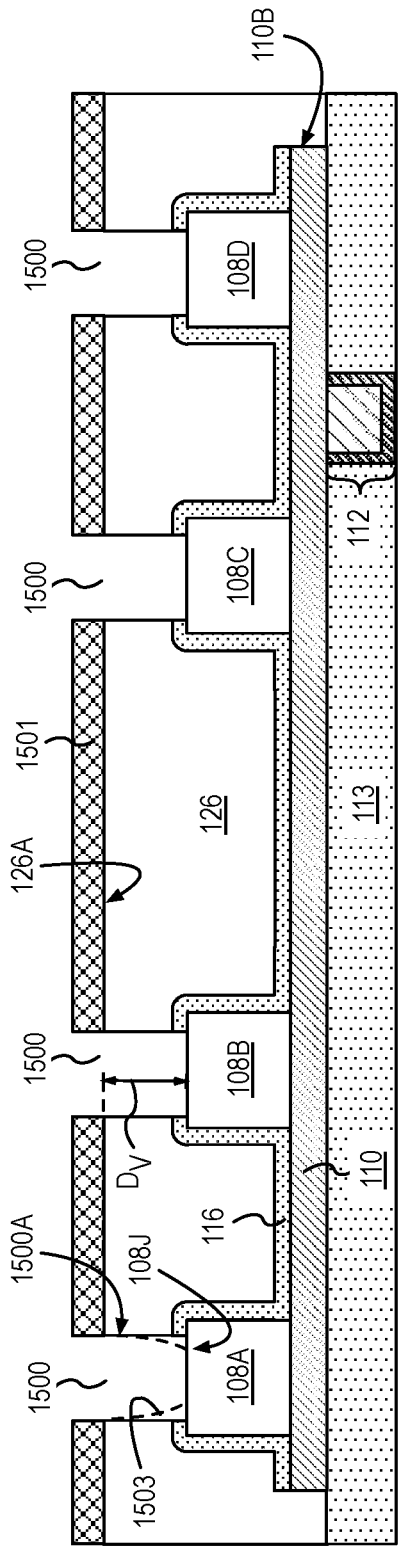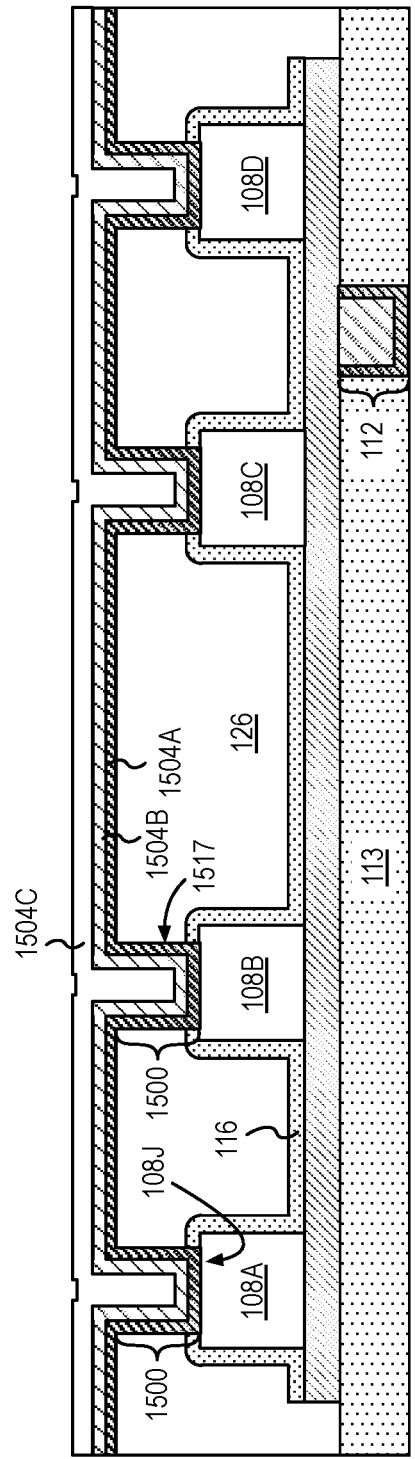
FIG. 15A
FIG. 15B

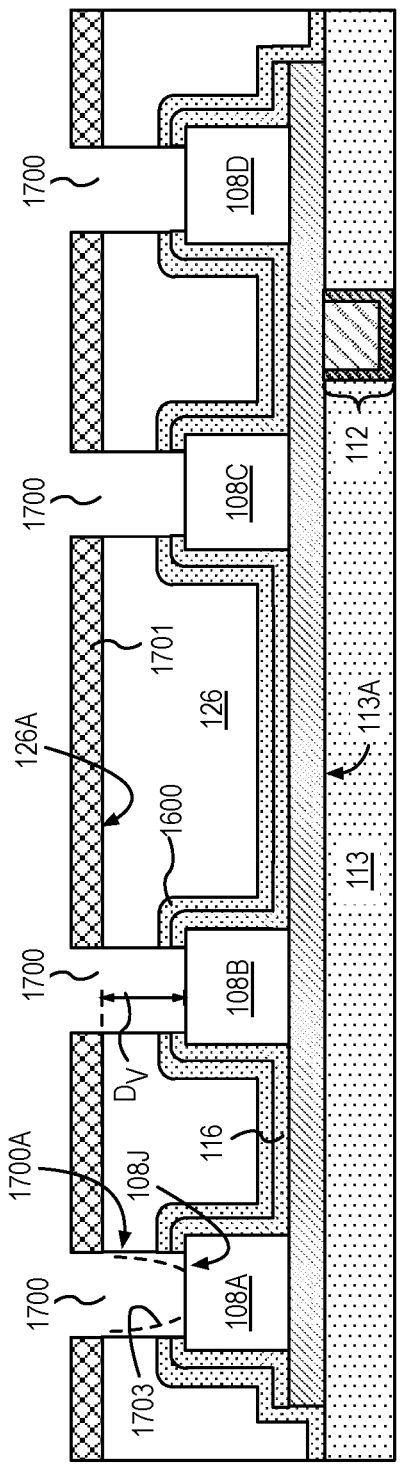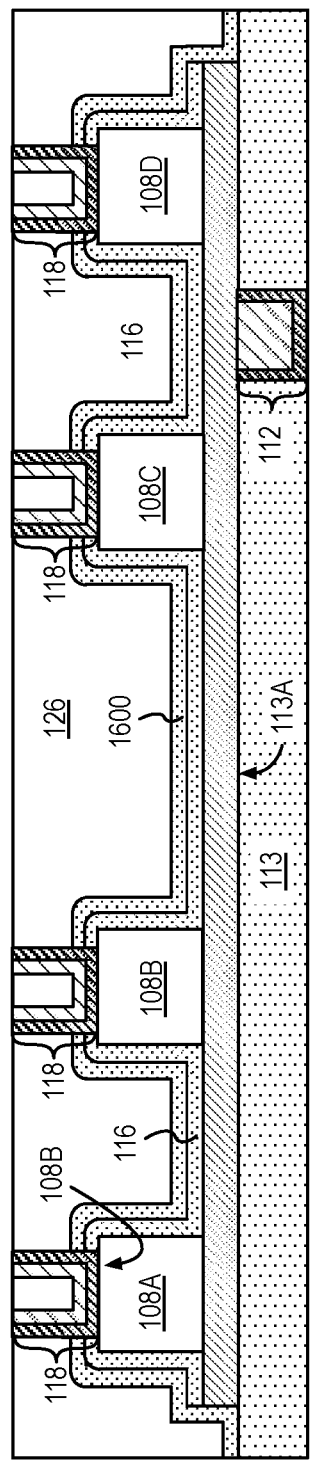
FIG. 17A
FIG. 17B

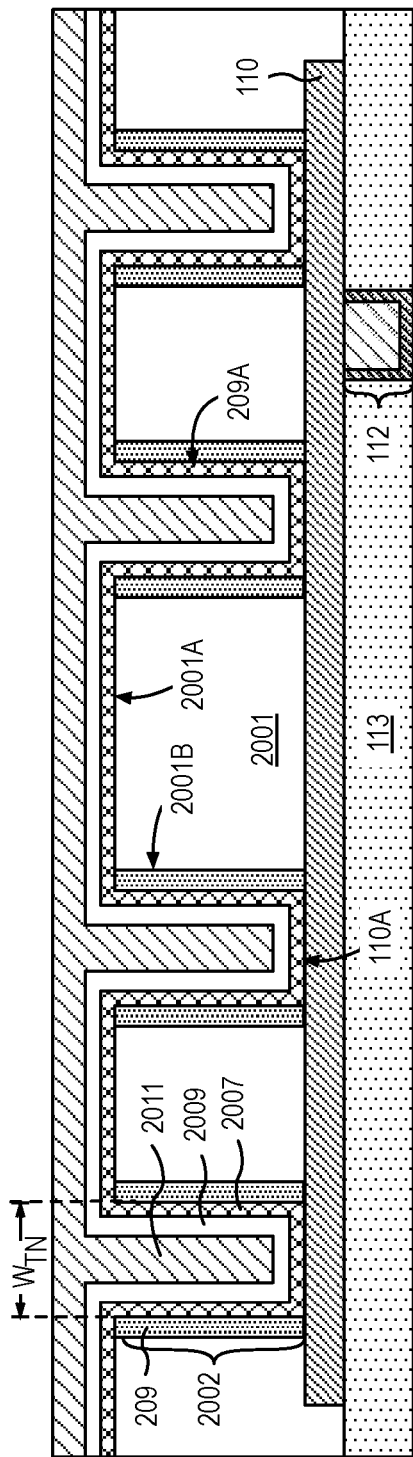
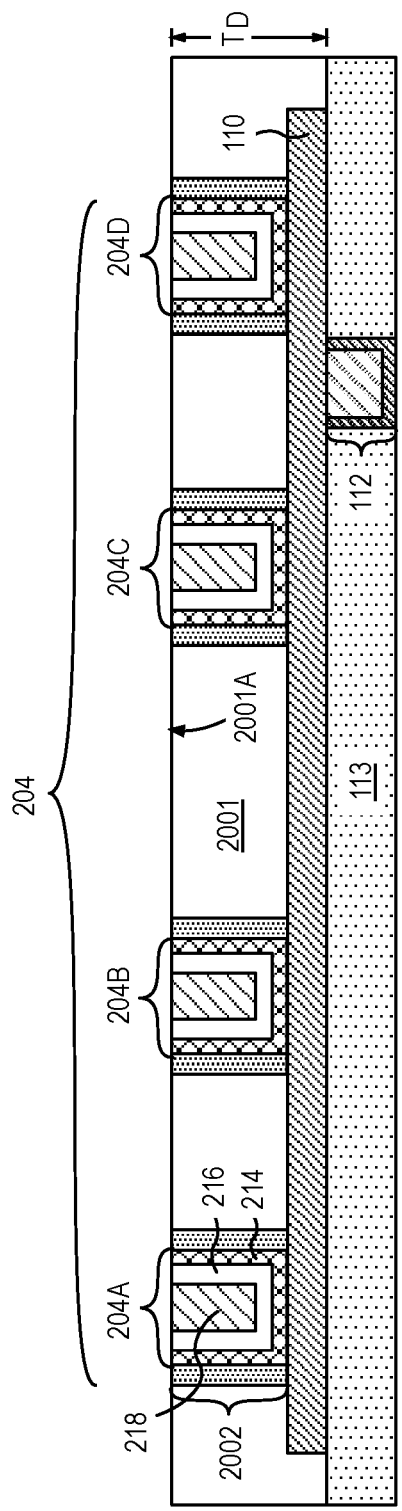
FIG. 20C
FIG. 20D

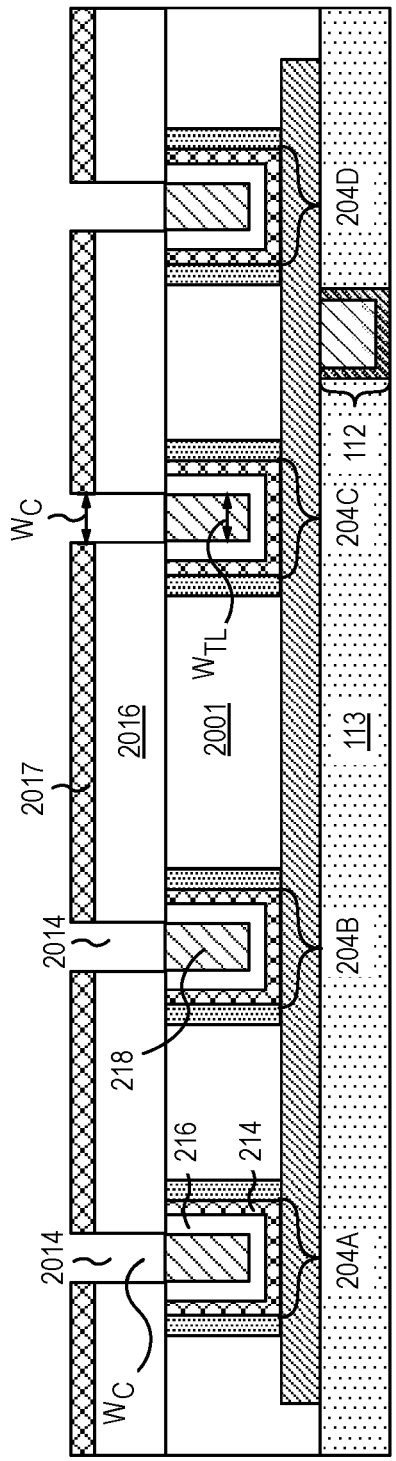
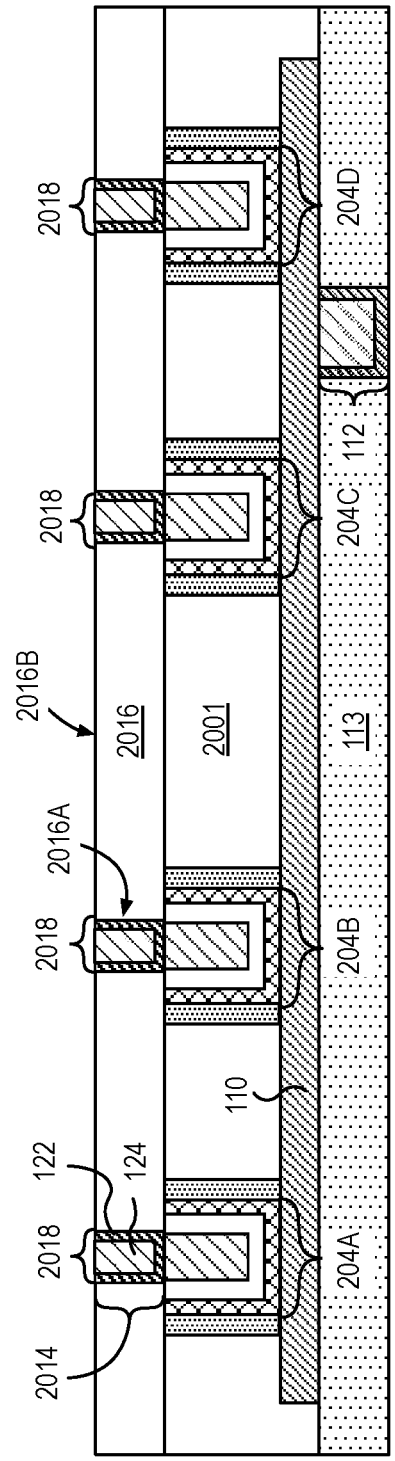
FIG. 20E
FIG. 20F

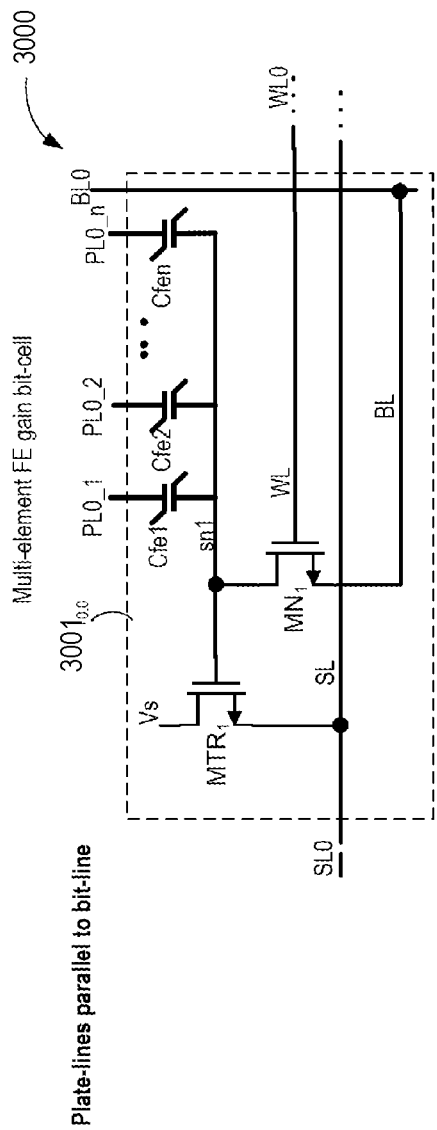
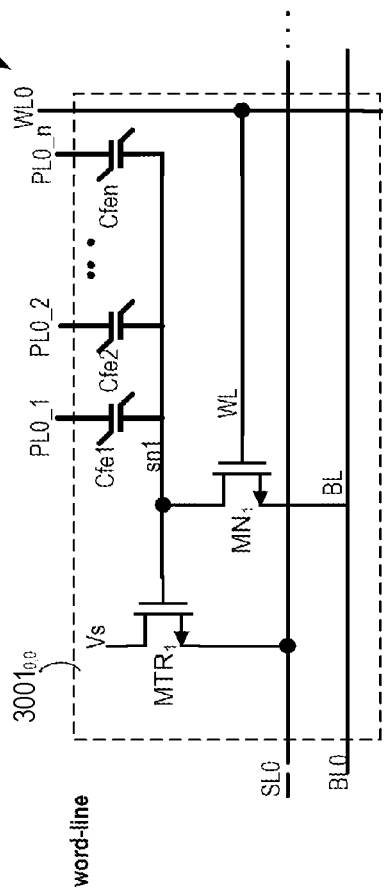
FIG. 30A
FIG. 30B

METHOD OF FABRICATING TRANSISTORS AND STACKED PLANAR CAPACITORS FOR MEMORY AND LOGIC APPLICATIONS

CLAIM FOR PRIORITY

This application is a continuation of, and claims the benefit of priority to U.S. patent application Ser. No. 17/807,637, filed on Jun. 17, 2022, titled "Stacked Capacitors with Shared Electrodes and Methods of Fabrication," and which is incorporated by reference in its entirety.

BACKGROUND

Integration of capacitors including ferroelectric or paraelectric materials on a same plane as interconnects of logic devices can be challenging. When spacing between capacitors is scaled, integrating connections between transistors and routing interconnects can be challenging. As such, alternate methods to form structures that can couple two or more capacitors across different levels are desirable to increase charge storage and facilitate operation of memory and logic devices based on stacked capacitors.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1E is a cross-sectional illustration of a plurality of memory devices above a plate electrode, where the plate electrode has a variable thickness along a lateral direction.

FIG. 1F is a cross-sectional illustration of a plate electrode, where an uppermost surface of the plate electrode in an immediate vicinity of memory device is substantially uniformly recessed.

FIG. 1G is a cross-sectional illustration of a memory device comprising tapered sidewalls, where a spacer on sidewalls of the tapered sidewalls has a variable thickness, in accordance with an embodiment of the present disclosure.

FIG. 1H is a cross-sectional illustration of a plurality of memory devices above a plate electrode, where the plate electrode has a variable thickness along a lateral direction, and where memory devices have a spacer on sidewalls, in accordance with embodiments of the present disclosure.

FIG. 6A is a cross-sectional illustration of a fin formed on a substrate.

FIG. 6B is an isometric illustration of the structure in FIG. 6A following the process to form a dielectric adjacent to a portion of the fin.

FIG. 6C is an isometric illustration of the structure in FIG. 6B following the formation of a dummy gate on the fin.

FIG. 8E is a cross-sectional illustration of the structure in FIG. 8D following the process to form an electrode structure on the conductive interconnect, in accordance with an embodiment of the present disclosure.

FIG. 9A is a cross-sectional illustration of a portion of the structure in FIG. 8D following the process to etch an opening in the etch stop layer to form an electrode structure.

FIG. 9B is an isometric illustration of an opening in the etch stop layer, in accordance with an embodiment of the present disclosure.

FIG. 9C is an isometric illustration of an opening in the etch stop layer, in accordance with an embodiment of the present disclosure.

FIG. 10A is a cross-sectional illustration of the structure in FIG. 9A following the process to deposit conductive fill material within the opening, in accordance with an embodiment of the present disclosure.

FIG. 10B is a cross-sectional illustration of the structure in FIG. 10A following the process to form the conductive fill material within a portion of the opening, on the etch stop layer.

FIG. 10C is a cross-sectional illustration of the structure in FIG. 10B following the process to form a conductive hydrogen barrier on the conductive fill material, in the opening, to form an electrode structure, in accordance with an embodiment of the present disclosure.

FIG. 11A is a cross-sectional illustration of the structure in FIG. 9A following the process to deposit one or more electrode materials including a conductive hydrogen barrier material on a conductive interconnect and on the etch stop layer.

FIG. 11B is a cross-sectional illustration of the structure in FIG. 11A following the process to deposit a fill material in the remaining portions of the opening, on the conductive hydrogen barrier material.

FIG. 11C is a cross-sectional illustration of the structure in FIG. 11B following the process to planarize the fill material and the conductive hydrogen barrier material to form an electrode structure, in accordance with an embodiment of the present disclosure.

FIG. 12A is a cross-sectional illustration of the structure in FIG. 1 following the process to deposit an electrode layer on the etch stop layer and on electrode structure, and following the process to form a material layer stack on the electrode layer.

FIG. 12B is a cross-sectional illustration of the structure in FIG. 12A following the process to pattern the material layer stack to form a first plurality of memory devices.

FIG. 13A is a cross-sectional illustration of the structure in FIG. 12D following the formation of an encapsulation layer on the first plurality of memory devices, in accordance with an embodiment of the present disclosure.

FIG. 13B is a cross-sectional illustration of the structure in FIG. 13A in an embodiment, where an encapsulation layer formed on sidewalls of individual ones of the first plurality of memory devices merge.

FIG. 13C is a cross-sectional illustration of the structure in FIG. 13A where the encapsulation layer formed on sidewalls of individual ones of the first plurality of memory devices merge and form a keyhole void, in accordance with embodiments of the present disclosure.

FIG. 14A is a cross-sectional illustration of the structure in FIG. 13A following the process to mask and etch the electrode layer to form a first plate electrode.

FIG. 14B is a plan view illustration of the structure in FIG. 14A, in accordance with an embodiment of the present disclosure.

FIG. 15A is a cross-sectional illustration of the structure in FIG. 14B following the process to form a plurality of openings in a first dielectric where individual openings expose a respective memory device in the first plurality of memory devices.

FIG. 15B is a cross-sectional illustration of the structure in FIG. 15A following the process to deposit conductive materials into the plurality of openings.

FIG. 17A is a cross-sectional illustration of the structure in FIG. 16A following the process to form openings in a dielectric, in the first encapsulation layer and in the second encapsulation layer, where individual openings expose a respective memory device.

FIG. 17B is a cross-sectional illustration of the structure in FIG. 17A following the process to deposit conductive materials into the openings and following the process to planarize the conductive materials to form via electrodes.

FIG. 20C is a cross-sectional illustration of the structure in FIG. 20B following the process to deposit layers to form trench capacitors into respective openings.

FIG. 20D is a cross-sectional illustration of the structure in FIG. 20C following the process to form trench capacitors by planarizing and removing the layers above the first dielectric.

FIG. 20E is a cross-sectional illustration of the structure in FIG. 20D following the process to form openings in a second dielectric formed above a respective trench capacitor and above the first dielectric.

FIG. 20F is a cross-sectional illustration of the structure in FIG. 20E following the process to form a via electrode on a respective trench capacitor.

FIG. 30A illustrates a multi-element FE gain bit-cell with plate-lines parallel to the bit-line, in accordance with some embodiments of the disclosure.

FIG. 30B illustrates a multi-element FE gain bit-cell with plate-lines parallel to the word-line, in accordance with some embodiments of the disclosure.

DETAILED DESCRIPTION

Figure 1A:
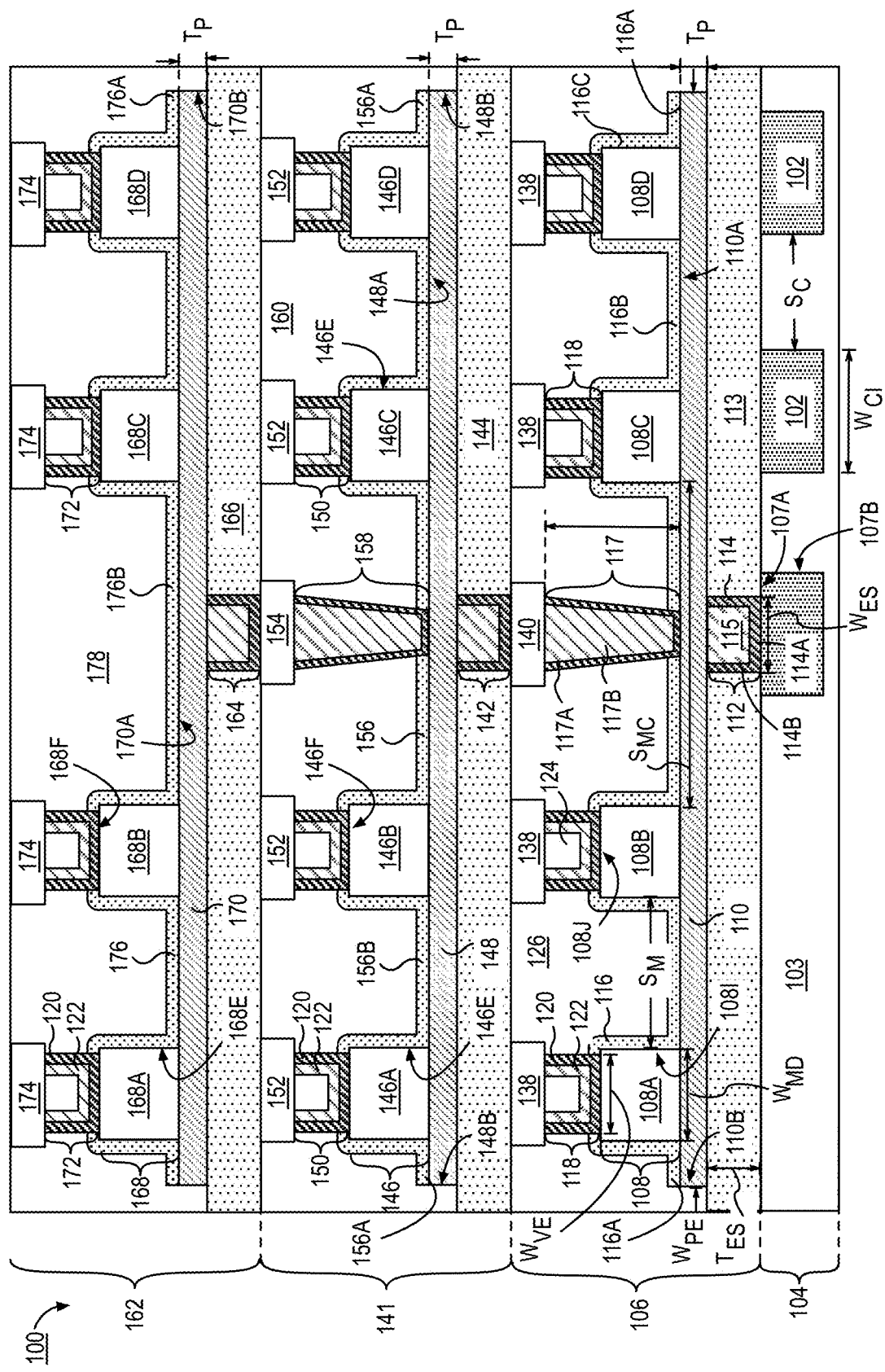
FIG. 1A is a cross-sectional illustration of a device structure including a plurality of stacked planar memory devices, where planar memory devices in any given level are coupled by a shared plate electrode, in accordance with an embodiment of the present disclosure.

Capacitors on a shared plate electrode are described. While various embodiments are described with reference to FeRAM or paraelectric RAM, capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a," "an," and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical, or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to current signal, voltage signal, magnetic signal, or data/clock signal.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Unless otherwise specified in the explicit context of their use, the terms "substantially equal," "about equal," and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. Similar distinctions are to be made in the context of component assemblies.

The term "between" may be employed in the context of the z-axis, x-axis, or y-axis of a device. A material that is between two other materials may be in contact with one or both of those materials. In another example, a material that is between two or other materials may be separated from both of the other two materials by one or more intervening materials. A material "between" two other materials may therefore be in contact with either of the other two materials. In another example, a material "between" two other materials may be coupled to the other two materials through an intervening material. A device that is between two other devices may be directly connected to one or both of those devices. In another example, a device that is between two other devices may be separated from both of the other two devices by one or more intervening devices.

Capacitors with a wide variety of materials have been implemented for memory (random-access memory or RAM) applications. Perovskite materials have been implemented in capacitors for high density FeRAM applications owing to their low power consumption and high on/off ratio. Perovskite FeRAM devices (herein FeRAM devices) are also desirable over other forms of memory, such as magnetic tunnel junction (MTJ) based devices, due to the relatively low number of layers within a device compared to the MTJ. A typical FeRAM device may be fully operational with three layers, where a ferroelectric dielectric is contained between two electrode layers. The electrode layers may also include perovskite materials to enable lattice matching and reduction in electrical resistance. Introduction of lead-free perovskite materials offer additional environmental benefits without sacrificing device performance.

The ferroelectric capacitors may be integrated with transistors in a first region of a substrate. In some examples the first region may be a memory region. For example, ferroelectric capacitors may be on a memory level above a transistor level. There may be one or more layers of conductive interconnects between the ferroelectric capacitors (herein ferroelectric devices) and transistors at the transistor level.

To facilitate individual programing of capacitors, cross point memory has been used elsewhere. However, the cell size in such architectures is dependent on the size of transistors, and increase in device density drives shrinking of transistor size. In some applications, it is beneficial to simultaneously couple multiple capacitors in the memory level with a single transistor directly below. However, coupling two or more capacitors on a single plane with a single transitory below can present challenges. The immediate vicinity of the transistor is often replete with interconnect circuitry comprising intersecting lines that present tight spaces to route multiple lines to capacitors above.

This problem has been partially overcome by inserting an electrode structure between metal lines and the capacitors. Two or more electrode structures can be utilized to couple multiple capacitors to a single metal line, below, to a single transistor, but the number of capacitors and the arrangement of capacitors is limited by this method. The limitation being that capacitors to be coupled to a single metal line need to be arranged along a direction parallel to the metal line.

The presence of multiple metal lines within a given level can create further complications because often metal lines can run parallel within a given level. The shape of the electrode structures cannot be changed arbitrarily to add two or more capacitors in any direction other than in a parallel direction, because the electrode structure can intersect with unwanted metal lines leading to shorts.

This is overcome by implementing a device structure where two or more capacitors are coupled by a plate electrode that is in direct contact with individual capacitors on a single level. The two or more capacitors can then be coupled through the plate electrode via at least a single routing connection to the transistor below. Fabricating the plate electrode at the level of the capacitors offers additional flexibility. The advantage of this approach is that the shape and size of the plate electrode can be determined just before or after fabricating the capacitors. The shape and size can also be adjusted by the number of capacitors to be coupled and the arrangement of the capacitors. A single electrode structure can be positioned between the plate electrode and the metal line. In other embodiments, multiple electrode structures can be positioned between the plate electrode and the metal line to reduce resistance, as long as the electrode structures do not intersect with neighboring metal lines. To increase the total number of programmable capacitors, the device structure further includes multiple levels, where each level includes a plate electrode and a plurality of memory devices. To route signal from the plate electrodes on different levels, the device structure further includes signal electrodes that are coupled between the plate electrodes. Placement of signal electrodes may be determined by spatial and electrical considerations.

The memory devices on any given level may be staggered in both X and Y directions. Staggering may be implemented to account for structures above and below the given level, and for placement of signal electrodes.

The presence of the electrode structures between the plate electrode and the metal lines is additionally advantageous because electrode structures are within a level that provides capacitance shielding between the metal lines and capacitors above. The electrode structures are laterally surrounded by an etch stop layer which limits capacitance between metal lines and the plate electrodes. Furthermore, thickness of the etch stop layer is maintained at a nominal value that limits this capacitance. Additionally, the etch stop layer thickness may also be determined by an etch margin required to pattern the electrode structure. A thicker etch stop layer offers a greater etch margin.

In an embodiment, the plate electrode may be patterned by a plasma etch process utilized to pattern and form planar capacitors. The plasma etch process may etch portions of the plate electrode and create recessed portions in the vicinity of the planar capacitors. In other implementations, forming a trench capacitor does not recess regions outside the trench capacitor. Trench capacitors are typically formed after forming an opening in a dielectric. Hence, regions of plate electrode outside of a periphery of the trench capacitor are not exposed and are not recessed.

While a single transistor may be coupled with the plate electrode in one embodiment, in other embodiments, two or more transistors can be simultaneously coupled to the plate electrode. As such the plate electrode may extend over the two or more transistors. In some such embodiments, a gate contact of one transistor may be coupled with a drain contact of another transistor, where the gate and drain contacts are physically connected by a bridge structure. Transistors may be in close proximity, such as side by side, and on the same horizontal plane to minimize electrical resistance. In some embodiments, two transistors can be coupled to as many as 128 capacitors. A two transistor—n capacitor system may be referred to as a multi-transistor gain cell.

To enable high density FeRAM devices, non-lead-based perovskite materials can be utilized, which are environmentally friendly for mass production. A stack for ferroelectric capacitors can include one or more hardmask materials. The one or more hardmask materials can include dielectric materials, metallic materials or a combination thereof. Implementation of an etch with high selectivity (such as a reactive ion etching, or plasma etch process) between the hardmask and device layers can advantageously enable patterning.

However, FeRAM devices, including lead-free perovskite materials, are prone to damage from reaction with hydrogen during processing. Specifically, the damage may be the result of hydrogen traveling along grain boundaries between or along electrodes coupled with two terminals of a FeRAM device. Hydrogen can cause reduction when it reacts with the one or more materials of the FeRAM device, such as the electrodes or the ferroelectric material itself. Sources of hydrogen during fabrication arise from anneal operations carried to tie up dangling bonds. However, FeRAM devices can lose their polarization hysteresis characteristics as a result of hydrogen reduction.

In some embodiments, the capacitor devices have a planar structure where the individual layers are sequentially layered, one on top of another, where the layers are patterned into cylindrical (circular or elliptical) or rectangular shapes. Thus, it is highly desirable to protect capacitor sidewalls, top, and bottom surfaces from reacting with hydrogen. In some embodiments, solutions against hydrogen diffusion include forming an encapsulation layer that includes an insulating material, such as silicon nitride, to protect sidewalls, and top surfaces. The encapsulation layer can provide protection against hydrogen diffusion into the capacitor. A contact or via electrode at a top of the FeRAM device may be formed by piercing through the insulating barrier layer and exposing one or more top electrode materials. The barrier layer itself may be further surrounded by additional insulating material such as an interlayer dielectric (ILD). ILD materials such as silicon oxide or silicon oxide doped with carbon, in general do not act as a hydrogen diffusion barrier and are less desirable directly in contact with one or more layers of the memory device.

In other examples, hydrogen may diffuse through one or more materials of the contact electrode towards the FeRAM device stack through a top electrode. To protect against hydrogen diffusion through a top surface of the top electrode, noble metals have been implemented as part of the contact electrode structure. However, noble metals normally have crystalline structures due to strong metallic bonding. Hence, their amorphous phase is thermodynamically unstable favoring transformation into a crystalline phase.

Furthermore, it is to be appreciated that hydrogen can also diffuse from layers below a bottom electrode of the FeRAM device. Typically, the bottom electrode is physically isolated from a conductive interconnect by at least one electrode structure. The conductive interconnect may be laterally surrounded by an ILD. The electrode structure may be laterally surrounded by an insulator layer that can act as a barrier against hydrogen diffusion as well as providing etch stop capability while patterning the ReRAM stack. The insulator layer is typically formed above the ILD and the conductive interconnect. The interface between the electrode structure and the conductive interconnect can be a pathway for hydrogen diffusion. Depending on a width of the electrode structure relative to the conductive interconnect, the electrode structure may be in contact with the ILD adjacent to the conductive interconnect.

A dual hydrogen barrier is devised that includes an insulative hydrogen barrier material directly adjacent to the memory device and a conductive hydrogen barrier that is integrated as part of the contact electrode. In some embodiments, the contact electrode may have the shape of a via that includes a conductive hydrogen barrier having a first portion directly in contact with the memory device and a second portion that laterally surrounds a conductive (contact) material. The conductive contact material may further include one or more layers. The contact electrode may extend over a portion or an entire uppermost surface of the memory device.

To provide a barrier against hydrogen diffusion towards a bottom electrode, the electrode structure may also include a conductive hydrogen barrier material. The structure of the electrode structure may depend on the size of the memory device relative to the electrode structure. In embodiments, the electrode structure may include a conductive hydrogen barrier laterally surrounding a conductive material. In other embodiments, the electrode structure may include conductive hydrogen barrier directly across a top portion and in direct contact with the memory device.

To provide a barrier against hydrogen diffusion directly into sidewalls of the memory device, a dielectric that is amorphous, having a high film density (a film density above 90% of theoretical material density or film density) and is electrically insulating, may be directly in contact with the sidewalls of the memory device, in embodiments where no encapsulation layer is present. Furthermore, when memory devices are integrated in a high density array, the space between the devices may not be large enough to deposit an encapsulation layer as well as an ILD. In some such instances, the high film density-dielectric is present over the entire memory region. In other embodiments, the encapsulation layer between two adjacent memory devices may merge together. Memory devices in the first region may be directly adjacent to a second region within a memory level, for system functionality. In particular, the capacitors may be in close proximity to routing interconnects in the logic region. Routing interconnects may be implemented to route voltage and signals between circuit elements in the second region. To minimize line capacitance, the routing interconnects are embedded within a low dielectric constant interlayer dielectric (ILD), where the ILD has a low film density (less than 90% film density) or a high porosity material.

FIG. 1A is a cross-sectional illustration of device structure 100. Device structure 100 may include a plurality of conductive interconnects within level 104 as shown. Conductive interconnects 102 may be lines or vias. The figure reference 102 may also be used herein to refer to a single conductive interconnect or a plurality of conductive interconnects. Conductive interconnects 102 may be substantially identical within level 104 with regards to material composition. Individual conductive interconnects 102 may be spaced apart by a substantially same distance or by varying amounts. In the illustrative embodiment, individual conductive interconnects are spaced apart from each other by distance Sc. Conductive interconnects 102 are laterally surrounded by dielectric 103. Dielectric 103 includes a material having a low film density, such as density less than 90% of theoretical material density. A low density film can help to minimize capacitance between conductive interconnects 102. In some embodiments, dielectric 103 includes a material having a dielectric constant that is below 3.5. Dielectric 103 may include $SiO_2$, SiOC, SiC, or $SiO_2$ doped with F.

The device structure 100 further includes level 106 above level 104. Level 106 includes an electrode structure 112 on at least a portion of one of conductive interconnects 102. Electrode structure 112 is in contact with an individual conductive interconnect 102, as illustrated. Electrode structure 112 may include a conductive hydrogen barrier material. Structural embodiments of electrode structure 112 will be discussed below.

Device structure 100 further includes a plurality of memory devices 108 above electrode structure 112, where individual ones of the plurality of memory devices 108 (such as memory devices 108A, 108B, 108C, and 108D) include one or more ferroelectric materials, one or more paraelectric materials, or one or more anti ferroelectric material. The reference label 108 may also be used to generally refer to a single memory device 108. In the illustrative embodiment, memory devices 108A, 108B, 108C, and 108D within device structure 100 are substantially structurally identical. While four memory devices 108 are illustrated, an array can have any number of memory devices 108 that are substantially identical. As shown, four memory devices 108A, 108B, 108C, and 108D are above and electrically coupled with conductive interconnect 102 through electrode structure 112.

Device structure 100 further includes plate electrode 110, coupled between memory devices 108 and electrode structure 112. Plate electrode 110 extends on a single plane (X-Y in FIG. 1A). Plate electrode 110 is designed to couple a plurality of memory devices 108 to at least one transistor through conductive interconnect 102, as will be discussed below. Plate electrode 110 is in contact with and extends continuously under memory devices 108A, 108B, 108C, and 108D. Plate electrode 110 is contiguous and extends at least beyond a respective sidewall 108I of individual memory devices 108A, 108B, 108C, and 108D as shown. In an exemplary embodiment, plate electrode 110 extends beyond a perimeter of all memory devices 108. In some embodiments, plate electrode 110 can couple as many as 128 memory devices 108. The number of memory devices depends on a variety of factors such as but not limited to dielectric constant, polarization density, and thickness of a dielectric layer in memory device 108, as well as on circuit parameters such as sense margin requirements, and parasitic capacitance within the device structure 100. Sense margin may be understood as an ability of an electrical circuit to differentiate between the signature of a stored value of 1 or 0, factoring in the sense-amplifier's offset variation, storage element's signal variation and reference signal generators variation.

Plate electrode 110 may cover at least a portion or all of electrode structure 112. Extent of coverage of plate electrode 110 depends on shape and size of plate electrode 110 relative to shape and size of electrode structure 112. In the illustrative embodiment, plate electrode 110 extends beyond a perimeter of electrode structure 112. Plate electrode 110 has a lateral thickness $W_{PE}$ that extends over a plurality of conductive interconnects 102, as shown. $W_{PE}$ can be a length or width depending on a plan view shape of plate electrode 110. In the illustrative embodiment, plate electrode 110 enables electrical coupling between multiple memory devices 108 and chosen conductive interconnect 102 through electrode structure 112, without shorting with other conductive interconnects 102. Plate electrode 110 may include a material such as TaN, TiN, TiAlN, TiAlO, Pt, Ir, Co, Mo, W, Ru, Al, Ta, Ti, AlCu, Nb, or Cr.

Device structure 100 further includes encapsulation layer 116 on respective sidewall 108I of memory devices 108. Encapsulation layer 116 is a dielectric that is designed to protect layers within memory devices 108 from diffusion of oxygen or hydrogen by providing a hermetic seal. Encapsulation layer 116 may also be an example of an insulative hydrogen barrier layer. In the illustrative embodiment, encapsulation layer 116 extends contiguously on sidewalls 108I, portions of uppermost surface 108J and on uppermost surface 110A of plate electrode 110. Encapsulation layer 116 fills a space between adjacent memory devices 108A-108D. Encapsulation layer 116 includes portions 116A that are substantially aligned with a perimeter of plate electrode 110. As shown, portions 116A are substantially aligned with sidewalls 110B of plate electrode 110. Encapsulation layer 116 includes portions 116B between adjacent memory devices 108A-108D. Alignment between portions 116A and sidewalls 110B may be indicative of a process utilized to fabricate device structure 100. In an embodiment, encapsulation layer 116 includes metal and oxygen, such as $Al_xO_y$, $HfO_x$, $ZrO_x$, $TaO_x$, $TiO_x$, $AlSiO_x$, $HfSiO_x$, or $TaSiO_x$, or a mixture including silicon and nitrogen, or silicon, nitrogen and carbon, where x is equal to 2 and y is equal to 3. Encapsulation layer 116 can have thickness $T_{EC}$. $T_{EC}$ may be substantially uniform within portions 116A, 116B, and 116C.

Device structure 100 further includes signal electrode 117 (herein via electrode 117) coupled with plate electrode 110. As shown, via electrode 117 is on uppermost surface 110A and laterally surrounded by dielectric 126 and encapsulation layer 116. Via electrode 117 is utilized to route a signal from plate electrode 110 through upper plate electrodes (described below) to an electrically coupled external measurement location. As shown, via electrode 117 spans height $T_{VV}$ that extends from uppermost surface 110A. Via electrode 117 may be coupled to different locations on the plate electrode 110. In an embodiment, via electrode 117 is coupled to an end of plate electrode 110. Via electrode 117 may be coupled to a portion of plate electrode 110 between at least a pair of memory devices 108. In the illustrative embodiment, via electrode 117 is between memory devices 108B and 108C. In other embodiments, via electrode 117 is between memory devices 108A and 108B or between memory devices 108C and 108D.

In some embodiments, via electrode 117 includes liner layer 117A and conductive fill material 117B. In some embodiments, liner layer 117A may include a material that is the same or substantially the same as the material of liner layer 122. In some embodiments, conductive fill material 117B includes a material that is the same or substantially the same as the material of conductive fill material 124. In the illustrative embodiment, encapsulation layer 116 is also adjacent to a lowermost portion of via electrode 117.

In the illustrative embodiment, memory devices 108A and 108B, and memory devices 108C and 108D are spaced apart by distance $S_M$. $S_M$ is sufficiently large and $T_{EC}$ is sufficiently thin that the regions between memory devices 108A-108D include dielectric 126.

Memory devices 108B and 108C are spaced apart by distance $S_{MC}$. $S_{MC}$ is sufficiently large for placement of via electrode 117. In general, $S_{MC}$ may be greater than, less than, or equal to $S_M$. In the illustrative embodiment, $S_{MC}$ is sufficiently large, and $T_{EC}$ is sufficiently thin that the regions between memory devices 108A-108D include dielectric 126. In some embodiments, $S_M$ is greater than $T_{EC}$, but via electrode 117 has a lateral thickness $W_S$, such that a lower portion of via electrode 117 is between and in contact with portions of encapsulation layer 116 on sidewalls of two adjacent memory devices 108B and 108C.

Electrode structure 112 is laterally surrounded by etch stop layer 113. In exemplary embodiments, etch stop layer 113 includes a dielectric material. In exemplary embodiments, the dielectric material of etch stop layer 113 does not include a metal. Electrode structure 112 may cover an entire top surface or at least a portion of the top surface of conductive interconnect 102, depending on lateral thickness (or width) $W_{ES}$, of electrode structure 112 compared to lateral thickness $W_{CI}$, of conductive interconnect 102. In the illustrative embodiment, $W_{ES}$ is less than $W_{CI}$. In some embodiments, $W_{ES}$ is greater than $W_{CI}$. To avoid shorting between multiple conductive interconnects 102, electrode structure 112 has lateral thickness $W_{CI}$, that is less than a combined sum of lateral thickness $W_{CI}$, and two times the spacing Sc.

Hydrogen may diffuse from dielectric 103 to memory device 108. For example, interface 107A between etch stop layer 113 and conductive interconnect 102, and interface 107B between conductive interconnect 102 and dielectric 103 may provide pathways for hydrogen diffusion. To prevent hydrogen diffusion through interfaces 107A and 107B, electrode structure 112 can include a hydrogen barrier layer along interfaces 107A and 107B. The hydrogen barrier layer may have various structural embodiments as will be presented below.

In the illustrative embodiment, electrode structure 112 includes conductive hydrogen barrier 114 and conductive fill material 115 adjacent to conductive hydrogen barrier 114. As shown, conductive hydrogen barrier 114 extends along interfaces 107A and 107B and is in contact with uppermost surface of conductive interconnect 102. In the illustrative embodiment, conductive hydrogen barrier 114 includes portion 114A, which is below conductive fill material 115 and portion 114B that laterally surrounds conductive fill material 115. Portion 114B is directly between conductive fill material 115 and etch stop layer 113. Portion 114A is directly between conductive fill material 115 and conductive interconnect 102. In the illustrative embodiment, where $W_{ES}$ is less than $W_{CI}$, portion 114A is fully contained within conductive interconnect 102. In other embodiments, $W_{ES}$ is greater than $W_{CI}$, and portion 114A is in contact with dielectric 103. Conductive hydrogen barrier 114 and etch stop layer 113 form a dual hydrogen barrier from below memory device 108.

Conductive hydrogen barrier 114 includes a material that is amorphous. Amorphous materials lack defined grain boundaries that can facilitate hydrogen diffusion and are thus desirable. Embodiments of the conductive hydrogen barrier 114 include materials such as, but not limited to: TiAlN, with >30 atomic percent AlN; TaN, with >30 atomic percent $N_2$; TiSiN, with >20 atomic percent SiN; Ta carbide, TaC, Ti carbide; TiC; tungsten carbide; WC; tungsten nitride; WN; carbonitrides of Ta, Ti, W, i.e., TaCN, TiCN, WCN; titanium monoxide; TiO; $Ti_2O$; tungsten oxide; WO3, tin oxide; $SnO_2$; indium tin oxide; ITO; iridium Oxide; indium gallium zinc OXIDE; IGZO; and zinc oxide or METGLAS series of alloys, e.g., $Fe_{40}Ni_{40}P_{14}B_6$. In some embodiments, conductive hydrogen barrier 114 has a thickness that is less than 5 nm.

In some embodiments, plate electrode 110 includes a material that provides a barrier against hydrogen and oxygen diffusion. In such embodiments, the conductive hydrogen barrier 114 may not be included within electrode structure 112.

In the illustrative embodiment, level 106 further includes a plurality of via electrodes 118 that are coupled to respective memory device 108. In an exemplary embodiment, via electrodes 118 are substantially identical. As shown, individual ones of the plurality of via electrodes 118 are on respective memory device 108.

Via electrode 118 may include different structural arrangements of two or more conductive layers. In some embodiments, memory devices 108 do not include a conductive hydrogen barrier above a ferroelectric dielectric layer. In such embodiments, via electrode 118 includes at least one conductive hydrogen barrier, such as conductive hydrogen barrier 120 on an uppermost surface of memory device 108. Depending on the material of conductive hydrogen barrier 120, via electrode 118 may or may not include a liner layer. In the illustrative embodiment, via electrode 118 further includes liner layer 122 directly adjacent to conductive hydrogen barrier 120 and conductive fill material 124 adjacent to liner layer 122. Liner layer 122 may include Ti, Ta, TiN, TaN, Ru, or any other conductive material that can provide adhesion to conductive fill material 124.

In the illustrative embodiment, conductive hydrogen barrier 120 laterally surrounds liner layer 122, and liner layer 122 laterally surrounds conductive fill material 124. Conductive fill material 124 may include material such as tantalum, titanium, ruthenium, tungsten, molybdenum, or copper.

In the illustrative embodiment, conductive hydrogen barrier 120 is on a portion of uppermost surface 108J and directly adjacent to encapsulation layer 116. As such, uppermost surface 108J is substantially protected from diffusion of hydrogen into portions of memory device 108.

Embodiments of conductive hydrogen barrier 120 include a material that is amorphous. Amorphous materials lack defined grain boundaries that can facilitate hydrogen diffusion. Embodiments of conductive hydrogen barrier 120 include materials such as, but not limited to: TiAlN, with >30 atomic percent AlN; TaN, with >30 atomic percent N2; TiSiN, with >20 atomic percent SiN; Ta carbide; TaC; Ti carbide; TiC; tungsten carbide; WC; tungsten nitride; WN; carbonitrides of Ta, Ti, W, i.e., TaCN, TiCN; WCN; titanium monoxide; TiO; $Ti_2O$; tungsten oxide; $WO_3$; Tin oxide; $SnO_2$; indium tin oxide; ITO; iridium oxide; indium gallium zinc oxide; IGZO; ZINC OXIDE, or METGLAS series of alloys, e.g., $Fe_{40}Ni_{40}P_{14}B_6$. In some embodiments, conductive hydrogen barrier 120 has a thickness that is dependent on $W_{VE}$. In some embodiments, conductive hydrogen barrier 120 has a thickness that is less than 5 nm. It is to be appreciated that conductive hydrogen barrier 120 may include a material that is the same or different from the material of conductive hydrogen barrier 114.

The extent to which encapsulation layer 116 is on memory device 108 is dependent on lateral width $W_{MD}$ of memory devices 108A-108D compared to width $W_{VE}$ of via electrode 118. In some embodiments, as is illustrated, memory device 108 has width $W_{MD}$ that is greater than width $W_{VE}$. In some such embodiments, encapsulation layer 116 covers at least a portion of uppermost surface 108J.

In some embodiments, such as is shown, device structure 100 further includes dielectric 126. As shown, dielectric 126 laterally surrounds memory devices 108 and is in direct contact with sidewalls of encapsulation layer 116. Dielectric 126 also laterally surrounds via electrodes 118. In particular, dielectric 126 is directly adjacent to portions of conductive hydrogen barrier 120. In some embodiments, dielectric 126 is a dielectric block that includes a multilayer stack where different layers are adjacent to different structures within level 106, as will be described below. For example, a first dielectric may be adjacent to memory devices 108 (though separated by encapsulation layer 116) and a second dielectric may be adjacent to via electrodes 118.

In the illustrative embodiment, dielectric 126 spans an entire space between any pair of adjacent memory devices 108. In some embodiments, dielectric 126 includes a low density $SiO_x$, SiN, SiCN, SiC, or SiON. A low density material has film density of less than 90% of theoretical material density.

Conductive interconnect 102, electrode structure 112, and memory devices 108 can have widths that are substantially independent of each other, when there is an intervening plate electrode 110. Additionally, misalignment between conductive interconnect 102, electrode structure 112, and plate electrode 110 may not substantially affect operation as long as there is at least 50% overlap between conductive interconnect 102, electrode structure 112, and plate electrode 110. Spacing $S_M$ between adjacent memory devices 108 depends on desired density of memory devices 108, as well as on a required minimum thickness of encapsulation layer 116. Reducing $S_M$ can advantageously increase the density of memory devices per unit plan view area of device structure 100. As will be discussed below, $S_M$ can also depend on spacing required for routing vias. In some embodiments, $S_M$ ranges between 20 nm and 100 nm. While four memory devices 108 are shown, device structure 100 can include over 1000 memory devices 108 arranged in an array. The number of plate electrodes 110 can be selected based on number of memory devices 108 that are coupled to plate electrode 110.

Device structure 100 further includes a plurality of conductive vias 138 (herein routing structure 138 or routing structures 138). In the illustrative embodiment, an individual routing structure 138 is on an individual via electrode 118 and conductive via 140 (herein routing structure 140) is on via electrode 117. Routing structures 138 and 140 may be lines or vias depending on the application. Furthermore, in embodiments where routing structures 138 are lines, the lines extend along the y-direction. Routing structures 138 and 140 may include materials that are the same or substantially the same as via electrode 118. In embodiments, routing structures 138 individually may extend beyond a perimeter of via electrode 118, as shown.

Device structure 100 further includes level 141 above level 106. Level 141 includes one or more features of level 106. In the illustrative embodiment, device structure 100 further includes electrode structure 142 coupled with via electrode 117, through routing structure 138. Electrode structure 142 is laterally surrounded by etch stop layer 144. Etch stop layer 144 is on dielectric 126. Level 141 further includes a plurality of memory devices 146 on plate electrode 148. Via electrode 150, above individual memory devices 146A-D, is implemented to individually program plurality of memory devices 146. In the illustrative embodiment, an individual conductive via 152 (herein routing structure 152) is on individual via electrode 118, and conductive via 154 (herein routing structure 154) is on via electrode 158 (herein signal electrode 158).

Figure 1B:
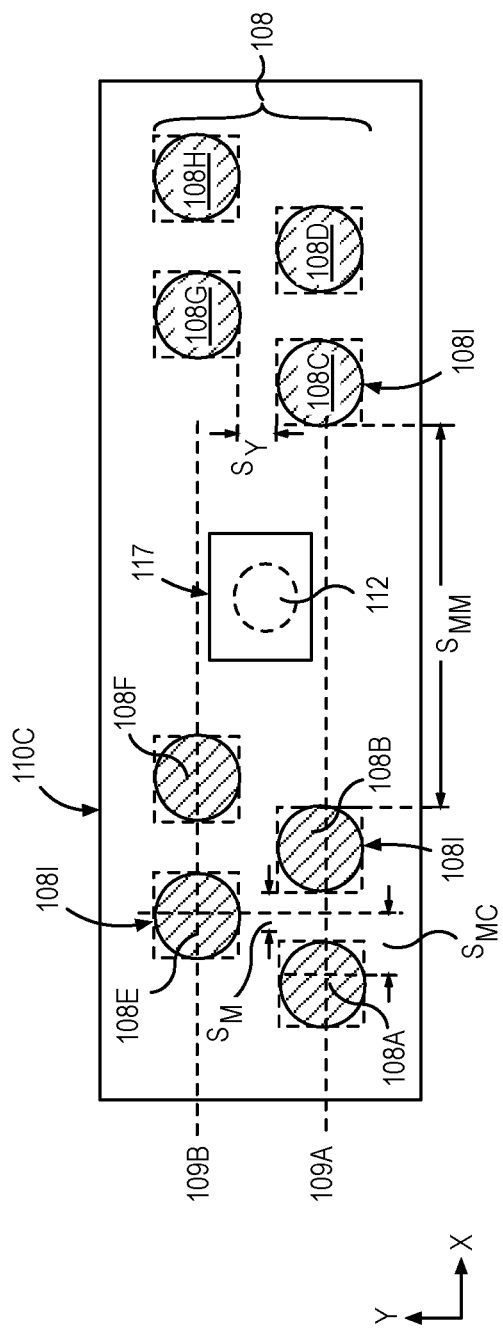
FIG. 1B is a plan-view illustration of a plurality of memory devices on a plate electrode that has a rectangular profile, where the plurality of memory devices are staggered in the x and y directions, in accordance with an embodiment of the present disclosure.

Plate electrode 148 is on electrode structure 142. In the cross-sectional illustration, memory devices 146A, 146B, 146C, and 146D are directly above and substantially vertically aligned with memory devices 108A, 108B, 108C, and 108D, respectively. Level 141 may also include memory devices 146 in a plane behind the plane of the illustration. Layout of memory devices 146 may be substantially identical to layout of memory devices 108 (as depicted in FIG. 1B).

Encapsulation layer 156 extends on uppermost surface 148A of plate electrode 148 and on sidewalls 146E and on portions of uppermost surfaces 146F of memory devices 146A-146D. Encapsulation layer 156 is aligned with sidewalls 148B. Encapsulation layer 156 fills a space between adjacent memory devices 146A-146D. Encapsulation layer 156 includes portions 156A that are substantially aligned with a perimeter of plate electrode 148. As shown, portions 156A are substantially aligned with sidewalls 148B of plate electrode 148. Encapsulation layer 156 includes portions 156B, on uppermost surface 148A, laterally between adjacent memory devices 146A-146D.

In exemplary embodiments, elements of level 141 are the same or substantially the same as elements of level 106. For example, electrode structure 142, etch stop layer 144, memory devices 146, plate electrode 148, via electrodes 150, signal electrode 158, routing structures 152 and 154, and encapsulation layer 156, include one or more features (including materials) of electrode structure 112, etch stop layer 113, memory devices 108, plate electrode 110, via electrodes 118, via electrode 117, routing structures 138 and 140, and encapsulation layer 116, respectively. In the illustrative embodiment, signal electrode 158 is substantially vertically aligned with via electrode 117. In other embodiments, signal electrode 158 is laterally staggered from via electrode 117.

In exemplary embodiments, spacing between memory devices 146A and 146B is substantially the same as spacing between memory devices 146C and 146D. In some such embodiments, the spacing between memory devices 146A and 146B, and between memory devices 146C and 146D is $S_M$. In embodiments, memory devices 146B and 146C are spaced apart by $S_{MC}$. As discussed above, $S_M$ may be greater than, equal to, or less than $S_{MC}$. $S_{MC}$ is sufficient for placement of signal electrode 158.

Level 141 further includes dielectric 160 adjacent to encapsulation layer 156, via electrodes 150 and 158, routing structures 152 and 154, and plate electrode 148. In the illustrative embodiment, dielectric 160 is also in contact with etch stop layer 144.

Device structure 100 further includes level 162 above level 141. Level 162 includes one or more features of level 141. In the illustrative embodiment, device structure 100 further includes electrode structure 164 coupled with signal electrode 158, through routing structure 154. Electrode structure 164 is laterally surrounded by etch stop layer 166. Etch stop layer 166 is on dielectric 160. Level 162 further includes a plurality of memory devices 168 on plate electrode 170. A via electrode 172, above individual memory devices 168A-168D, is implemented to individually program the plurality of memory devices 168. In the illustrative embodiment, an individual conductive via 174 (herein routing structure 174) is on an individual via electrode 172.

Plate electrode 170 is on electrode structure 164. In the cross-sectional illustration of memory devices 168A, 168B, 168C, 168D are directly above and substantially vertically aligned with memory devices 108A, 108B, 108C and 108D, respectively. Level 162 may also include a plurality of memory devices 168 in a plane behind the plane of the illustration. Layout of memory devices 168 may be substantially the same as the layout of the plurality of memory devices 108.

Encapsulation layer 176 extends on uppermost surface 170A of plate electrode 170 and on sidewalls 168E and on portions of uppermost surfaces 168F of memory devices 168A-168D. Encapsulation layer 176 is aligned with sidewalls 170B. Encapsulation layer 176 fills a space between adjacent memory devices 168A-168D. Encapsulation layer 176 includes portions 176A that are substantially aligned with a perimeter of plate electrode 170. As shown, portions 176A are substantially aligned with sidewalls 170B of plate electrode 170. Encapsulation layer 176 includes portions 176B, on uppermost surface 170A, between adjacent memory devices 168A-168D.

In exemplary embodiments, elements of level 162 are the same or substantially the same as elements as level 162. For example, electrode structure 164, etch stop layer 166, memory devices 168, plate electrode 170, via electrodes 172, routing structures 174, and encapsulation layer 176, include one or more features (including materials) of electrode structure 112, etch stop layer 113, memory devices 108, plate electrode 110, via electrodes 118, via electrode 117, routing structures 138, and encapsulation layer 116, respectively. Level 162 may include a via electrode coupled with plate electrode 170 in the plane of the illustration or on a plane behind or in front of the plane of the illustration. In the illustrative embodiment, a via electrode is not vertically aligned with via electrode 117.

In exemplary embodiments, spacing between memory devices 168A and 168B is substantially the same as spacing between memory devices 168C and 168D. In some such embodiments, the spacing between memory devices 168A and 168B, and between memory devices 168C and 168D is $S_M$. In embodiments, memory devices 168B and 168C are spaced apart by $S_{MC}$. As discussed above $S_M$ may be greater than, equal to or less than $S_{MC}$. $S_{MC}$ is sufficient for coupling a via electrode with plate electrode 170.

Level 162 further includes dielectric 178 adjacent to encapsulation layer 176, via electrode 172, routing structures 174, and plate electrode 170. In the illustrative embodiment, dielectric 160 is also in contact with etch stop layer 166.

Level 106 has vertical thickness $T_{106}$ that is substantially equal to a combined sum of vertical thickness $T_{ES}$ of electrode structure 112, vertical thickness $T_{MD}$ of memory device 108A, vertical thickness $T_P$ of plate electrode 110, vertical thickness $T_V E$ of via electrode 118, and $T_V E$ vertical thickness $T_R$ of routing structure 138. It is to be appreciated that individual thicknesses $T_{ES}$, $T_{MD}$, $T_P$, and $T_{VE}$ may be codependently chosen to optimize performance of memory devices 108A-108D. For example, $T_{MD}$ may range between 20 nm and 90 nm, and $T_p$, $T_{ES}$, and $T_{VE}$ may be adjusted co-dependently to balance $T_{106}$.

Dielectric 126 includes a material that is designed to minimize electrical impact to logic circuitry, for example, signal delays such as RC delays. Such electrical impact can arise due to scaling in feature sizes of metallic interconnects, such as vias and metal lines, as well as due to reduction in space between them. Increase in capacitive coupling and electrical resistance can increase signal delays. However, reducing a dielectric constant of dielectric 126 can ameliorate electrical impact. Lowering the dielectric constant may be generally associated with increasing porosity in the film. Film porosity may be greater than 90 atomic percent by volume in dielectric 126. In some embodiments, dielectric 126 has a dielectric of approximately 3.5 or less. In some embodiments, dielectric 126 includes silicon and oxygen (such as low K $SiO_2$). In the illustrative embodiment, dielectric 126 laterally surrounds at least a portion of via electrode 117. Dielectric 126 includes a material with a low film density (a film density much below 90% of theoretical material density), for example, low density $SiO_2$, carbon doped oxide (CDO), SiOC, SiCN, SiC, SiOxNy, F-doped oxides, or H-doped oxides. In some embodiments, dielectrics 160 and 178 include a material that is the same or substantially the same as the material of dielectric 126.

In an embodiment, $T_{MD}$ has a thickness between 10 nm and 100 nm, and $T_{ES}$ has a thickness between 5 nm and 20 nm. In an embodiment, sum of $T_{ES}$, $T_p$, and $T_{MD}$, is between approximately 85% and 100% of $T_V$. In some embodiments, $T_V$ is between 20 nm and 50 nm. In other embodiments, $T_V$ is between 20 nm and 150 nm. Though vertical thicknesses have been described with respect to level 106, vertical thicknesses are applicable to levels 141 and 162, as well.

FIG. 1B is a plan-view illustration of plate electrode 110 that has a rectangular profile, in accordance with an embodiment of the present disclosure. As shown, plate electrode 110 extends beyond sidewalls 1081 of memory devices 108. Depending on embodiments, memory devices 108 can have a circular, rectangular, or a square (dashed lines) plan view profile. Electrode structure 112, indicated by dashed lines, is substantially between two groups of memory devices 108. In alternative embodiments, electrode structure 112 can be under any one of the memory devices 108. As shown, electrode structure 112 is also substantially confined within a perimeter 110C of plate electrode 110.

Plate electrode 110 is coupled with the plurality of memory devices 108 and extends, in the x and y-directions, beyond a perimeter of individual memory devices 108. In the illustrative embodiment, memory devices are spaced apart in both x and y directions. Plurality of memory devices 108 may be arranged in a manner that is suitable for placement of routing contact lines.

As shown, individual memory devices 108A-108D are spaced apart along plane 109A and individual memory devices 108E-108H are spaced apart along plane 109B. Planes 109A and 109B are spaced apart by a distance that is dependent on a size of memory devices 108 and on thickness of encapsulation layer (not shown) surrounding individual memory devices 108. In the illustrative embodiment, planes 109A and 109B are parallel to each other.

Memory devices 108 may be spaced apart uniformly. In some embodiments, adjacent memory devices, on a given plane, such as memory devices 108A and 108B, (or 108C and 108D) are separated from each other by spacing $S_M$ along the x-direction. $S_M$ is the shortest distance along the x-direction, between sidewalls of any pair of memory devices. Similarly, adjacent memory devices on plane 109B, such as memory devices 108E and 108F (or 108G and 108H), are separated from each other by spacing $S_M$ along the x-direction.

Memory devices on plane 109A are separated from memory devices on plane 109B by spacing $S_Y$ along the y-direction. $S_Y$ is the shortest distance (along the y-direction) between sidewalls of any pair of memory devices, such as memory devices 108A and 108E. $S_Y$ is the shortest distance, for example, between memory devices 108C and 108G or between memory devices 108D and 108H.

Memory devices 108 within plane 109A may not be aligned with memory devices 108 within plane 109B. For example, memory device 108A within plane 109A may be staggered relative to memory device 108B within plane 109B, as shown. Staggering of individual memory devices 108 may be required to accommodate routing structures, such as conductive lines, above and below memory devices 108. In some such embodiments, centers of memory devices such as memory devices 108A and 108E are spaced apart along the x-direction by distance $S_{MC}$. In further such embodiments, centers of memory devices, such as memory devices 108E and 108B, are spaced apart along the x-direction by $S_{MC}$. In some embodiments, conductive lines above memory devices 108A and 108E may be directed along the y-direction. $S_{MC}$ between memory devices 108A and 108E is substantially adequate to prevent multiple memory devices from coupling to a same conductive line.

Plurality of memory devices 108 are also spaced apart to accommodate placement of via electrode 117. For example, memory devices 108B and 108C are spaced apart by distance $S_{MM}$. $S_{MM}$ is sufficiently large to accommodate via electrode 117 in between memory devices 108B and 108C. $S_{MM}$ may be greater than or less than $S_M$. In the illustrative embodiment, $S_{MM}$ is greater than $S_M$.

In the illustrative embodiment, via electrode 117 has a rectangular plan view cross section. In other embodiments, via electrode 117 can have a circular or elliptical cross section. In the illustrative embodiment, electrode structure 112 has a circular plan view cross section. In other embodiments, electrode structure 112 can have a rectangular or elliptical cross section.

Features of plate electrode 110 and plurality of memory devices 108 are applicable to plate electrodes 148 and 170 and plurality of memory devices 146 and 168, respectively in FIG. 1A.

Figure 1D:
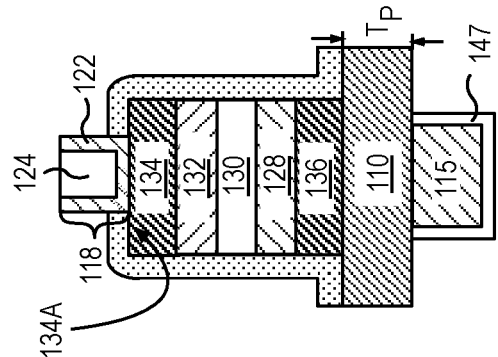
FIG. 1D is a cross-sectional illustration of layers within a memory device, where the memory device is protected by a combination of conductive and insulative hydrogen barriers, in accordance with an embodiment of the present disclosure.
Figure 1C:
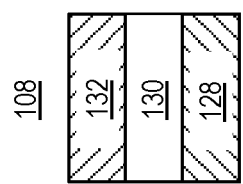
FIG. 1C is a cross-sectional illustration of layers within the memory device, in accordance with an embodiment of the present disclosure.

Examples of layers within the plurality of memory devices 108 are described with respect to FIG. 1C and FIG. 1D next.

FIG. 1C is a cross sectional illustration of memory device 108, in accordance with an embodiment of the present disclosure. Depending on embodiments, memory device 108 can have three or more layers. An embodiment of memory device 108 including four layers is shown in FIG. 1C. As shown, memory device 108 includes bottom electrode 128, dielectric layer 130 and top electrode 132.

In an embodiment, bottom electrode 128 and top electrode 132 include a conductive ferroelectric oxide (when memory device 108 is a ferroelectric memory device 108). The conductive ferroelectric oxide includes one of non-Pb perovskite metal oxides, such as but not limited to, La—Sr—CoO$_3$, SrRuO$_3$, La—Sr—MnO$_3$, YBa$_2$Cu$_3$O$_7$, Bi$_2$Sr$_2$CaCu$_2$O$_8$, or LaNiO$_3$.

In an embodiment, dielectric layer 130 is a ferroelectric dielectric layer that includes non-Pb perovskite material in the form ABO$_3$, where A and B are two cations of different sizes and O is oxygen. A is generally larger than B in size. In some embodiments, non-Pb perovskites can also be doped, e.g., by La or lanthanides. The non-Pb perovskite material can include one or more of La, Sr, Co, Cr, K, Nb, Na, Sr, Ru, Y, Fe, Ba, Hf, Zr, Cu, Ta, Bi, Ca, Ti, and Ni.

In other embodiments, ferroelectric dielectric layer 130 includes low voltage ferroelectric material sandwiched between top electrode 132 and bottom electrode 128. These low voltage FE materials can be of the form AA'BB'O$_3$, where A' is a dopant for atomic site A and can be an element from the lanthanides series, where B' is a dopant for atomic site B and can be an element from the transition metal elements such as Sc, Ti, V, Cr, Mn, Fe, Co, Ni, Cu, or Zn. A' may have the same valency as site A, with a different ferroelectric polarizability. Voltage below 2-Volts is sufficiently low to be characterized as low voltage.

In some embodiments, dielectric layer 130 includes a paraelectric material, the paraelectric material comprises SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

In some embodiments, dielectric layer 130 includes an anti-ferroelectric material. The antiferroelectric material may include one of: PZT with >30% Zr doping or Sn doping >25%, La-doped PZT with >30% Zr doping and/or Sn doping >20%, HfSiO2 and HfZrOx with >30% Si and >30% Zr doping, ZrO2, NaNbO3, or >5% K doped NaNbO3.

In some embodiments, ferroelectric dielectric layer 130 can dictate a choice of encapsulation layer 116. Encapsulation layer 116 may be chosen to have a Young's modulus similar to a Young's modulus of ferroelectric dielectric layer 130. Furthermore, encapsulation layer 116 may be chosen to have a low probability of presence of defects at the interface between encapsulation layer 116 and ferroelectric dielectric layer 130. Additionally, encapsulation layer 116 has a lower dielectric constant than the dielectric constant of ferroelectric dielectric layer 130 to enable field lines to be concentrated between top electrode 132 and bottom electrode 128.

For example, in some embodiments, where ferroelectric dielectric layer 130 includes a $Pb_xZr_{1-x}Ti_yO_3$ group of families, encapsulation layer 116 can include $Al_xO_y$, $HfO_x$, $ZrO_x$, $TaO_x$, or $TiO_x$. In some embodiments, where ferroelectric dielectric layer 130 includes a $La_xBi_{1-x}Fe_yO_3$ group of families, encapsulation layer 116 can include $Al_xO_y$, $HfO_x$, $ZrO_x$, $TaO_x$, or $TiO_x$. In some embodiments, where ferroelectric dielectric layer 130 includes a $BaTiO_3$ group of families, encapsulation layer 116 can include $Al_xO_y$, $HfO_x$, $ZrO_x$, $TaO_x$, or $TiO_x$. In some embodiments, where ferroelectric dielectric layer 130 includes a $BiFeO_3$ group of families, encapsulation layer 116 can include $Al_xO_y$, $HfO_x$, $ZrO_x$, $TaO_x$, or $TiO_x$.

Features of memory device 108 described are applicable to the plurality of memory devices 146, and 168, respectively in FIG. 1A.

In other embodiments, memory device 108 may include one or more layers with hydrogen barrier properties.

FIG. 1D is a cross-sectional illustration of a memory device 108, in accordance with an embodiment of the present disclosure. Memory device 108 may include a conductive hydrogen barrier 134 directly on top electrode 132 and conductive layer 136 with hydrogen barrier properties directly below and in contact with bottom electrode 128. In some such embodiments, electrode structure 112 and via electrode 118 may not need to include a conductive hydrogen barrier. In the illustrative embodiment, electrode structure 112 includes liner layer 147 and conductive fill material 115 within bounds of liner layer 147. Liner layer 147 may include Ti, Ta, TiN, TaN, Ru, or any other conductive material that can provide adhesion to conductive fill material 115.

In some such embodiments, via electrode 118 is directly in contact with uppermost surface 134A of conductive hydrogen barrier 134.

Features of memory device 108 described are applicable to the plurality of memory devices 146, and 168, respectively in FIG. 1A.

FIG. 1E is a cross-sectional illustration of a plurality of memory devices 108 above plate electrode 110, where plate electrode 110 has a variable thickness along a lateral direction (X-direction). Plate electrode 110 has a thickness $T_p$, that depends on a choice of material as well as on the material of the lowermost layer of memory devices 108A-108B, such as conductive layer 136 (FIG. 1D), or bottom electrode 128 (FIG. 1C). In some embodiments, $T_p$ has a thickness between 5 nm and 20 nm. As shown, plate electrode 110 has maximum thickness $T_P$ under memory devices 108A-108B. Surface 110K of plate electrode 110 that is within an immediate vicinity of memory devices 108A-108B may be recessed. In some embodiments, surface 110K is recessed and curved, as shown. Plate electrode 110 has minimum thickness $T_{pmin}$, that may be between 50% and 90% of $T_P$. A ratio between $T_{Pmin}:T_p$ of at least 1:2 is sufficient not to increase resistance of plate electrode 110. $T_{Pmin}$ may depend on a number of memory devices 108, number of routing connections that may be coupled with memory devices 108 and on a signal frequency. In most embodiments $T_{Pmin}$ can be more than 5 nm. It is desirable to reduce difference between $T_{Pmin}$ and $T_P$. Resistance of plate electrode 110 can determine limits of signal frequency. A higher signal frequency correlates with lower electrical resistance and a greater thickness, $T_{Pmin}$ of plate electrode 110. Or alternatively higher signal frequency may correlate with a smaller difference between $T_{Pmin}$ and $T_P$.

When surface 110K is curved, encapsulation layer 116 may follow a contour of surface 110K, such as is shown. In one or more embodiments, encapsulation layer 116 can have thickness $T_{EC}$ that is between 1 nm and 5 nm. Encapsulation layer 116 may be substantially conformal with sidewalls 108I and surface 110K, as illustrated.

Features of plate electrode 110 and plurality of memory devices 108A and 108B are applicable to plate electrodes 148 and 170 and plurality of memory devices 146, and 168, respectively in FIG. 1A.

FIG. 1F is a cross-sectional illustration is an embodiment where surface 110K is recessed uniformly from uppermost surface 110A within an immediate vicinity of memory device 108A. In some such embodiments, encapsulation layer 116 is also deposited on a sidewall portion 110L of plate electrode 110, as shown. Encapsulation layer 116 covers an interface 139 between memory device 108A and plate electrode 110. In the illustrative embodiment, surface 110K is substantially planar. A ratio of $T_{Pmin}:T_p$ of at least 1:2 can provide adequate electrical conductivity, in some such embodiments.

Features of plate electrode 110 and memory device 108A are applicable to plate electrodes 148 and 170 and plurality of memory devices 146, and 168, respectively in FIG. 1A.

FIG. 1G is a cross-sectional illustration of an embodiment where encapsulation layer 116 is substantially limited to sidewalls 108I of memory device 108. In the illustrative embodiment, sidewalls 108I of memory device 108 are substantially tapered relative to uppermost surface 110A. In some such embodiments, encapsulation layer 116 can have a structure of a spacer. In some such embodiments, encapsulation layer 116 can have thickness $T_{EC}$ that varies with height. In the illustrative embodiment, $T_{EC}$ increases with height to a maximum thickness and then decreases adjacent to uppermost surface 108J. In one or more embodiments, $T_{EC}$ is at least 1 nm.

Features of plate electrode 110 and memory device 108A are applicable to plate electrodes 148 and 170 and plurality of memory devices 146, and 168, respectively in FIG. 1A.

FIG. 1H is a cross-sectional illustration of an embodiment where encapsulation layer 116 is adjacent to sidewalls 108I and on a portion of the surface 110K that is curved and recessed. Features of plate electrode 110 and memory device 108A are applicable to plate electrodes 148 and 170 and plurality of memory devices 146, and 168, respectively in FIG. 1A.

In other embodiments, the memory device is a trench capacitor.

Figure 2:
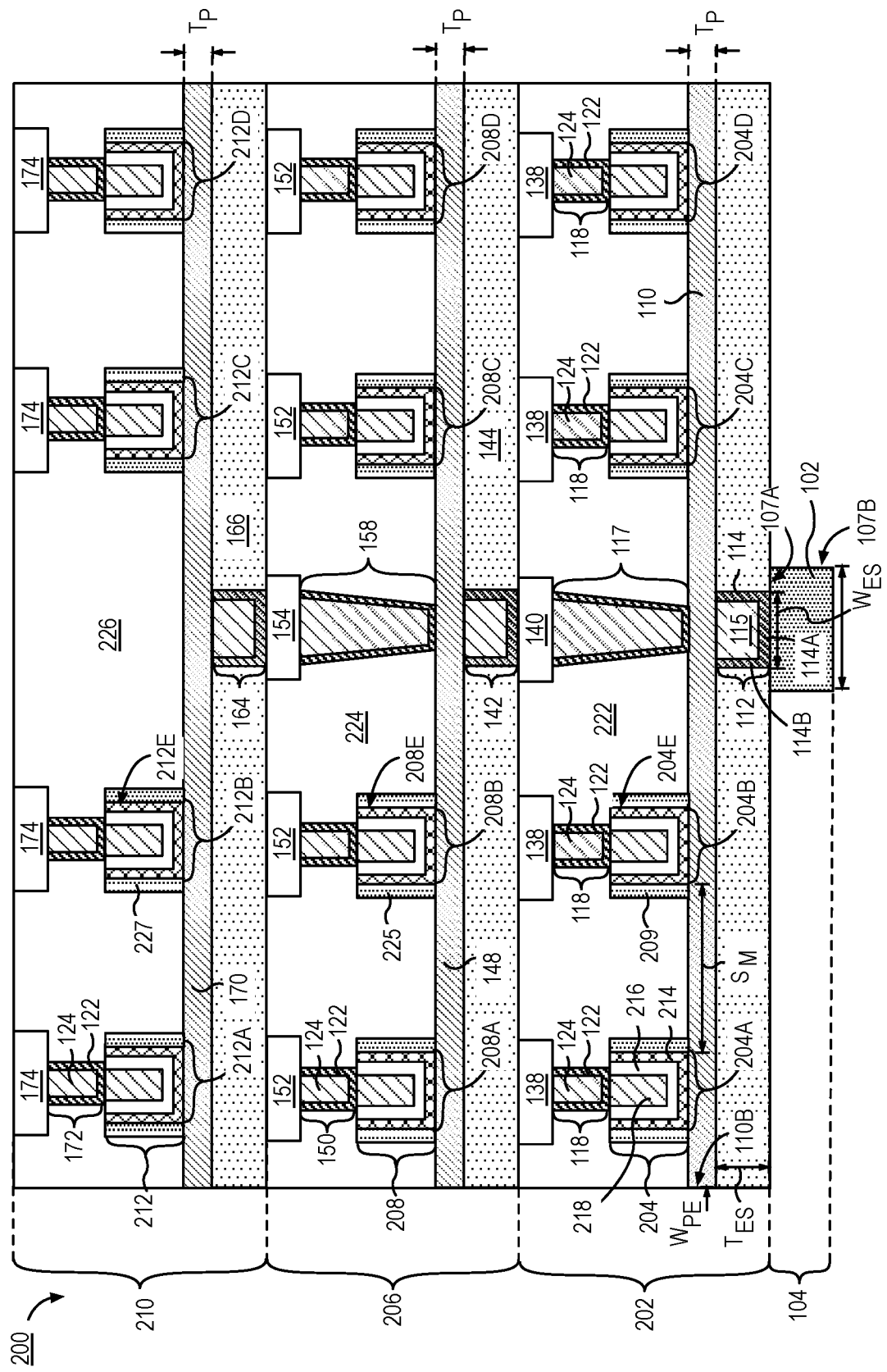
FIG. 2 is a cross-sectional illustration of a plurality of memory devices above a plate electrode, where the plate electrode has a variable thickness along a lateral direction.

FIG. 2 is a cross-sectional illustration of device structure 200 that includes plurality of trench capacitors across multiple levels. Device structure 200 includes many features of device structure 100. In the illustrative embodiment, device structure 200 includes a plurality of trench capacitors coupled with a plate electrode within each level. For example, level 202 includes a plurality of trench capacitors 204 coupled with plate electrode 110; level 206 includes a plurality of trench capacitors 208 coupled with plate electrode 148; and level 210 includes a plurality of trench capacitors 212 coupled with plate electrode 170.

Plurality of trench capacitors 204 includes one or more ferroelectric materials or one or more paraelectric materials. As shown, plurality of trench capacitors 204 include a first electrode, herein bottom electrode 214. Bottom electrode 214 includes a base portion in contact with plate electrode 110, and substantially vertically sidewall portions. In the illustrative embodiment, bottom electrode 214 is U-shaped with an opening facing via electrode 118 in level 202. The base portion and substantially vertical sidewall portions are of substantially a same thickness.

Individual ones of the plurality of trench capacitors 204 further include a ferroelectric or a paraelectric dielectric layer (herein dielectric layer 216) directly adjacent to bottom electrode 214. As shown, dielectric layer 216 is substantially conformal to bottom electrode 214. In the illustrative embodiment, dielectric layer 216 is U-shaped with an opening facing via electrode 118.

Individual ones of the plurality of trench capacitors 204 further include a second electrode (herein top electrode 218) directly in contact with dielectric layer 216. Top electrode 218 fills a space between portions of dielectric layer 216 that are conformal with bottom electrode 214. In the illustrative embodiment, top electrode 218 is substantially cylindrical in shape. The arrangement of bottom electrode 214, dielectric layer 216 and top electrode 218 produces a substantially uniform electric field between bottom electrode 214 and top electrode 218 during operation.

Plurality of trench capacitors 204 can be advantageous over parallel plate capacitors, such as memory device 108, because plurality of trench capacitors 204 have greater surface area for charge storage for a given footprint. However, to obtain charge storage benefits, plurality of trench capacitors 204 can be substantially taller than planar capacitors by at least 3 times, for example.

Plurality of trench capacitors 204 includes the same or substantially the same material as layers of memory device 108 described above. For example, bottom electrode 214, dielectric layer 216, and top electrode 218, individually, include a material that is the same or substantially the same as the material of bottom electrode 128, dielectric layer 130 and top electrode 132, respectively, described in association with FIG. 1D.

Referring again to FIG. 2, in the illustrative embodiment, trench capacitors 204A, 204B, 204C, and 204D have sidewalls 204E that are substantially vertical. In other embodiments, sidewalls 204E can be tapered to decrease at an interface between trench capacitors 204A, 204B, 204C, and 204D. Trench capacitors 204A, 204B, 204C, and 204D are spaced apart by distance $S_M$, respectively. $S_M$ refers to the distance along the x-direction between vertical portions of the bottom electrodes 214 on trench capacitors 204A, and 204B, and between vertical portions of the bottom electrodes 214 on trench capacitors 204C, and 204D.

Individually, trench capacitors 204A-204D may be directly adjacent to dielectric spacer 209 or dielectric 222. In the illustrative embodiment, trench capacitors 204A-204D are adjacent to a respective dielectric spacer 209. Dielectric spacer 209 is between dielectric 222 and trench capacitors 204A-204D. When the material of dielectric 222 includes hydrogen barrier properties, trench capacitors 204A-204D may be directly adjacent to dielectric 222. Dielectric 222 may include a material that is the same or substantially the same as the material of dielectric 126 (FIG. 1A). In some embodiments, level 202 includes a plurality of dielectric materials immediately above plurality of trench capacitors 208 (to be discussed below). In some such embodiments, dielectric 222 may include multiple levels of different dielectric material.

Dielectric spacer 209 is in contact with bottom electrode 214 and extends along the full vertical extent of bottom electrode 214. In some embodiments, dielectric spacer 209 includes a material that is the same or substantially the same as the material of encapsulation layer 116 described in association with FIG. 1A.

Referring again to FIG. 2, in some embodiments, dielectric 222 includes $SiO_2$, SiOC, SiC, or $SiO_2$ doped with F. In other embodiments, dielectric 222 includes an insulator material including a metal and oxygen, for example, $Al_xO_y$, $HfO_x$, $AlSiO_x$, $ZrO_x$, $TiO_x$, $AlSiO_x$, $HfSiO_x$, $TaSiO_x$, or a metal and a nitrogen, for example, AlN, ZrN, or HfN. In some such embodiments, dielectric spacer 209 can be removed.

Plurality of trench capacitors 204 are individually coupled with via electrode 118. Via electrode 118 includes one or more features of via electrode 118 described in association with FIG. 1A.

Referring again to FIG. 2, in the illustrative embodiment, via electrode 118 includes conductive hydrogen barrier 120, liner layer 122 and conductive fill material 124. In one or more embodiments, conductive hydrogen barrier 120, liner layer 122, and conductive fill material 124 individually include a material that is the same or substantially the same as the material of conductive hydrogen barrier 120, liner layer 122 and conductive fill material 124, respectively, as described in association with FIG. 1A. Referring again to FIG. 2, via electrode 118 is in contact with top electrode 218. In other embodiments, a portion of via electrode 118 can be in contact with some or all of uppermost surface of dielectric layer 216.

In the illustrative embodiment, routing structure 138 is in contact with a respective via electrode 118, and routing structure 140 is in contact with via electrode 117.

In the illustrative embodiment, level 206 includes further structures and features of level 202. For example, dielectric spacer 225 is adjacent to trench capacitors 208A, 208B, 208C, and 208D. Furthermore, via 150 electrode is above individual trench capacitors 208A, 208B, 208C, and 208D. Plurality of trench capacitors 208 include one or more features of the plurality of trench capacitors 204, such as bottom electrode 214, dielectric layer 216, and top electrode 218. Other features, such as taper of sidewalls 208E may also be substantially the same in plurality of trench capacitors 208. Spacing between vertical portions of the bottom electrodes 214 between adjacent trench capacitors 208A and 208B, and between 208C and 208D are also given by a distance along the x-direction $S_M$.

Individually, trench capacitors 208A-208D may be directly adjacent to dielectric spacer 225 or dielectric 224. In the illustrative embodiment, trench capacitors 208A-208D are adjacent to a respective dielectric spacer 225. Spacer 225 is between dielectric 224 and trench capacitors 208A-208D. When the material of dielectric 224 includes hydrogen barrier properties, trench capacitors 208A-208D may be directly adjacent to dielectric 224. Dielectric 224 may include a material that is the same or substantially the same as the material of dielectric 126 described in association with FIG. 1A. Referring again to FIG. 2, in some embodiments, level 206 includes a plurality of dielectric materials immediately above plurality of trench capacitors 208 (to be discussed below). In some such embodiments, dielectric 224 may include multiple levels of different dielectric material.

Level 206 further includes signal electrode 158 between trench capacitors 208B and 208C.

In the illustrative embodiment, level 210 is above level 206. For example, dielectric spacer 227 is adjacent to trench capacitors 212A, 212B, 212C, and 212D. Furthermore, via electrode 172 is above individual trench capacitors 212A, 212B, 212C, and 212D. Plurality of trench capacitors 212 include one or more features of the plurality of trench capacitors 204, such as bottom electrode 214, dielectric layer 216, and top electrode 218. Other features such as taper of sidewalls 212E may also be substantially the same as taper in sidewalls 204E. Spacing between vertical portions of the bottom electrodes 214 between adjacent trench capacitors 212A and 212B, and between 212C and 212D is also given by distance $S_M$ along the x-direction.

Individually, trench capacitors 212A-212D may be directly adjacent to dielectric spacer 227 or dielectric 226. In the illustrative embodiment, trench capacitors 212A-212D are adjacent to a respective dielectric spacer 227. Spacer 227 is between dielectric 226 and trench capacitors 212A-212D. When the material of dielectric 226 includes hydrogen barrier properties, trench capacitors 212A-212D may be directly adjacent to dielectric 226. Dielectric 226 may include a material that is the same or substantially the same as the material of dielectric 126 described in association with FIG. 1A. Referring again to FIG. 2, in some embodiments, level 210 includes a plurality of dielectric materials immediately above plurality of trench capacitors 212 (to be discussed below). In some such embodiments, dielectric 226 may include multiple levels of different dielectric material.

Figure 3:
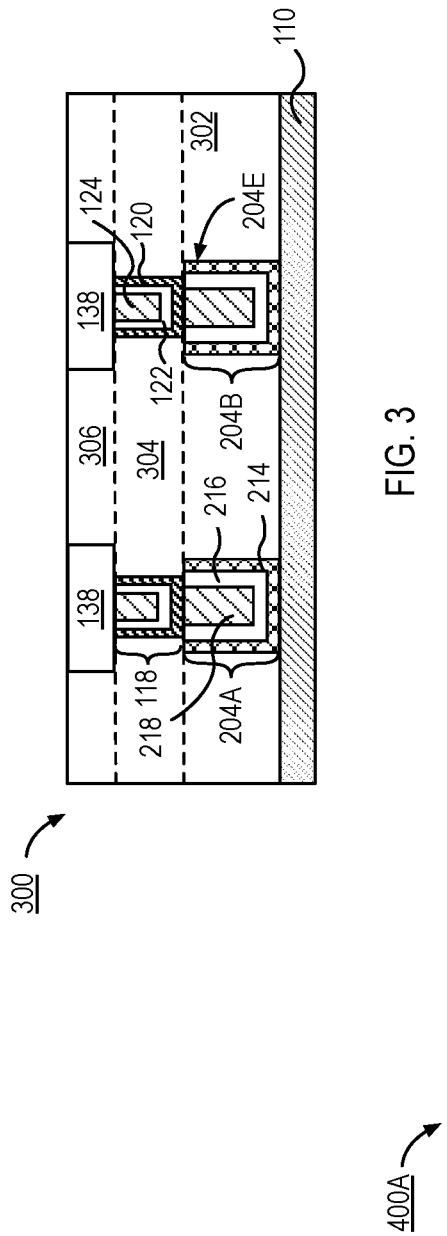
FIG. 3 is a cross-sectional illustration of a structure depicting a plurality of trench capacitors coupled to a plate electrode.

FIG. 3 is a cross-sectional illustration of a structure 300 depicting a plurality of trench capacitors 204 coupled to plate electrode 110. In the illustrative embodiment, trench capacitors 204A and 204B are directly adjacent to dielectric 302. In the illustrative embodiment, dielectric 302 includes a material, for example, of high film density. As such, dielectric 302 is directly adjacent to bottom electrode 214.

In the illustrative embodiment, structure 300 further includes a dielectric 304 on dielectric 302. In the illustrative embodiment, dielectric 304 includes a material, for example, of high film density. In some embodiments, dielectric 304 includes a material that is the same or substantially the same as the material of dielectric 302. In some such embodiments, via electrode 118 does not include conductive hydrogen barrier 120.

Structure 300 also includes a dielectric 306 adjacent to routing structure 138. As shown, dielectric 306 is above dielectric 304. In some embodiments, dielectric 306 includes a material, for example, of high film density. In other embodiments, dielectric 306 includes silicon and oxygen, and one or more of carbon or nitrogen, or silicon and oxygen.

Figure 4A:
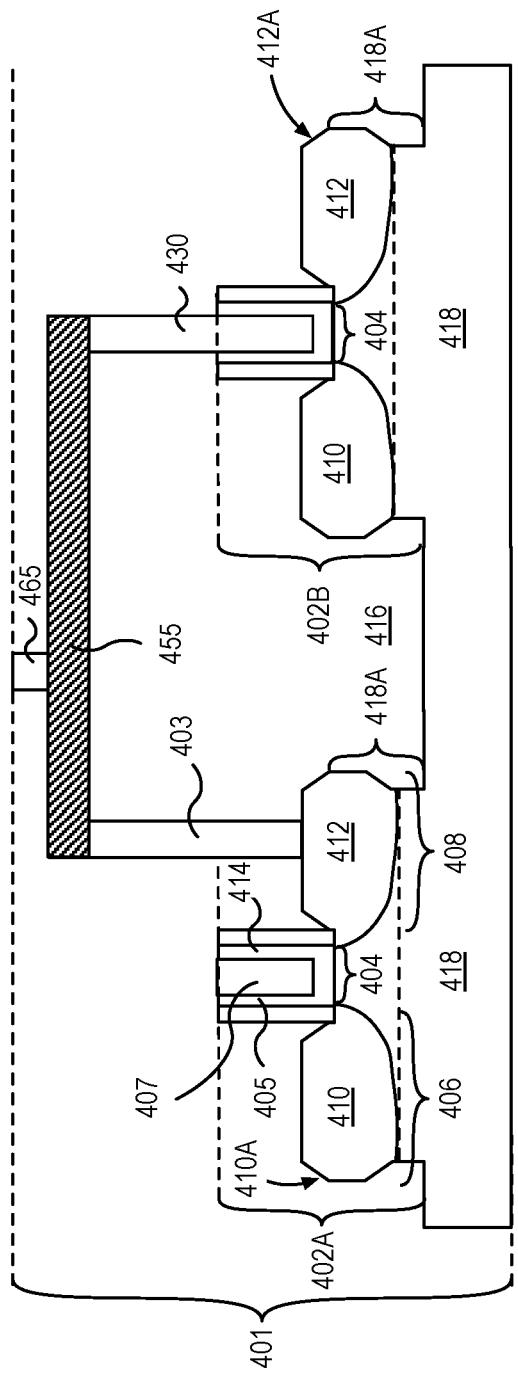
FIG. 4A is a cross-sectional illustration of a bridge structure coupled between a gate of a first transistor and a drain of a second transistor.

FIG. 4A is a cross-sectional illustration device structure 400A including a pair of transistors 402A and 402B that are coupled together. In the illustrative embodiment, transistors 402A and 402B are identical or substantially identical. Transistors 402A and 402B are on level 401 and share substrate 418.

In the illustrative embodiment, transistors 402A and 402B are examples of non-planar transistors. Transistors 402A and 402B may be, for example, NMOS or PMOS transistors. In an embodiment, transistors 402A and 402B include gate structure 404 between source region 406 and drain region 408. In the illustrative embodiment, source region 406 includes epitaxial source structure 410 (herein source structure 410) and drain region 408 includes epitaxial drain structure 412 (herein drain structure 412). Source structure 410 and drain structure 412 are separated from gate structure 404 by spacer 414 and have faceted sidewall surfaces 410A and 412A. Not all faceted surfaces of source structure 410 and drain structure 412 are shown. In the illustrative embodiment, a portion of gate structure 404 is on dielectric 416 that separates gate structure 404 from substrate 418. In the illustrative embodiment, drain contact 403 is coupled to drain structure 412.

Transistors 402A and 402B may be arranged side by side in an x-direction, as shown, or in a y-direction. The arrangement may depend on structures that are utilized to electrically connect transistors 402A and 402B. In the illustrative embodiment, transistor 402A further includes a drain contact 403 on drain structure 412. Transistor 402B includes a gate contact 430.

As shown, gate structure 404 further includes gate dielectric layer 405 and gate electrode 407. Gate dielectric layer 405 has a base portion on fin 418A and sidewall portions that are adjacent to spacer 414. Gate electrode 407 is confined within gate dielectric layer 405.

In an embodiment, gate dielectric layer 405 includes a suitable gate dielectric material such as but not limited to an oxide of one or more of Si, Hf, Zr, La, Ti, Ta, Ga; or Al, such as $SiO_2$, $HfO_2$, $ZrO_2$, HfSiOx, $HfZrO_2$, $Ta_2O_5$, $Al_2O_3$, La2O3, or $TaSiO_x$; or $Ga_2O_5$. Gate electrode 407 may include one or more of Ti, Al, W, Pt, Co, Ni, or Pd; nitrogen; one or more of Ti, Ta, Al, Hf, or Zr; or carbon and one or more of Ti, Al, Ta, Hf, or Zr. Source structure 410 and drain structure 412 may include amorphous Si, SiC, SiGe, or Ge, and may be doped with As, P, or B, depending on the mobile charge carrier required. In some embodiments, spacer 414 includes silicon nitride or silicon nitride doped with carbon. In some embodiments, drain contact 403 includes a conductive material such as Ru, Ti, Co, Mo, Co, Ni, W, or Ta; or nitrides of Ti, W, or Ta. In other embodiments, drain contact 403 includes a liner layer including TiN, TaN, WN; and a fill metal including one or more of Ru, Ti, Co, Mo, Co, Ni, W, or Ta.

A bridge structure 455 is coupled between gate structure 404 of transistor 402B and drain region 408 of transistor 402A. Level 401 further includes bridge structure 455 and via electrode 465.

In the illustrative embodiment, via electrode 465 is coupled to bridge structure 455. Bridge structure 455 may couple gate contact 430 of transistor 402A with drain contact 403 of transistor 402B. In other embodiments, gate contact 430 of transistor 402A can be coupled with drain contact 403 of transistor 402B. In the illustrative embodiment, bridge structure 455 couples drain contact 403 and gate contact 430. In an embodiment, via electrode 465 and bridge structure 455 include a material that is the same or substantially the same as the material of conductive interconnect 102 (FIG. 1A).

Figure 4B:
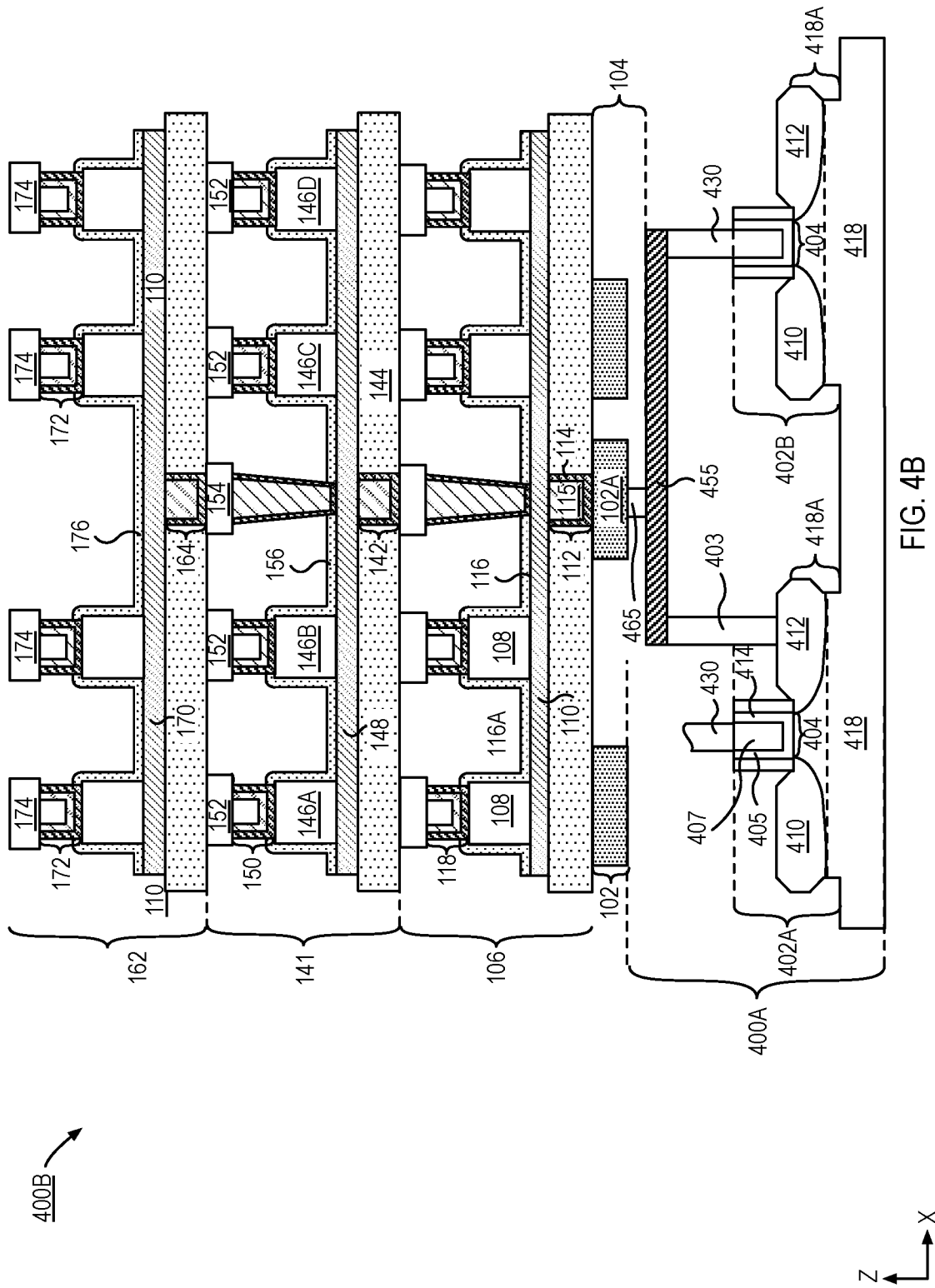
FIG. 4B is a cross-sectional illustration of a system including a device structure including multi-level planar capacitors coupled with a pair of transistors.

FIG. 4B is a cross-sectional illustration of system 400B including device structure 100 coupled with device structure 400A. Dielectrics are not illustrated, for clarity.

In the illustrative embodiment, conductive interconnect 102A is coupled with transistors 402A and 402B through bridge structure 455. As shown, conductive interconnect 102A is coupled to bridge structure 455 through via electrode 465. Via electrode 465 is coupled with a single conductive interconnect 102A. Conductive interconnects 102A and via electrode 465 are within level 104. Bridge structure 455 may couple gate contact of transistor 402A with a drain contact of transistor 402B or vice versa. In the illustrative embodiment, bridge structure 455 couples drain contact 403 and gate contact 430. In an embodiment, via electrode 465 includes a material that is the same or substantially the same as the material of conductive interconnect 102A.

Figure 4C:
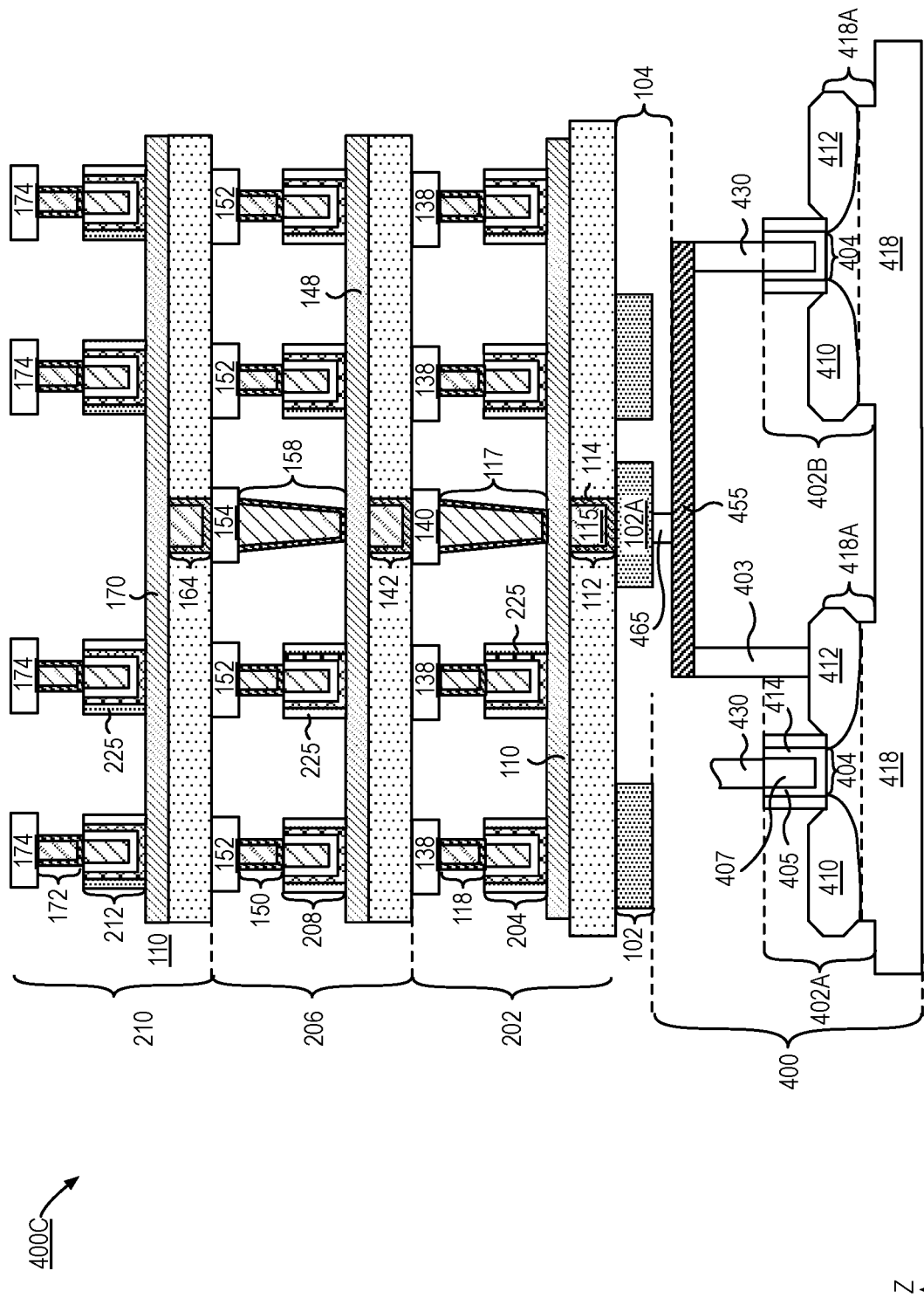
FIG. 4C is a cross-sectional illustration of a system including a device structure including multi-level trench capacitors coupled with a pair of transistors.

FIG. 4C is a cross-sectional illustration of system 400C including device structure 200 coupled with device structure 400. Dielectric 103 is not illustrated, for clarity.

In the illustrative embodiment, conductive interconnect 102A is coupled with transistors 402A and 402B through bridge structure 455. As shown, conductive interconnect 102A is coupled to bridge structure 455 through via electrode 465. Via electrode 465 is coupled with a single conductive interconnect 102A. Conductive interconnect 102A and via electrode 465 are within level 104. Bridge structure 455 may couple a gate contact of transistor 402A with a drain contact of transistor 402B or vice versa. In the illustrative embodiment, bridge structure 455 couples drain contact 403 and gate contact 430.

Figure 5:
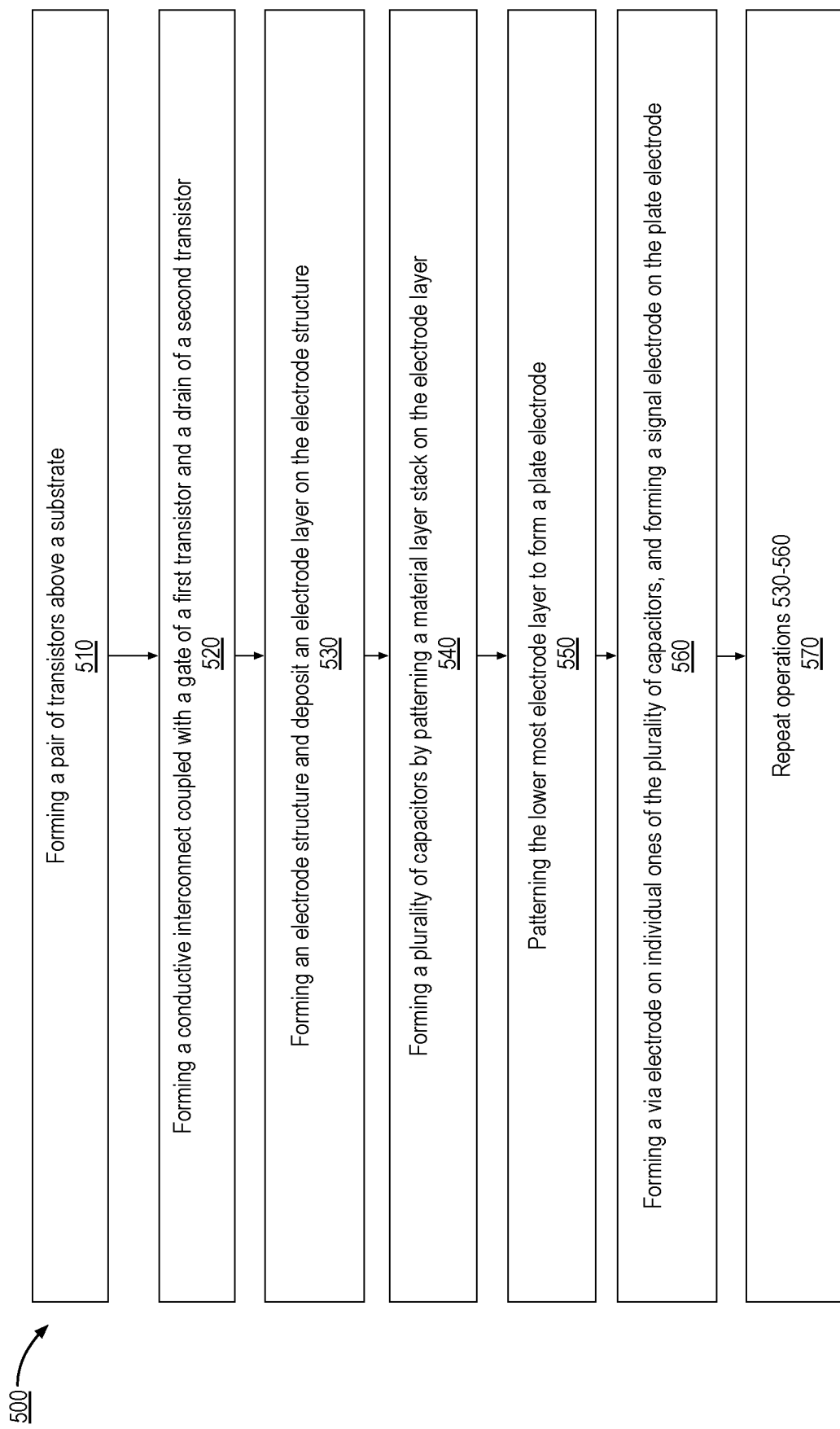
FIG. 5 is a flow diagram for a method to fabricate a device structure including stacked memory devices coupled with a pair of transistors, in accordance with some embodiments of the present disclosure.

FIG. 5 is a flow diagram for method 500 to fabricate a device structure including a plurality of memory devices above a shared plate electrode that is coupled with a transistor. Method 500 begins at operation 510 with the forming of a pair of transistors above a substrate. Method 500 continues at operation 520 with the formation of a conductive interconnect that is coupled with the transistor. The method continues at operation 530 with the forming an electrode structure and depositing an electrode layer on the electrode structure. Method 500 continues at operation 540 with the formation of a plurality of capacitors by patterning a material layer stack on the electrode layer. Method 500 continues at operation 550 by patterning the lowermost electrode layer to form a plate electrode. The method continues at operation 560 with the forming of a via electrode on individual ones of the plurality of capacitors. The method concludes at operation 570 by repeating operations 530-560 to fabricate more levels of capacitors on plate electrodes above a first level fabricated by operations 530-560.

Method 500 outlines a method to fabricate both planar and non-planar capacitors. Examples of planar capacitors include devices where individual layers within the capacitor extend on a single plane. Examples of non-planar capacitors include trench capacitors.

FIG. 6A is a cross-sectional illustration of fin 600, formed on substrate 601. In an embodiment, mask 602 is formed on substrate 601. An etch process may be utilized to etch the material of substrate 601 to form fin 600. In some embodiments, fin 600 may be substantially vertical, as is shown. In an embodiment, mask 602 includes a dielectric material. Mask 602 may be patterned into plan view shape and size of fin 600 by forming a lithographic pattern on the dielectric material. In an embodiment, substrate 601 includes silicon, silicon germanium, germanium, or a suitable material that can be utilized to pattern and dope to form source and drain structures applicable for a transistor.

FIG. 6B is an isometric illustration of the structure in FIG. 6A following the process to form dielectric 416 adjacent to a portion of fin 600. In an embodiment, dielectric 416 is blanket deposited on mask 602 (not shown), on sidewalls of fin 600, and on substrate 601. Dielectric 416 is planarized post deposition. In some embodiments, the planarization process includes a chemical mechanical planarization process (CMP). The CMP process removes mask 602 from above fin 600. Dielectric 416 is then recessed to obtain a desired height of fin 600. Dielectric 416 provides electrical isolation for portions of a gate electrode to be formed.

FIG. 6C is an isometric illustration of the structure in FIG. 6B following the formation of dummy gate 604 on fin 600. In an embodiment, dummy gate dielectric layer 606 is deposited on fin 600 and on dielectric 416. In an embodiment, dummy gate dielectric layer 606 is grown by a plasma enhanced chemical vapor deposition (PECVD) process. In some embodiments, dummy gate dielectric layer 606 includes a layer of silicon dioxide adjacent to the fin 600.

A dummy gate material is blanket deposited on the dummy gate dielectric layer 606. In an embodiment, the dummy gate material includes a chemical vapor deposition process to deposit a material such as polysilicon, amorphous silicon or silicon germanium. The deposition process may take place at temperatures of approximately 600° C. or less. In some embodiments, such as is shown, a planarization process may be performed to planarize the dummy gate material after deposition.

A mask material is deposited on the dummy gate material. In an embodiment, the mask material includes a silicon nitride or a silicon oxynitride. The mask material is patterned by a lithographic process and etched by a plasma etch process to form hardmask 608. The hardmask 608 is subsequently utilized to etch the dummy gate material to form dummy gate 604. The process to form dummy gate 604 includes removing the dummy gate material from sidewalls of fin 600. Dummy gate dielectric layer 606 protects fin 600 during the etch process. Dummy gate dielectric layer 606 is removed from surfaces of fin 600 after formation of dummy gate 604.

After formation of dummy gate 604, spacer 414 is formed on sidewalls of dummy gate 604. In an embodiment, an encapsulation layer is blanket deposited on fin 600, and on dummy gate 604. The encapsulation layer is then etched to form spacer 414 on sidewalls of dummy gate 604. The encapsulation layer may be removed from sidewalls of fin 600 by a masking and etching process so that spacer 414 is substantially formed on sidewalls of dummy gate 604. It is to be appreciated that the encapsulation layer is removed from sidewalls 600A of fin 600.

Figure 6E:
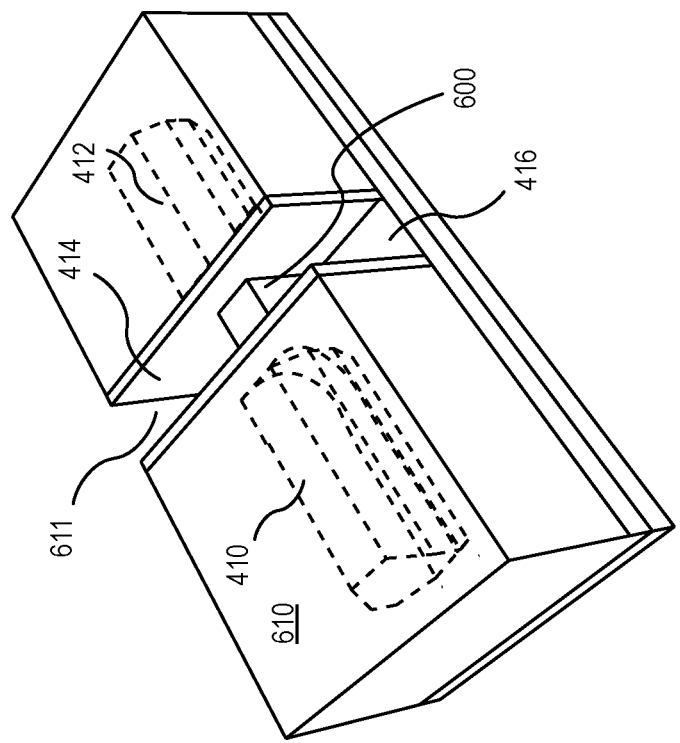
FIG. 6E is an isometric illustration of the structure in FIG. 6D following the process to remove the mask, dummy gate, and dummy gate dielectric to form a gate opening.
Figure 6D:
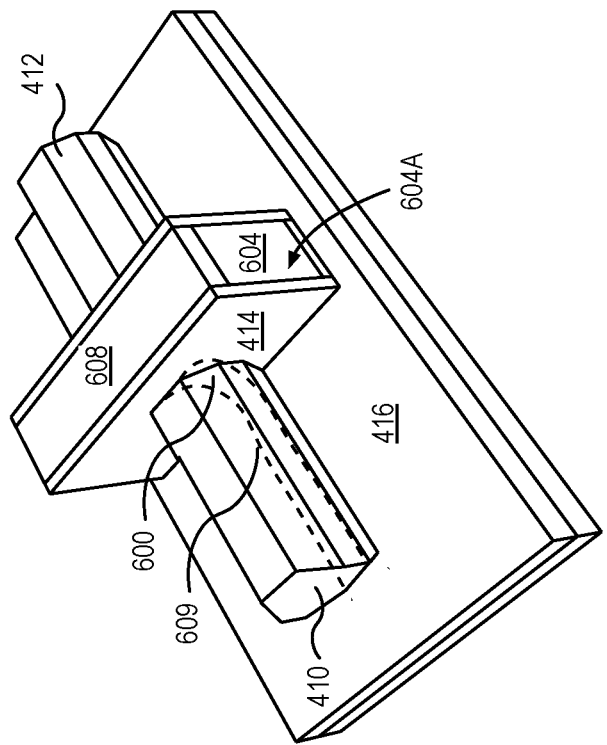
FIG. 6D is an isometric illustration of the structure in FIG. 6C following the process to form an epitaxial source structure and an epitaxial drain structure, in accordance with an embodiment of the present disclosure.

FIG. 6D is an isometric illustration of the structure in FIG. 6C following the process to form source structure 410 and drain structure 412. In an embodiment, portions of fin 600 are etched and removed. In an embodiment, the shape of fin 600 is indicated by dashed lines 609.

An epitaxial growth process is utilized to selectively grow source structure 410 and drain structure 412 on fin 600 as shown. In various embodiments, source structure 410 and drain structure 412 are grown to have faceted sidewalls. Dopants may be inserted during the growth process or implanted at a later operation. Spacer 414 and hardmask 608 prevent any epitaxial growth from taking place on dummy gate 604. It is to be appreciated that while sidewall 604A of dummy gate 604 is exposed for illustrative purposes, spacer 414 encapsulates all vertical sidewalls of dummy gate 604. The epitaxial growth process may be carried out at temperatures between 400° C. and 700° C. to grow source structure 410 and drain structure 412 doped with Si, amorphous silicon, or SiGe.

FIG. 6E is an isometric illustration of the structure in FIG. 6D following the process to remove mask 602, dummy gate 604, and dummy gate dielectric layer 606. In an embodiment, dielectric 610 is blanket deposited on source structure 410 and drain structure 412 (not visible), on dielectric 416, spacer 414, and mask 602. Dielectric 610 may include a material such as silicon oxide and may be deposited by a chemical vapor deposition (CVD), or a plasma enhanced chemical vapor deposition (PECVD) process. In an embodiment, dielectric 610 is planarized by a CMP process. In some embodiments, the CMP process may remove the mask. In other processes, an etch process may be utilized to remove mask 602, and portions of dummy gate 604. In other embodiments, a wet chemical process is utilized to selectively remove dummy gate 604, as well as dummy gate dielectric layer 606 selective to dielectric 416, spacer 414, and fin 600. The process of removing dummy gate forms opening 611.

Figure 6F:
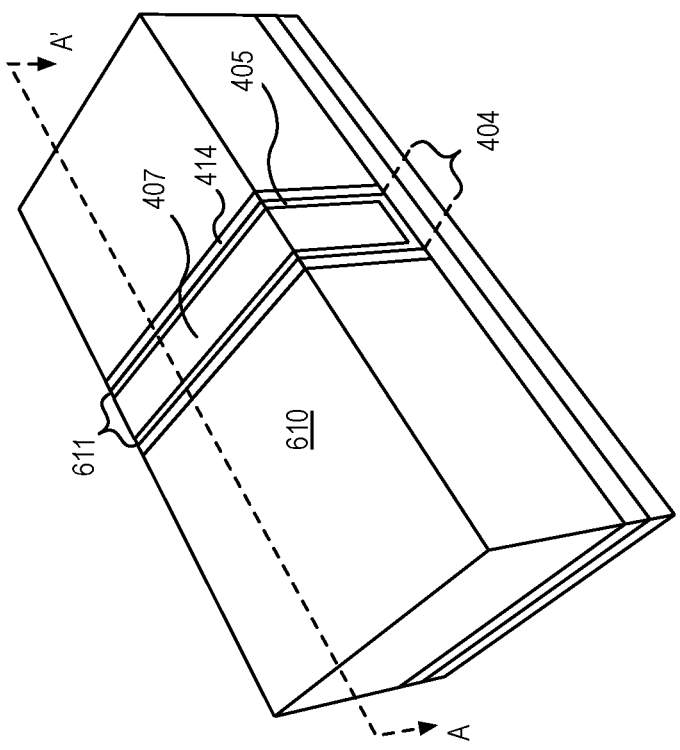
FIG. 6F is a cross-sectional illustration of the structure in FIG. 6E following the process to form a gate structure in the gate opening.

FIG. 6F is a cross-sectional illustration of the structure in FIG. 6E following the process to form gate structure 404 in opening 611. In an embodiment, gate dielectric layer 405 is blanket deposited after a high temperature process to grow source structure 410 and drain structure 412. In an embodiment, an atomic deposition process is utilized to deposit gate dielectric layer 405 on the fin (not shown), on sidewalls of the spacer, and on dielectric 416 in opening 611. Depending on an MOS characteristic, a PMOS or an NMOS material to form gate electrode 407 is deposited on gate dielectric layer 405. Depending on material, and the desired size of transistor gates, a range of deposition processes can be utilized. For example, processes may include CVD, physical vapor deposition (PVD), or atomic layer deposition (ALD). After deposition, a planarization process is performed to remove the excess material of gate electrode 407 and gate dielectric layer 405 from above spacer 414, and dielectric 610.

Figure 7:
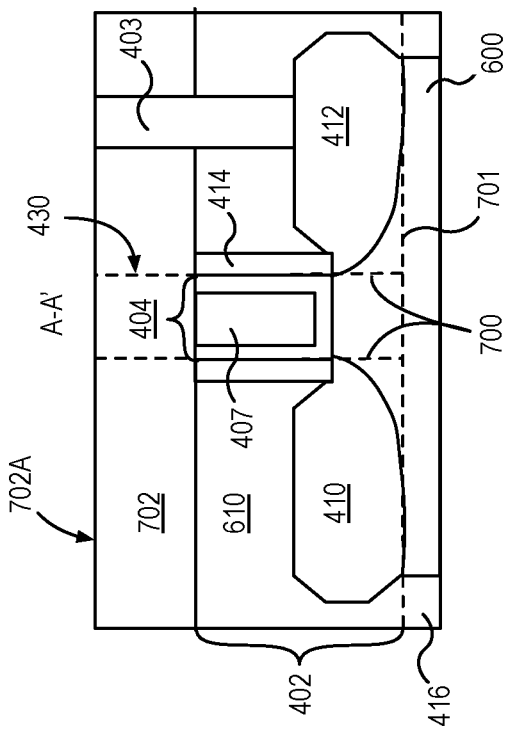
FIG. 7 is a cross-sectional illustration of the structure in FIG. 6F through a line A-A' following the process to form a via electrode on a drain structure.

FIG. 7 is a cross-sectional illustration of transistor 402, in accordance with an embodiment of the present disclosure. The cross-sectional illustration depicts the structure in FIG. 6F, through line A-A', following the process to form drain contact 403 on drain structure 412. Gate contact 430 and a source contact (not shown) may be formed on the source structure 410 and on the gate structure 404, respectively, and are components of transistor 402. Transistor 402 generally may be an NMOS or a PMOS transistor.

The cross-sectional illustration depicts a portion of gate electrode 407 above fin 600. Dashed lines 700 denote extensions of gate electrode 407 on dielectric 416 (below dashed line 701). In the illustrative embodiment, dielectric 702 is blanket deposited on dielectric 610, on spacer 414 and on gate structure 404. In an embodiment, dielectric 702 includes a material that is the same or substantially the same as the material of dielectric 610. Dielectric 702 may be deposited by a PECVD or a CVD process.

A mask may be formed on dielectric 702, and an opening may be formed in dielectric 702 and in dielectric 610 to expose drain structure 412. A conductive fill material can be deposited into the opening and removed via planarization from uppermost surface 702A to fabricate drain contact 403.

In an embodiment, gate contact 430 (indicated by dashed lines) can be formed on gate structure 404. In some embodiments, gate contact 430 can be formed by etching dielectric 702 and depositing materials that are the same or substantially the same as the material of drain contact 403.

Figure 8A:
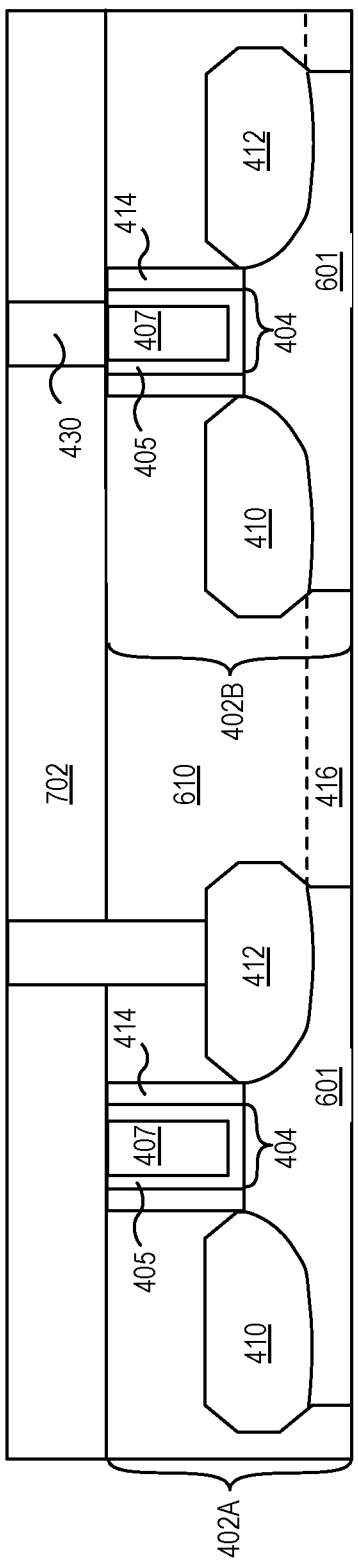
FIG. 8A is a cross-sectional illustration of a pair of transistors such as the transistor depicted in FIG. 7, in accordance with an embodiment of the present disclosure.

While fabrication of a single transistor has been described and illustrated, a plurality of transistors is co-fabricated on substrate 601, such as is illustrated in FIG. 8A.

FIG. 8A is a cross-sectional illustration of transistors 402A and 402B formed above common substrate 601, in accordance with an embodiment of the present disclosure. Transistors 402A and 402B include properties of transistor 402 described above (in association with FIG. 7). In the illustrative embodiment, transistors 402A and 402B are adjacent to each other and separated by dielectrics 416 and 610.

After fabrication of transistors 402A and 402B, and deposition of dielectric 702, gate contact 430 is fabricated on gate electrode 407 of transistor 402. Gate contact may be fabricated by a process that is similar to the process utilized to fabricate drain contact 403 described above (in association with FIG. 7). In an embodiment, a mask is formed on dielectric 702 and an opening is etched in dielectric 702 above gate electrode 407. Material for fabrication of gate contact is deposited into the opening, on gate electrode 407 and on dielectric 702. Excess gate contact material is then removed from above dielectric 702 by a planarization process such as CMP.

Figure 8B:
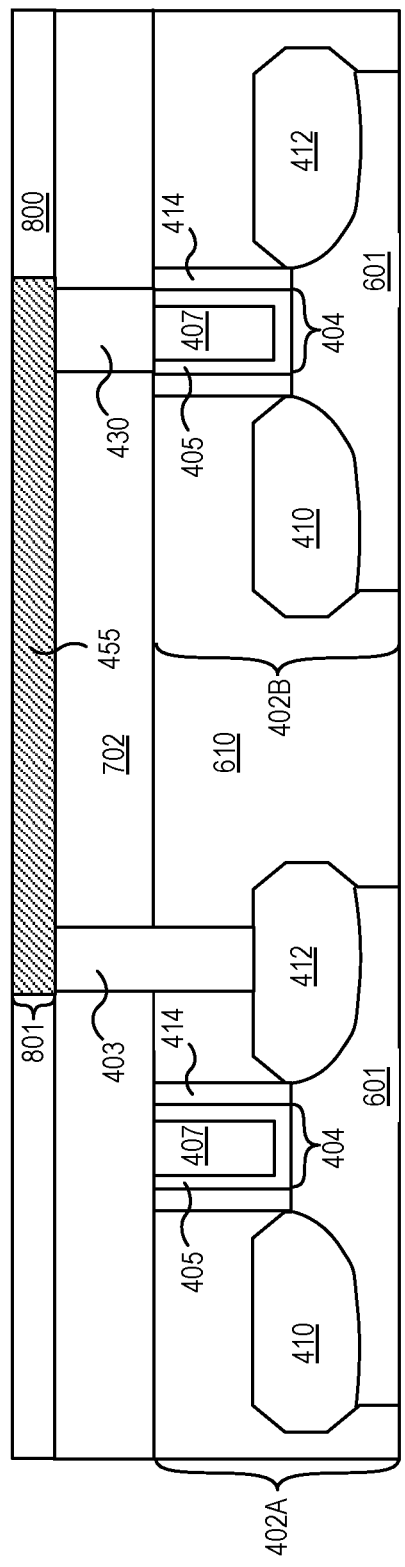
FIG. 8B is a cross-sectional illustration of the structure in FIG. 8A following the process to form a bridge structure on a pair of contact structures, in accordance with an embodiment of the present disclosure.

FIG. 8B is a cross-sectional illustration of the structure in FIG. 8A following the process to form bridge structure 455 above transistors 402A and 402B, in accordance with an embodiment of the present disclosure. In an embodiment, dielectric 800 is blanket deposited on dielectric 702 and on gate contact 430 and drain contact 403. In some embodiments, dielectric 800 includes a material that is the same or substantially the same as the material of dielectric 702.

In an embodiment, a mask is formed on dielectric 800 and an opening 801 is etched in dielectric 800. In the illustrative embodiment, the opening in dielectric 800 extends above gate contact 430 and drain contact 403 and exposes dielectric 702. Conductive material for fabrication of a bridge structure is deposited into opening 801, on gate contact 430, drain contact 403, on dielectric 702, and on sidewalls and upper surfaces of dielectric 800. Bridge structure 455 is fabricated by performing a planarization process, such as CMP. In the illustrative embodiment, the CMP process removes excess conductive material from above dielectric 800. In an embodiment, the conductive material includes a material that is the same or substantially the same as the material of gate contact 430 and/or drain contact 403.

As shown, bridge structure 455 extends partially above transistors 402A and 402B, including over source structure 410 of transistor 402B. In some such embodiments, a source contact is fabricated prior to fabrication of bridge structure 455.

Figure 8C:
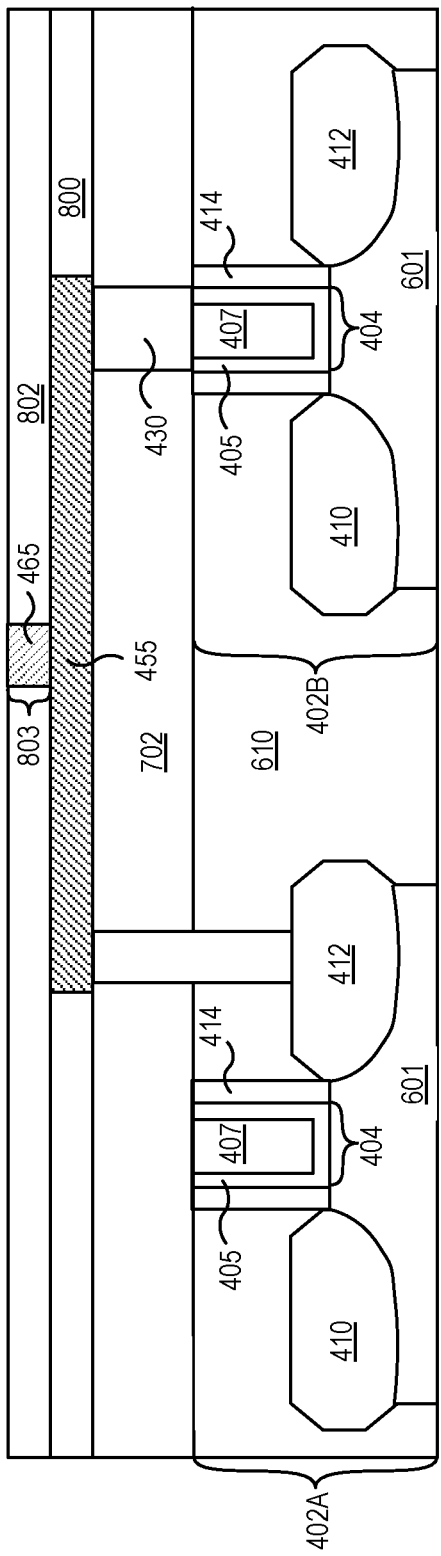
FIG. 8C is a cross-sectional illustration of the structure in FIG. 8B following the process to form a via electrode on the bridge structure.

FIG. 8C is a cross-sectional illustration of the structure in FIG. 8B following the process to form via electrode 465 on bridge structure 455. In an embodiment, dielectric 802 is blanket deposited on dielectric 800 and bridge structure 455. In some embodiments, dielectric 802 includes a material that is the same or substantially the same as the material of dielectric 702.

In an embodiment, a mask is formed on dielectric 802 and an opening 803 is etched in dielectric 802. In the illustrative embodiment, opening 803 extends partially above bridge structure 455. An actual location of opening 803 on bridge structure 455 depends on a relative position of a conductive interconnect to be fabricated on a level above via electrode 465.

A conductive material for fabrication of via electrode 465 is deposited into opening 803, on bridge structure 455. Via electrode 465 is formed by performing a planarization process, such as CMP. In the illustrative embodiment, the CMP process removes excess conductive material from above dielectric 802. In an embodiment, the conductive material includes a material that is the same or substantially the same as the material of gate contact 430 and/or drain contact 403, or bridge structure 455.

Figure 8D:
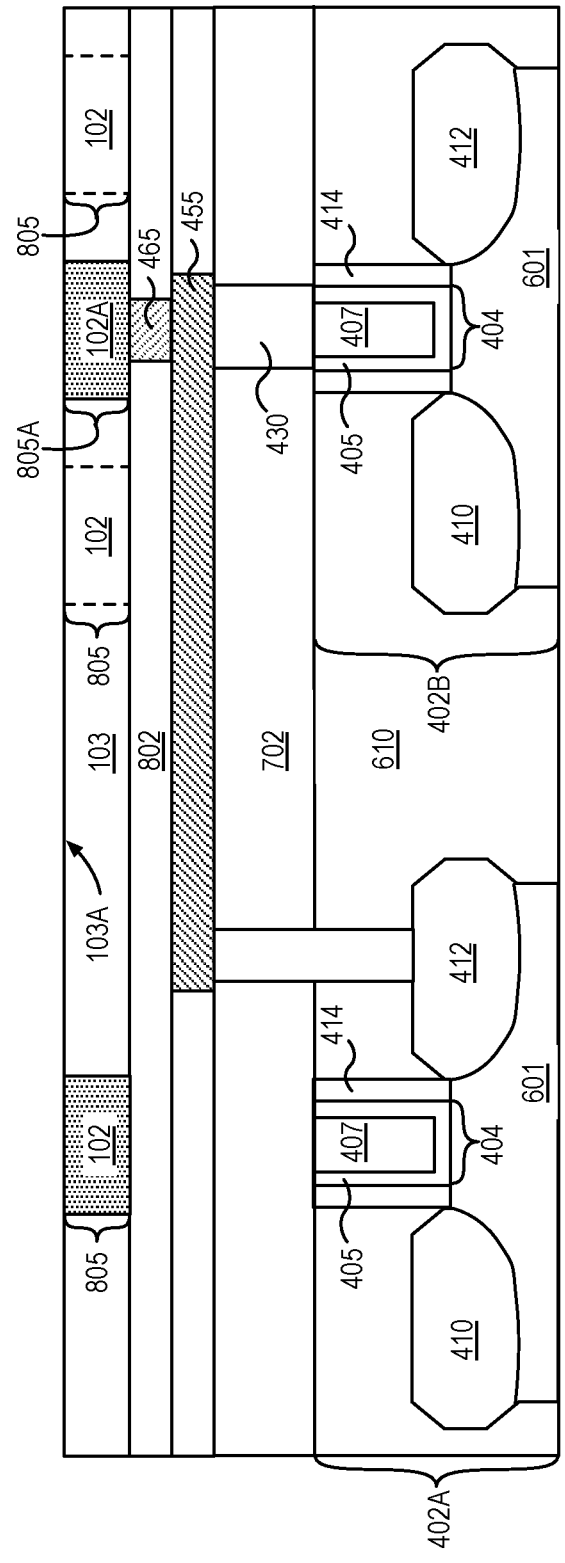
FIG. 8D is a cross-sectional illustration of the structure in FIG. 8C following the process to form a conductive interconnect on the via electrode.

FIG. 8D is a cross-sectional illustration of the structure in FIG. 8C following the process to form a conductive interconnect on via electrode 465. In the illustrative embodiment, a plurality of conductive interconnects 102 may be formed at the same time. The number of conductive interconnects 102 may depend on routing required as well on density requirements for patterning and planarization. Not all conductive interconnects 102 may be electrically coupled to circuit elements. In the illustrative embodiment, conductive interconnect 102A is on and coupled with bridge structure 455.

In an embodiment, dielectric 103 is blanket deposited on dielectric 802 and on via electrode 465.

In an embodiment, a mask is formed on dielectric 103 and openings 805 are etched in dielectric 103. In the illustrative embodiment, opening 805A exposes via electrode 465.

A conductive material for fabrication of plurality of conductive interconnects 102 is deposited into openings 805, on via electrode 465 and on dielectric 103. The conductive material is removed from uppermost surface 103A by a planarization process. The CMP process removes excess conductive material from above dielectric 103.

FIG. 8E is a cross-sectional illustration of the structure in FIG. 8D following the process to form electrode structure 112 on conductive interconnect 102, in accordance with an embodiment of the present disclosure.

In the illustrative embodiment, etch stop layer 113 is blanket deposited on uppermost surface 103A and on the plurality of conductive interconnects 102. Etch stop layer 113 may be deposited by a CVD, a PVD, or a PECVD process. Etch stop layer 113 may be targeted to a thickness to provide capacitance shielding between a plate electrode to be formed above a plurality of conductive interconnects 102. Etch stop layer 113 may be targeted to a thickness to also provide adequate etch margin while patterning to form an electrode structure.

The process of forming an electrode structure 112 within portion 807 is described below.

FIG. 9A is a cross-sectional illustration of portion 807 of the structure in FIG. 8E, following the process to etch opening 902 in etch stop layer 113 to form an electrode structure. In an embodiment, photoresist mask 903 is formed by a lithographic process on etch stop layer 113. Exposed portions of etch stop layer 113 may be etched by a plasma etch process through an opening in photoresist mask 903. In the illustrative embodiment, opening 902 has a lateral thickness $W_O$. $W_O$ may be narrower, equal to, or wider than $W_{CI}$. In the illustrative embodiment, $W_O$ is greater than $W_{CI}$.

The shape of openings 902 may be circular or rectangular, and the conductive interconnects may be discrete islands or a line straddling the drain structure, depending on embodiments. FIGS. 9B-9C illustrates embodiments of structures 910 and 920, respectively, of conductive interconnect 102, and opening 902 within portion 807 in FIG. 9A. Photoresist mask 903 is removed for clarity.

FIG. 9B is an isometric illustration of structure 910, in accordance with an embodiment of the present disclosure. A cross section through opening 902 is illustrated. In the illustrative embodiment, conductive interconnect 102 is cylindrical, where $W_{CI}$ is less than $W_O$, (for example, in diameter) of opening 902. As shown, opening 902 is circular and $W_O$ may be, for example, a diameter of opening 902. In other embodiments, opening 902 can be rectangular. Dielectric 103 is exposed during formation of opening 902 when $W_{CI}$ is less than $W_O$, as shown. In the illustrative embodiment, uppermost surface 102C of conductive interconnect 102 is co-planar or substantially co-planar with uppermost surface 103A of dielectric 103.

In some embodiments, opening 902 may be offset relative to interconnect 102, as is illustrated in structure 920. Such an offset may be a result of misalignment between photoresist mask 903 and interconnect 102. The method adopted to fabricate an electrode structure within opening 902 is not impacted by misalignment as long as at least 50% of opening 902 exposes uppermost surface 102C of interconnect 102. Misalignment does not enable hydrogen to diffuse through to a memory device (to be fabricated in a downstream operation). While a single conductive interconnect 102 is shown, other conductive interconnects may be fabricated at the same time.

FIG. 9C is an isometric illustration of structure 920, in accordance with an embodiment of the present disclosure. In some embodiments, opening 902 may be offset relative to interconnect 102, as is illustrated. Such an offset may be a result of misalignment between photoresist mask 903 and interconnect 102. The method adopted to fabricate an electrode structure within opening 902 is not impacted by misalignment as long as at least 50% of opening 902 exposes uppermost surface 102C of interconnect 102. Misalignment does not enable hydrogen to diffuse through to a memory device (to be fabricated in a downstream operation) provided an electrode structure, to be fabricated in opening 902, includes a conductive hydrogen barrier.

FIG. 10A-10B are cross-sectional illustrations depicting a method to fabricate an electrode structure having a conductive hydrogen barrier above a fill metal.

FIG. 10A is a cross-sectional illustration of the structure in FIG. 9A following the formation of conductive fill material within opening 902, in accordance with an embodiment of the present disclosure. In an embodiment, conductive fill material 1000 is blanket deposited into opening 902, and on etch stop layer 113. In embodiments, conductive fill material 1000 includes a material that is the same or substantially the same as the material of the conductive fill material 115 described in association with FIG. 1A.

FIG. 10B is a cross-sectional illustration of the structure in FIG. 10A following the process to form conductive fill material 1000 within a portion of opening 902 on etch stop layer 113. In an embodiment, portions of conductive fill material 1000 on uppermost surface 113A of etch stop layer 113 are removed by a planarization process leaving conductive fill material 1000 within opening 902. In an embodiment, a wet chemical process is utilized to recess conductive fill material 1000 below uppermost surface 113A. In an embodiment, level of recess of conductive fill material 1000 relative to uppermost surface 113A will depend on $T_L$ and on a desired thickness of the conductive hydrogen barrier to be formed. In some embodiments, conductive fill material 1000 is recessed relative to uppermost surface 113A by up to half of $T_L$. In some embodiments, uppermost surface 1000A of conductive fill material 1000 is concaved due to wet chemical recess as indicated by dashed lines 1001.

FIG. 10C is a cross-sectional illustration of the structure in FIG. 10B following the process to form conductive hydrogen barrier 1010 on conductive fill material 1000. In an embodiment, a conductive hydrogen barrier layer is blanket deposited on conductive fill material 1000 and on etch stop layer 113. A planarization process may be utilized to remove an excess conductive hydrogen barrier material layer from above etch stop layer 113. In an embodiment, the planarization process includes a chemical mechanical polish (CMP) process. The CMP process forms conductive hydrogen barrier 1010 within opening 902.

In the illustrative embodiment, electrode structure 112 includes conductive hydrogen barrier 1010 above conductive fill material 1000, where conductive hydrogen barrier 1010 prevents hydrogen from diffusing towards a memory device to be formed above. Depending on embodiments, electrode structure 112 has a width that can be greater than or less than a width of a memory device to be formed on electrode structure 112. In either embodiment, conductive hydrogen barrier 1010 can effectively prevent hydrogen from diffusing towards the memory device. In embodiments, conductive hydrogen barrier 1010 includes a material that is the same or substantially the same as the material of conductive hydrogen barrier 114 described in association with FIG. 1A.

FIG. 11A is a cross-sectional illustration of the structure in FIG. 9A following the process to deposit one or more electrode materials on conductive interconnect 102 and on etch stop layer 113. In an embodiment, a layer of conductive hydrogen barrier material 1100 is deposited in opening 902, on sidewalls of etch stop layer 113, and on conductive interconnect 102. In the illustrative embodiment, layer of conductive hydrogen barrier material 1100 is also deposited on exposed portions of dielectric 103. In embodiments, layer of conductive hydrogen barrier material 1100 includes a material that is the same or substantially the same as the material of the conductive hydrogen barrier 114 described in association with FIG. 1A.

FIG. 11B is a cross-sectional illustration of the structure in FIG. 11A following the deposition of a fill material in the remaining portions of opening 902 and on layer of conductive hydrogen barrier material 1100. Conductive fill material 1102 is deposited on layer of conductive hydrogen barrier material 1100. In embodiments conductive fill material 1102 includes tantalum, titanium, ruthenium, or tungsten, and may be deposited by a PVD, a PECVD, or an ALD process. In some embodiments, conductive fill material 1102 includes copper and may be deposited by an electroplating process.

FIG. 11C is a cross-sectional illustration of the structure in FIG. 11B following the process to planarize conductive fill material 1102 and layer of conductive hydrogen barrier material 1100. In an embodiment, the planarization process includes a chemical mechanical planarization (CMP) process. The CMP process removes conductive fill material 1102 and layer of conductive hydrogen barrier material 1100 from uppermost surface 113A of etch stop layer 113. The planarization process forms electrode structure 1104 having layer of conductive hydrogen barrier material 1100 and conductive fill material 1102. In an exemplary embodiment, layer of conductive hydrogen barrier material 1100 includes a material that is the same or substantially the same as the material of conductive hydrogen barrier 1010. In an exemplary embodiment, conductive fill material 1102 includes a material that is the same or substantially the same as the material of conductive fill material 1000 described in association with FIG. 10A.

It is to be appreciated that while electrode structure 1104 has width $W_{ES}$ that is less than $W_{CI}$, in other embodiments, an electrode structure having $W_{ES}$ that is greater than $W_{CI}$, can be fabricated by the same methodology described above.

FIG. 12A is a cross-sectional illustration of structure 1200. In the illustrative embodiment, structure 1200 is the structure in FIG. 8E following the process to deposit electrode layer 1202 on etch stop layer 113 and on electrode structure 112. In an embodiment, electrode layer 1202 is blanket deposited. In an embodiment, electrode layer 1202 includes a material that is the same or substantially the same as the material of plate electrode 110 described in association with FIG. 1A. Referring again to FIG. 12A, in some embodiments, electrode layer 1202 includes a conductive hydrogen barrier material. Examples of conductive hydrogen barrier material are the same or substantially the same as the material of conductive hydrogen barrier 114. In some embodiments, the blanket deposition process may utilize a physical vapor deposition, chemical vapor deposition, or an atomic layer deposition process.

Transistors and gate contact are not shown for clarity.

The deposition process is continued with fabrication of a material layer stack 1203 on electrode layer 1202. The process to form material layer stack 1203 includes blanket deposition of at least three material layers, where the number further depends on a type of memory device to be fabricated. In some embodiments, material layer stack 1203 includes deposition of layers for a ferroelectric memory device. In other embodiments, material layer stack 1203 includes deposition of layers for a paraelectric memory device.

In an embodiment, individual layers of material layer stack 1203 (for a ferroelectric memory device) are deposited in situ, i.e., without breaking vacuum. Material layer stack 1203 may be deposited by an ALD, a PECVD, a CVD, a PVD process, or a combination thereof. In embodiments, the ALD process may be performed at a process temperature between 160° C. and 400° C., the PVD process may be performed at a process temperature between 23° C. (room temperature) and 400° C., and the CVD process may be performed at a process temperature between 160° C. and 400° C.

In some embodiments, conductive layer 1204 is blanket deposited on electrode structure 112 and on etch stop layer 113. In an embodiment, conductive layer 1204 includes a conductive ferroelectric oxide. The conductive ferroelectric oxide includes one of a non-Pb perovskite metal oxides, such as but not limited to, La—Sr—$CoO_3$, $SrRuO_3$, La—Sr—$MnO_3$, $YBa_2Cu_3O_7$, $Bi2Sr_2CaCu_2O_8$, or $LaNiO_3$.

Conductive layer 1204 is deposited to thickness $T_1$ that is suitable for minimizing electrical resistance and to minimize tapering of sidewalls during a patterning process that will be utilized to fabricate memory devices. In some embodiments, conductive layer 1204 has a thickness that is between 3 nm and 30 nm. A thickness of less than 30 nm is highly desirable to prevent significant tapering in sidewalls during the patterning process.

In an embodiment, the deposition process is continued by deposition of dielectric layer 1205 (for example, ferroelectric dielectric layer 1205 for a ferroelectric memory device). Dielectric layer 1205 may be blanket deposited on conductive layer 1204. Dielectric layer 1205 has thickness $T_2$ that is between 1 nm and 30 nm. In some embodiments, dielectric layer 1205 includes non-Pb perovskite material in the form $ABO_3$, where A and B are two cations of different sizes and O is oxygen. A is generally larger than B in size. In some embodiments, non-Pb perovskites can also be doped, e.g., by La or lanthanides. The non-Pb perovskite material can include one or more of La, Sr, Co, Cr, K, Nb, Na, Sr, Ru, Y, Fe, Ba, Hf, Zr, Cu, Ta, Bi, Ca, Ti, and Ni.

In other embodiments, dielectric layer 1205 includes a low voltage ferroelectric material sandwiched between conductive layer 1204 and conductive layer 1206. Low voltage materials can be of the form $AA'BB'O_3$, where A' is a dopant for atomic site A and can be an element from the lanthanides series and B' is a dopant for atomic site B and can be an element from the transition metal elements such as Sc, Ti, V, Cr, Mn, Fe, Co, Ni, Cu, or Zn. A' may have the same valency as site A, with a different ferroelectric polarizability. A voltage below 3 Volts is sufficiently low to be characterized as low voltage.

The deposition process is continued with a deposition of conductive layer 1206 on dielectric layer 1205. In an exemplary embodiment, conductive layer 1206 includes a material that is the same or substantially the same as the material of conductive layer 1204. In embodiments, where conductive layer 1204 and conductive layer 1206 include a same material, material layer stack 1203 can be symmetric. In different embodiments, conductive layer 1206 can have a different thickness than conductive layer 1204. In embodiments, conductive layer 1206 is deposited to a thickness $T_3$ between 3 nm and 30 nm. Conductive layer 1206 between 3 nm and 30 nm can facilitate the patterning process.

In various embodiments, the as-deposited grain size of conductive layers 1204 and 1206 and in dielectric layer 1205 is less than 15 nm. Grain size refers to the average length of a longest dimension of a grain within conductive layers 1204 and 1206. In various embodiments, point defects in conductive layers 1204 and 1206, that are deposited but not annealed, are greater than 1e22 atoms/cm$^3$.

In some embodiments, such as is indicated, the deposition process concludes with the formation of capping layer 1207 on conductive layer 1206. In some embodiments, capping layer 1207 is blanket deposited by a PECVD, a CVD, or a PVD process. In an embodiment, capping layer 1207 includes a material that has a favorable etch selectivity compared to the ferroelectric materials in material layer stack 1203. In other embodiments, capping layer 1207 includes a conductive material that is different from the conductive material of the ferroelectric material. In a different embodiment, capping layer 1207 includes a bilayer where the bilayer includes a metallic layer and a dielectric on the metallic layer. In some such embodiments, the dielectric can be patterned with high fidelity and includes for example, $SiO_2$, $Si_3N_4$, DLC (Diamond Like Carbon), or $Al_2O_3$.

In an embodiment, dielectric layer 1205 includes paraelectric materials. Paraelectric materials may include SrTiO3, Ba(x)Sr(y)TiO3 (where x is −0.05, and y is 0.95), HfZrO2, Hf—Si—O, La-substituted PbTiO3, or a PMN-PT based relaxor ferroelectric. In some embodiments, material layer stack including paraelectric materials can range from 5 nm to 100 nm in total thickness. In various embodiments, point defects in dielectric layer 1205, that is as-deposited but not annealed, is greater than 1e22 atoms/cm$^3$.

In some embodiments, a post deposition anneal process is formed after deposition of material layer stack 1203. A post deposition anneal may be characterized by an anneal after the deposition process, in contrast to an in-situ anneal which takes place during deposition. Depending on embodiments the anneal can take place after deposition of all the layers in material layer stack 1203, or at least after the dielectric layer has been deposited. In the illustrative embodiment, a PDA is performed after deposition of material layer stack 1203.

In various embodiments, the anneal temperatures can be as high as 1300° C., where anneal durations are limited to less than or equal to 60 seconds. The specific temperature, and time duration are dependent on the annealing technique utilized and a maximum thermal budget that is not impactful to transistors 402A and 402B (not shown). Specifically annealing material layer stack 1203 is performed in a manner to suitably prevent metallurgical reaction between gate dielectric layer 405 and gate electrode 407.

It is to be appreciated that while materials of gate electrode 407 have been deposited at temperatures less than 400° C., atomic diffusion in the vicinity of the gate dielectric layer 405 and gate electrode 407 may not occur when PDA is carried out for short time durations. Temperatures of 700° C. and less, and time durations of 60 seconds or less, for example, may be considered to be a short time duration.

In an embodiment, PDA anneal at temperatures less than or equal to 1300° C. has an effect of increasing grain size due to coalescence of smaller grain sizes. The net growth in grain size can be a function of the as-deposited thickness. In some embodiments, when the deposited thickness of layers in material layer stack 1203 are less than 30 nm thick, the PDA at temperatures less than 1300° C. is found to increase grain size to a peak value of approximately 50 nm. It is to be appreciated that the grain size refers to the average length of a grain. PDA does not increase thickness of the as-deposited layers.

In some embodiments, post deposition anneal can include an RTP/RTA process that can be performed at temperatures above 1000° C. However, since the duration of anneal is on the order of a minimum of a few seconds, it is preferable to use RTP/RTA for annealing to temperatures below 800° C. to avoid damage to underlying structures such as transistor 402.

In some embodiments PDA includes a flash anneal process. Flash and laser annealing offer extremely short durations, and thus can allow high temperatures above 1000° C. without damaging the underlying structures, e.g., transistors, on the wafer. Flash and laser anneal can include spot heating or beam rastering for increased throughput. Processing pressures range from 1 Torr to 760 Torr while flowing in $O_2$, $N_2$, Argon gases, or in air. In other embodiments, flash anneal processes are carried out in vacuum at pressures less than 1 Torr. In various embodiments, processing temperatures range from 500° C. to 1300° C., where the heating and cooling rate is approximately $10^6$ degrees C./s. In some embodiments, processing time is 1 ms or less.

In various embodiments, point defects in dielectric layer 1205, conductive layers 1204 and 1206, post anneal, have a defect density of less than 1e20 atoms/cm$^3$.

After an anneal process, mask 1209 may be formed on capping layer 1207. In an embodiment, mask 1209 is formed by a lithographic process on capping layer 1207. Mask 1209 defines $W_{MD}$ of memory devices to be patterned.

FIG. 12B is a cross-sectional illustration of the structure in FIG. 12A following the process to etch material layer stack (and in some embodiments, capping layer) to form plurality of memory devices 108. In an embodiment, material layer stack is etched by a plasma etch process. The plasma etch process may include a discharge produced by a magnetic enhanced reactive ion etching mechanism, an electron cyclotron resonance discharge or an inductively coupled plasma discharge. The plasma parameters may be characterized by a range of plasma densities such as between 1e9 and 1e12 ions/cm$^3$, pressures in the range of 0.001-10 Torr, and electron temperatures in the range of 1-8 eV. Ions may be accelerated to the surface from a plasma sheath by means of electrostatic chuck with biasing capabilities that are independent of the power delivered, to sustain various plasma configurations.

In an embodiment, the plasma etch process is utilized to etch conductive layer 1206 to form top electrode 132, etch dielectric layer 1205 to form dielectric layer 130, conductive layer 1204 to form bottom electrode 128 of individual memory devices 108A-108D. In some embodiments, capping layer 1207 is etched into cap 133 (dashed lines). When cap 133 includes a dielectric material, cap 133 may be removed during the plasma etch process as indicated by dashed lines.

In an embodiment, the process utilized to etch conductive layer to form bottom electrode 128 may be substantially the same as the etch process utilized to form top electrode 132. In the illustrative embodiment, sidewalls 1211 of memory device 108 are substantially vertical with respect to uppermost surface 110A.

It is to be appreciated that the process of etching to form bottom electrode 128 exposes electrode layer 1202. An over etch may be required to etch the material of bottom electrode 128 completely from above electrode layer 1202. Some portions of electrode layer 1202 may become etched due to local non-uniformity in the etching process. In some embodiments regions between and immediately adjacent to memory devices 108 may become recessed as indicated by dashed lines 1213.

FIG. 13A is a cross-sectional illustration of the structure in FIG. 12D following the process to deposit encapsulation layer 116 on the plurality of memory devices 108, and on electrode layer 1202.

The process utilized to deposit encapsulation layer 116 depends on the material utilized, on the height of memory devices 108A-108D, and on the relative spacing between adjacent memory devices 108. In exemplary embodiments, the deposition process utilized to deposit encapsulation layer 116 does not include hydrogen or ammonia containing chemicals to prevent hydrogen exposure to layers within memory devices 108A-108D. Depending on a deposition process some materials can be deposited by either a non-hydrogen or ammonia containing chemicals. However, each deposition process can have different deposition rates and deposition conformality. In general, a combination of ALD, PVD, and CVD processes may be utilized depending on spacing $S_M$ between adjacent memory devices 108A and 108B, or between memory devices 108C and 108D.

In the illustrative embodiment, encapsulation layer 116 is blanket deposited.

In an embodiment, encapsulation layer 116 includes a metal containing insulator material. Some examples of the insulator material includes a metal and oxygen, such as, but not limited to, $Al_xO_y$, $HfO_x$, $AlSiO_x$, $ZrO_x$, or $TiO_x$. In some embodiments, encapsulation layer 116 can include a metal and nitrogen such as, but not limited to, AlN, ZrN, and HfN. In other embodiments, encapsulation layer 116 can include a metal, and both Si and O, such as AlSiOx, HfSiOx, and TaSiOx.

Materials such as $Al_xO_y$, $HfO_x$, $AlSiO_x$, $ZrO_x$, or $TiO_x$ can be deposited without a hydrogen or ammonia containing chemical precursor in an ALD process. In some embodiments, encapsulation layer 116 can be deposited by an ALD process to a thickness in the range of 0.5 nm to 10 nm. In some embodiments, encapsulation layer 116 may be deposited to a thickness of less than 5 nm. An ALD process can provide a substantially conformal thickness on sidewalls 1081 and on uppermost surface 108J, as shown.

In other embodiments a physical vapor deposition (PVD) process may be utilized. In some such embodiments, encapsulation layer 116 can include an insulative metal containing material. For example, encapsulation layer 116 can include a metal and nitrogen such as, but not limited to, AlN, ZrN, and HfN, or compounds of a metal, and both Si and O, such as AlSiOx, HfSiOx, and TaSiOx.

In other embodiments, encapsulation layer 116 includes a nonmetallic element such as silicon, and one or more of nitrogen or carbon. In one such embodiment, encapsulation layer 116 can be deposited by a PVD, a CVD, or an ALD process. In some embodiments, a PVD process may be utilized to form a thin layer of encapsulation layer 116 to avoid exposure of memory devices 108 to hydrogen or ammonia, followed by an ALD process to deposit the same material to provide substantial conformality on sidewalls 1081. In some such embodiments, encapsulation layer 116 is deposited to a thickness of at least 2 nm. A thickness of approximately 2 nm may be sufficient to prevent hydrogen diffusion through encapsulation layer 116 that is deposited with a material density of at least 90%.

A PVD process may not provide a substantially conformal deposition. In some such embodiments, encapsulation layer 116 is not deposited with a uniform thickness $T_{EC}$ and portions of encapsulation layer 116 adjacent to uppermost surface of memory device 108 are wider (illustrated by dashed lines 1301) than portions adjacent to lowermost surface of memory device 108.

In some embodiments, $S_M$ is approximately equal to two times $T_{EC}$, as shown in FIG. 13B. In some such embodiments, encapsulation layer 116 formed on sidewalls 1081 of two adjacent memory devices, such as memory devices 108A and 108B, can merge. In the illustrative embodiment, sidewalls 1081 face each other and the encapsulation layer 116 formed on sidewalls 1081 are substantially conformal with sidewalls 1081 and the merged portion includes no defects or voids. An ALD deposition process may be used.

In some embodiments, $S_M$ is between two and four times $T_{EC}$.

In other embodiments, when a PVD process is utilized, a non-conformal deposition on sidewalls 1081 can result in keyhole artifact 1303, as illustrated in FIG. 13C. As shown, keyhole artifact 1303 may be formed between merged portions of encapsulation layer 116. In other embodiments, a combination of ALD deposition and PVD deposition processes can also produce keyhole artifact 1303 depending on relative thickness of encapsulation layer 116 deposited by each process.

FIG. 14A is a cross-sectional illustration of the structure in FIG. 13A following the process to form a mask to define a shape and size of a plate electrode to be formed. In an embodiment, mask 1400 is formed on encapsulation layer 116. Mask 1400 may include material such as photoresist that has been patterned lithographically. Mask 1400 has a shape that defines a plan view shape and size of plate electrode 110 to be formed. Mask 1400 has a lateral thickness WM that can be chosen to cover two or more memory devices. In the illustrative embodiment, mask 1400 covers four memory devices 108A-108D in the plane of the illustration. In general, mask 1400 extends in the y-direction and can cover one or more rows of memory device.

FIG. 14B is a cross-sectional illustration of the structure in FIG. 13A following the process to etch encapsulation layer 116 and plate electrode 110.

In the illustrative embodiment, mask 1400 is utilized to pattern encapsulation layer 116, and electrode layer 1202, and form plate electrode 110. A plasma etch process may be utilized to pattern electrode layer 1202 and encapsulation layer 116. It is desirable for the plasma etch process to be selective to etch stop layer 113 to avoid exposure of conductive interconnects below etch stop layer 113. Preventing exposure of conductive interconnect below etch stop layer 113 is highly desirable when conductive interconnects include copper, and etchants utilized to form plate electrode 110 include halogen chemistry.

In an embodiment, the plasma etch process may be part of two operation processes, where a first operation, including a first chemistry, that is selective to mask 1400 and electrode layer 1202, is utilized to etch encapsulation layer 116. After etching encapsulation layer 116, mask 1400 may be removed and encapsulation layer 116 may be used as a mask to etch electrode layer 1202. A second chemistry that is selective to encapsulation layer 116 may be utilized to etch electrode layer. Etching of the electrode layer forms plate electrode 110. The plasma etch process can form plate electrode 110 with sidewalls 110B that are substantially vertical. In some examples, sidewalls 110B can be tapered relative to uppermost surface 113A.

In some embodiments, mask 1400 is not removed and the second operation continues with mask 1400 in place. In some such embodiments, mask 1400 can be consumed during the etch process or be removed after forming plate electrode 110.

FIG. 15A is a cross-sectional illustration of the structure in FIG. 14B following the process to form openings 1500 in dielectric 126 and encapsulation layer 116 to form via electrodes. In the illustrative embodiment, dielectric 126 is blanket deposited on encapsulation layer 116, and on etch stop layer 113. In an embodiment, the blanket deposition process may be performed by a PECVD or a CVD process.

A planarization process may be performed to planarize dielectric 126. In an embodiment, the planarization process includes a chemical mechanical planarization process. The CMP process may form an uppermost surface 126A that is substantially planar.

Mask 1501 is formed on dielectric 126. In an embodiment, mask 1501 includes a photoresist material and may be lithographically patterned.

Openings 1500 may be formed by a plasma etch process that etches dielectric 126 but is selective to encapsulation layer 116. A selective etch process may be desirable when the width of opening 1500 is comparable to, or greater than a width of respective memory devices 108A-108D. Any potential issues arising from misalignment between the location of opening 1500 in mask 1501 and memory devices 108A, 108B, 108C, and 108D can be reduced when the plasma etch utilized to etch dielectric 126 is selective to encapsulation layer 116. In some embodiments, openings 1500 can have a width between 20 nm-100 nm.

After etching dielectric 126, the plasma etch process is continued to etch a portion of encapsulation layer 116. The etch process exposes uppermost surface 108J of memory devices 108A-108D. Opening 1500 may have sidewalls 1500A that are substantially vertical or flared. In the illustrative embodiment, sidewalls 1500A are substantially vertical. In other examples, sidewalls 1500A may be tapered as indicated by dashed lines 1503.

Height $D_V$ of opening 1500 may be adjusted by tuning height of dielectric 126.

FIG. 15B is a cross-sectional illustration of the structure in FIG. 15A following the process to deposit materials to form via electrodes. In the illustrative embodiment, conductive hydrogen barrier material 1504A is blanket-deposited into openings 1500, on memory devices 108A-108D and on sidewall of dielectric 126 in openings 1500. Conductive hydrogen barrier material 1504A includes a material that is chemically compatible with dielectric 126 so that interface 1517 between conductive hydrogen barrier material 1504A and dielectric 126 is not a source of dislocations.

In an embodiment, liner layer material 1504B is blanket deposited in openings 1500, and on conductive hydrogen barrier material 1504A. A layer of conductive fill material 1504C is deposited into the remaining portions of openings 1500 on liner layer material 1504B.

In embodiments, conductive hydrogen barrier material 1504A, liner layer material 1504B, and layer of conductive fill material 1504C, are deposited by an ALD, a PVD or a sputter deposition process.

Figure 15C:
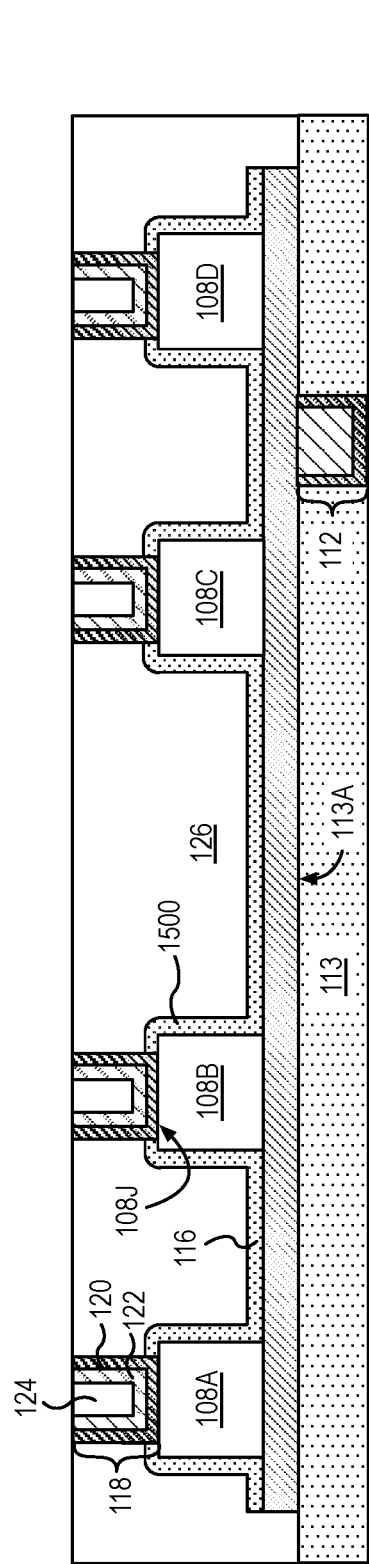
FIG. 15C is a cross-sectional illustration of the structure in FIG. 15 following the process to planarize the conductive materials to form a plurality of via electrodes.

FIG. 15C is a cross-sectional illustration of the structure in FIG. 15B following the process to planarize and form via electrode 118 on respective memory devices 108A-108D.

In an embodiment, the planarization process includes a chemical mechanical planarization (CMP) process. The CMP process removes layer of conductive fill material 1504C, liner layer material 1504B, and conductive hydrogen barrier material 1504A from uppermost surface 126A of dielectric 126. The planarization process isolates conductive hydrogen barrier material 1504A to form conductive hydrogen barrier 120, liner layer material 1504B to form liner layer 122 and the layer of conductive fill material 1504C to form conductive fill material 124. The CMP process may also reduce the as-deposited thickness of dielectric 126.

In some embodiments, plate electrode 110 includes a material that may be susceptible to hydrogen and oxygen diffusion. In some such embodiments, it may be desirable for sidewalls 110B to be encapsulated as shown in the cross-sectional illustration of FIG. 16A.

Figure 16A:
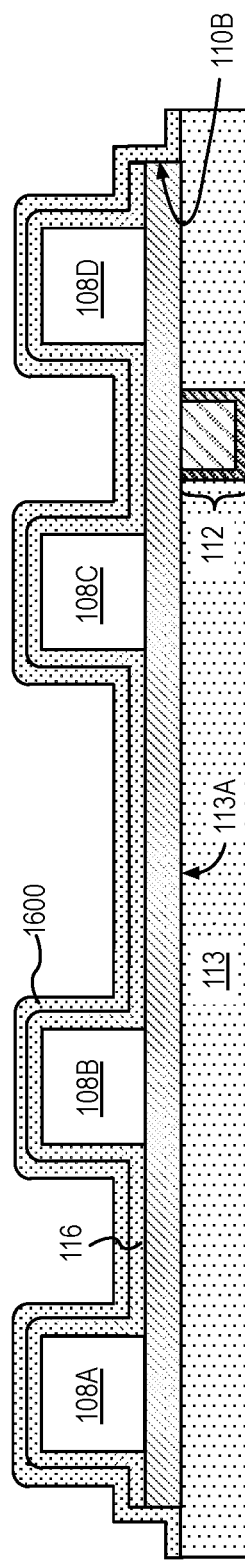
FIG. 16A is a cross-sectional illustration of the structure in FIG. 16B following the process to deposit a second encapsulation layer on a first encapsulation layer, and on exposed portions of etch stop layer in memory and logic regions, in accordance with an embodiment of the present disclosure.

FIG. 16A is a cross-sectional illustration of the structure in FIG. 14B following the process to remove mask and deposit encapsulation layer 1600 on encapsulation layer 116, and on exposed portions of etch stop layer 113, in accordance with an embodiment of the present disclosure.

In an embodiment, encapsulation layer 1600 includes a material that is the same or substantially the same as the material of encapsulation layer 116. In an embodiment, encapsulation layer 1600 includes a nonmetallic element such as silicon and one or more of nitrogen or carbon. Encapsulation layer 1600 may be deposited by a PVD, an ALD, a CVD process, or a combination thereof.

Depositing encapsulation layer 1600 can also encapsulate sidewalls 110B. However, addition of encapsulation layer 1600 above encapsulation layer 116 can require further processing operations to fabricate via electrode within level 106. Encapsulation layer 1600 will need to be etched from above memory devices 108A-108D while forming the via electrodes.

In some embodiments, encapsulation layer 1600 may be etched to form a spacer.

Figure 16B:
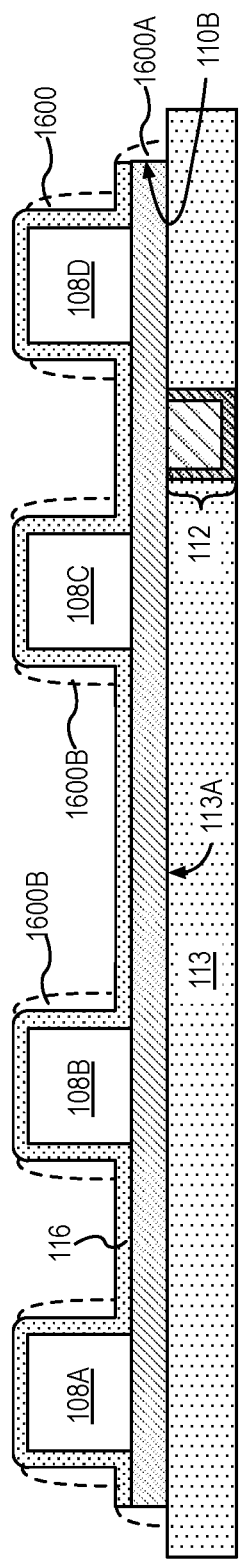
FIG. 16B is a cross-sectional illustration of a portion of the structure in FIG. 15A, following the process to etch the second encapsulation layer and form a spacer adjacent to sidewalls of the first plate electrode, in accordance with an embodiment of the present disclosure.

FIG. 16B is a cross-sectional illustration of the structure in FIG. 16A, following a process to etch encapsulation layer 1600 to form spacers 1600A and 1600B. In some such embodiments, spacer 1600A can be formed adjacent to sidewall 110B, and spacer 1600B can be formed adjacent to encapsulation layer 116 above plate electrode 110, as indicated by dashed lines.

The etch process may be designed to remove encapsulation layer 1600 from above plate electrode 110 while removing encapsulation layer 1600 from above memory devices 108A-108D. However, the etch process forms spacer 1600A adjacent to sidewalls 110B as shown. Formation of spacer 1600A can encapsulate sidewalls 110B as well as obviate the need for etching encapsulation layer 1600 from above memory devices 108A-108D, while a forming via electrode during a downstream process.

FIG. 17A is a cross-sectional illustration of the structure in FIG. 16A following the process to form a plurality of openings in dielectric 126, and in encapsulation layers 1600 and 116, where individual openings 1700 expose a respective memory device 108A-108D. In the illustrative embodiment, dielectric 126 is blanket deposited on encapsulation layer 1600. In an embodiment, the blanket deposition process may be performed by a PECVD, or a CVD process.

A planarization process may be performed to planarize dielectric 126. In an embodiment, the planarization process includes a chemical mechanical planarization process. The CMP process may form an uppermost surface 126A that is substantially planar.

Mask 1701 is formed on dielectric 126. In an embodiment, mask 1701 includes a photo resist material and may be lithographically patterned.

Openings 1700 may be formed by a plasma etch process that etches dielectric 126 but is selective to encapsulation layer 1600. A selective etch process may be desirable when the width of opening 1700 is comparable or greater than a width of respective memory devices 108A-108D. Any potential issues arising from misalignment between the location of opening 1700 in mask 1701 and memory devices 108A-108D can be reduced when the plasma etch utilized to etch dielectric 126 is selective to encapsulation layer 1600. In some embodiments, openings 1700 can have a width between 20 nm and 100 nm.

After etching dielectric 126, the plasma etch process is continued to etch encapsulation layer 1600 and subsequently encapsulation layer 116. The etch process exposes uppermost surface 108J of memory devices 108A-108D. Opening 1700 may have sidewalls 1700A that are substantially vertical or flared. In the illustrative embodiment, sidewalls 1700A are substantially vertical. In other examples, sidewalls 1700A may be tapered as indicated by dashed lines 1703.

Height $D_V$ of opening 1700 may be adjusted by tuning height of dielectric 126.

FIG. 17B is a cross-sectional illustration of the structure in FIG. 17A following the process to deposit conductive materials into the openings and following the process to planarize the conductive materials to form via electrodes 118. The process of deposition and planarization to form via electrodes 118 is substantially the same as the process described in association with FIG. 15B. In the illustrative embodiment, conductive hydrogen barrier 120 is also adjacent to portions of encapsulation layer 1600.

Figure 18A:
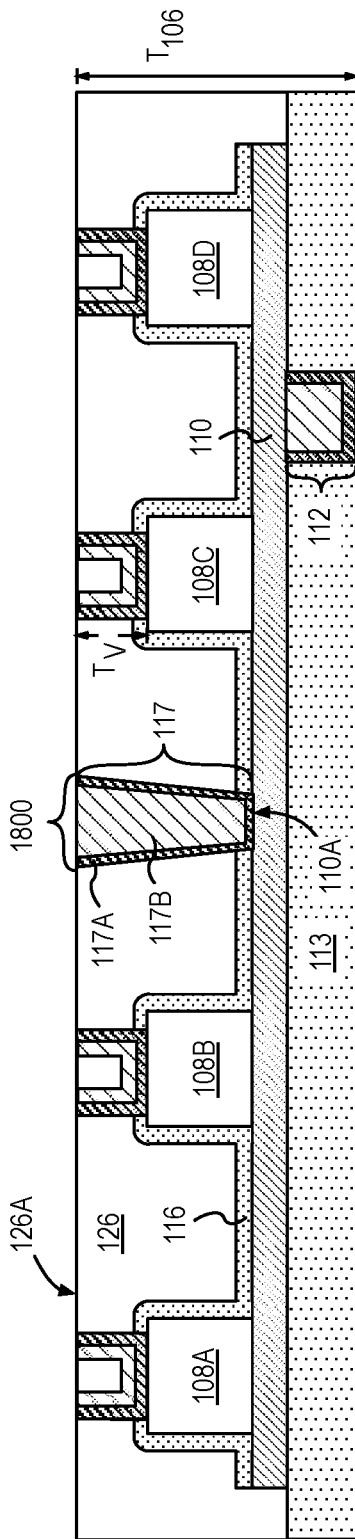
FIG. 18A is a cross-sectional illustration of the structure in FIG. 17A following the process to form a via opening in the dielectric and in the encapsulation layer and following the process to form a first signal electrode on the plate electrode, in accordance with an embodiment of the present disclosure.

FIG. 18A is a cross-sectional illustration of the structure in FIG. 15C following the process to form via electrode 117 on the plate electrode, in accordance with an embodiment of the present disclosure. In an embodiment, via opening 1800 is formed in dielectric 126 and in encapsulation layer 116. Via opening 1800 may be formed by a masking and etching process similar to forming opening 1500 (in FIG. 15A). In the illustrative embodiment, plasma etch process etches an entire height of dielectric 126 before etching encapsulation layer 116. The plasma etch process utilized to form via opening 1800 exposes uppermost surface. Liner layer 117A is deposited into via opening 1800 and on plate electrode 110, on uppermost surface 126A of dielectric 126, and on sidewall portions of encapsulation layer 116. Conductive fill material 117B is subsequently deposited on liner layer 117A in opening 1800 and above dielectric 126.

A planarization process may be performed to planarize and remove liner layer 117A and conductive fill material 117B from above uppermost surface 126A. In an embodiment, the planarization process includes a chemical mechanical planarization process.

Figure 18B:
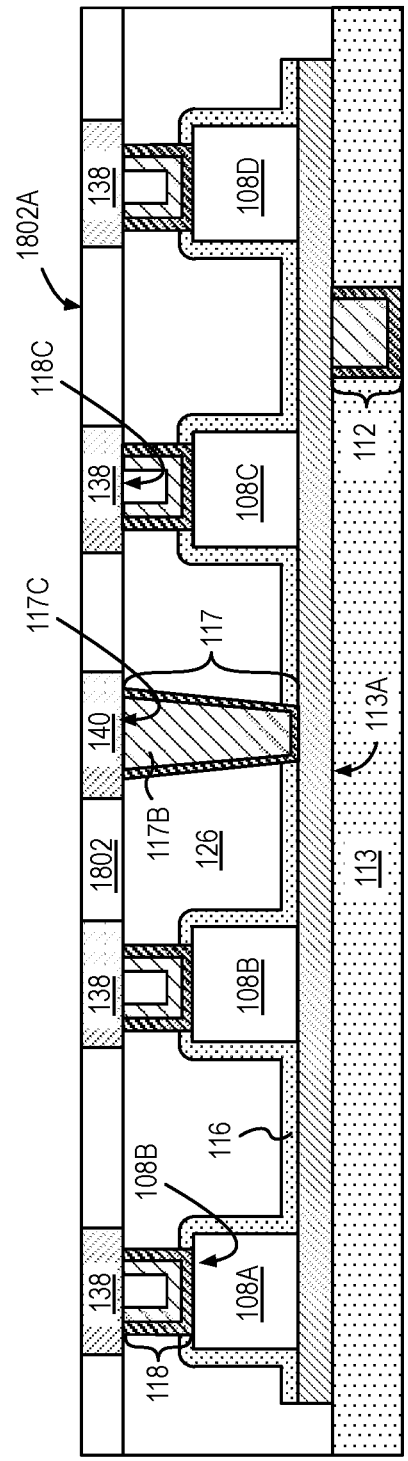
FIG. 18B is a cross-sectional illustration of the structure in FIG. 18A, following the process to form metal interconnects on a respective via electrode and on the signal electrode, in accordance with an embodiment of the present disclosure.

FIG. 18B is a cross-sectional illustration of the structure in FIG. 18A, following the process to form routing structures 138 on a respective via electrode 118 and routing structure 140 on signal electrode 117, in accordance with an embodiment of the present disclosure. In an embodiment, dielectric 1802 is deposited on uppermost surface 126A and on via electrodes 118. Dielectric 1802 may include a material that is the same or substantially the same as the material of dielectric 126. A plurality of openings are formed in dielectric 1802 by a process of masking and etching (as described above). An etch process forms openings that exposes uppermost surfaces of via electrodes 118 and via electrode 117. In some embodiments, the etch process exposes uppermost surfaces 118C of via electrodes 118 and uppermost surface 117C of via electrode 117 simultaneously.

In an embodiment, a conductive material is deposited on via electrodes 118 and on via electrode 117. The conductive material is also deposited on uppermost surface 1802A.

A planarization process may be performed to planarize and remove conductive material from above uppermost surface 1802A. In an embodiment, the planarization process includes a chemical mechanical planarization process. Routing structures 138 and 140 have a vertical thickness that depends on vertical thickness TVs of via electrode 118 and on vertical thickness $T_{106}$ of level 106.

Figure 19A:
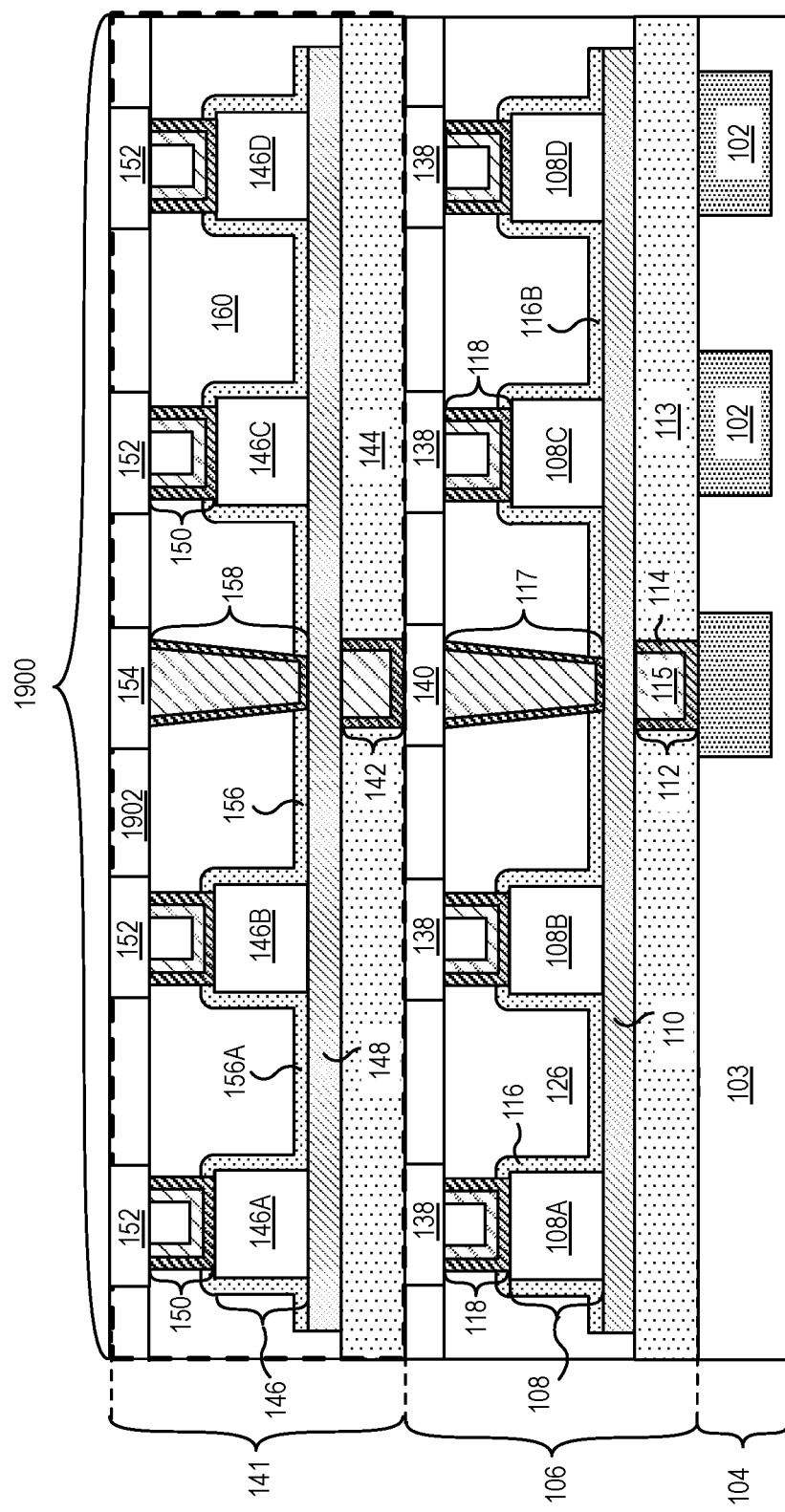
FIG. 19A is a cross-sectional illustration following a process to form a second plurality of memory devices above the first plurality of memory devices.

FIG. 19A is a cross-sectional illustration following a process to form a second plurality of memory devices 146 above plurality of memory devices 108. In various embodiments, the processes described above (in association with FIGS. 8E-18B) can be performed to fabricate the memory device structure 1900 within level 141.

In an exemplary embodiment, etch stop layer 144 is blanket deposited on the structure of level 106. Etch stop layer 144 is blanket deposited on routing structures 138 and on interconnect structure 140, and on dielectric 126 using a PVD, a CVD, or a PECVD deposition process.

Electrode structure 142 is fabricated on routing structure 140 by processes described above (in association with FIGS. 8A-11C).

Plurality of memory devices 146 are fabricated above etch stop layer 144 and electrode structure 142 by a process described above (in association with FIGS. 12A-12B).

Encapsulation layer 156 is formed on a plurality of memory devices 146 by a blanket deposition process. The blanket deposition process may utilize a PVD, a CVD, or a PECVD deposition method.

Plate electrode 148 is fabricated after deposition of encapsulation layer 156 by a process described above (in association with FIGS. 14A-14B).

In an embodiment, dielectric 160 is deposited on encapsulation layer 156 by a PVD, a CVD, or a PECVD deposition method. After deposition of dielectric 160, a plurality of via electrodes 150 and signal electrode 158 are formed by a process described above (in association with FIGS. 15A-15C). Signal electrode 158 maybe fabricated prior to or after fabrication of via electrodes 150.

Variations in implementations of encapsulation layers may be incorporated into structure 1900 by processes described above (in association with FIGS. 16A-16B). Variations in processes to fabricate via electrodes 150 in presence of an additional encapsulation layer may be carried out by processes similar to those described above (in association with FIGS. 17A-17B).

In the illustrative embodiment, dielectric 1902 is deposited on dielectric 160 and on via electrodes 150 and on signal electrode 158. Dielectric 1902 may include a material that is the same or substantially the same as the material of dielectric 1802. Dielectric 1902 may be deposited by a PVD, a CVD, or a PECVD deposition method.

In an embodiment, conductive vias 152 (herein routing structures 152) are fabricated on via electrodes 150 and routing structure 154 is fabricated on signal electrode 158. In some embodiments, routing structures 152 and 154 are fabricated by a process described in association with FIG. 18B.

Figure 19B:
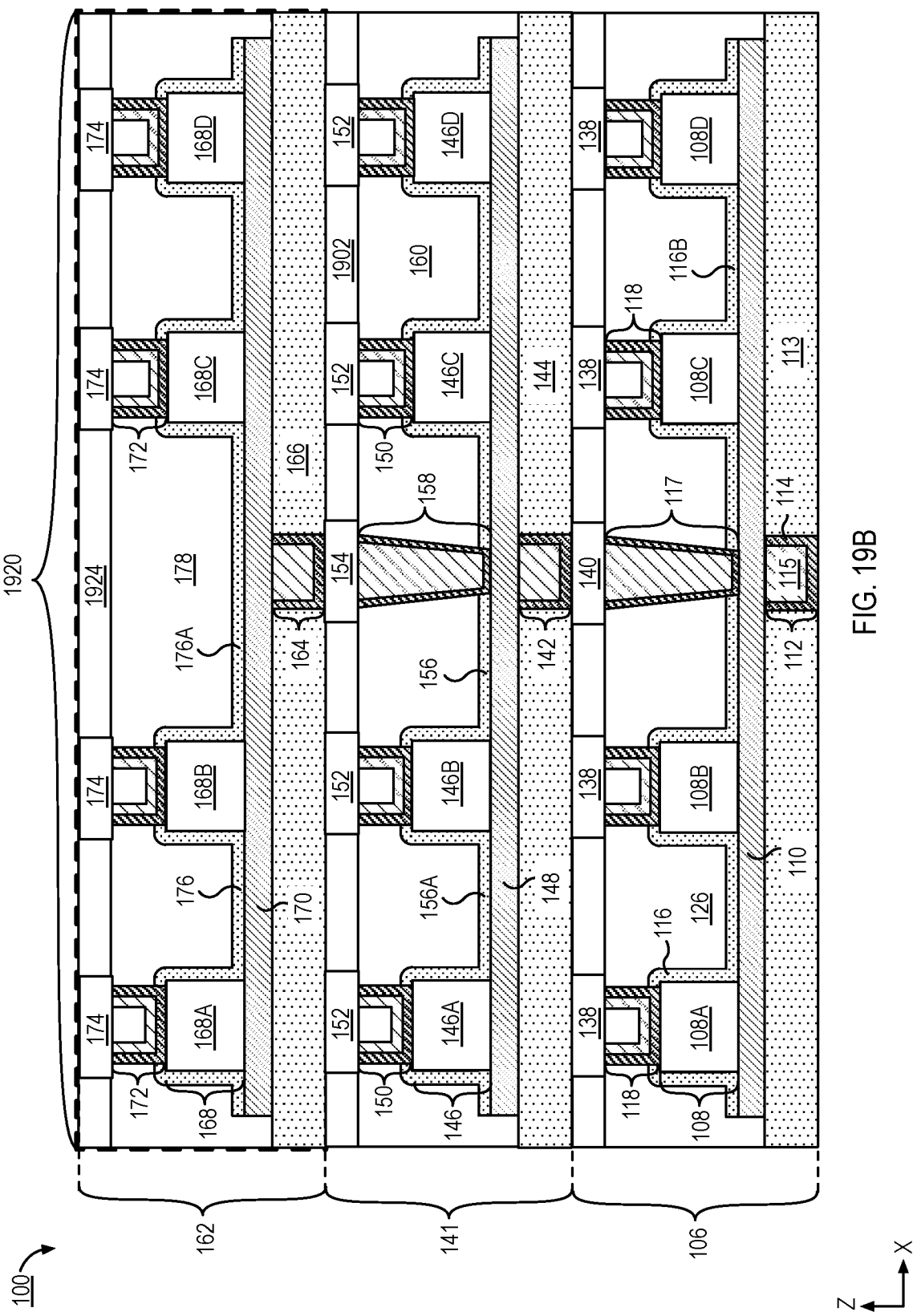
FIG. 19B is a cross-sectional illustration following a process to form a third electrode structure coupled with the second signal electrode and a third plurality of memory devices above the second plurality of memory devices, in accordance with an embodiment of the present disclosure.

FIG. 19B is a cross-sectional illustration of device structure 100 following a process to form electrode structure 164 coupled with signal electrode 158 and form a plurality of memory devices 168 above plurality of memory devices 146, in accordance with an embodiment of the present disclosure.

In various embodiments, the processes described above (in association with FIGS. 8E-18B) can be performed to fabricate memory device structure 1920 within level 162.

In an exemplary embodiment, etch stop layer 166 is blanket deposited on structure of level 141. Etch stop layer 166 is blanket deposited on routing structures 152 and 154, and on dielectric 1902 using a PVD, CVD, or a PECVD deposition process.

Electrode structure 164 is fabricated on routing structure 154 by processes described above (in association with FIGS. 8A-11C).

Plurality of memory devices 168 are fabricated on etch stop layer 166, above electrode structure 164, by described above (in association with FIGS. 12A-12B). Plurality of memory devices 168 may be substantially aligned vertically with plurality of memory devices 146.

Encapsulation layer 176 is formed on plurality of memory devices 168 by a blanket deposition process. The blanket deposition process may utilize a PVD, a CVD, or a PECVD deposition method.

Plate electrode 170 is fabricated by a process described above (in association with FIGS. 14A-14B).

In an embodiment, dielectric 178 is deposited on encapsulation layer 176 by a PVD, a CVD, or a PECVD deposition method. After deposition of dielectric 178, a plurality of via electrodes 172 are formed by a process described above (in association with FIGS. 15A-15C).

Variations in implementations of encapsulation layers may be incorporated into memory device structure 1920 by processes described above (in association with FIGS. 16A-16B). Variations in processes to fabricate via electrodes 172 in presence of an additional encapsulation layer may be carried out by processes similar to those described above (in association with FIGS. 17A-17B).

In the illustrative embodiment, dielectric 1924 is deposited on dielectric 178 and on via electrodes 172. Dielectric 1924 may include a material that is the same or substantially the same as the material of dielectric 1802. Dielectric 1924 may be deposited by a PVD, a CVD, or a PECVD deposition method.

In an embodiment, routing structures 174 are fabricated on via electrodes 172. In some embodiments, routing structures 174 are fabricated by a process described above (in association with FIG. 18B).

While three levels, such as level 104, level 141, and level 162 are illustrated, device structure 100 can include more than three levels. An increase in the number of levels can increase the number of total memory cells, where each memory cell includes, for example, memory device 108A, via electrode 118, and routing structure 138. In the illustrative embodiment, signal electrode is not illustrated within level 162. In some embodiments, level 162 includes a signal electrode coupled with plate electrode 170.

Figure 20A:
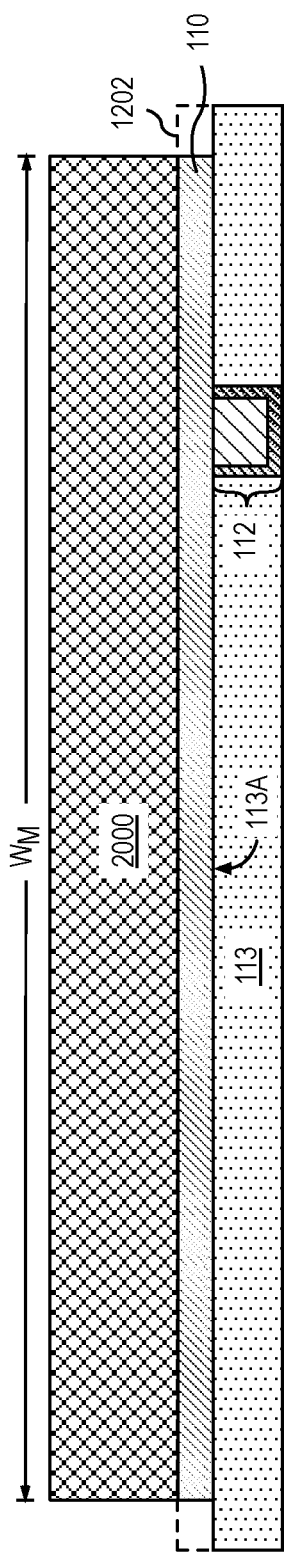
FIG. 20A is a cross-sectional illustration of the structure in FIG. 8E following the process to mask and etch an electrode layer to form a plate electrode, in accordance with an embodiment of the present disclosure.

FIG. 20A is a cross-sectional illustration of the structure in FIG. 8E following the process to mask and etch an electrode layer to form plate electrode 110, in accordance with an embodiment of the present disclosure.

In an embodiment, electrode layer 1202 (in dashed lines) is deposited on electrode structure 112 and on etch stop layer 113. Mask 2000 is formed on electrode layer 1202. In an embodiment, mask 2000 includes a photoresist material and is formed by a lithographic process on electrode layer 1202. In an embodiment, electrode layer 1202 is patterned by plasma etch process prior to forming trench capacitors. After formation of plate electrode 110, mask 2000 may be removed.

Figure 20B:
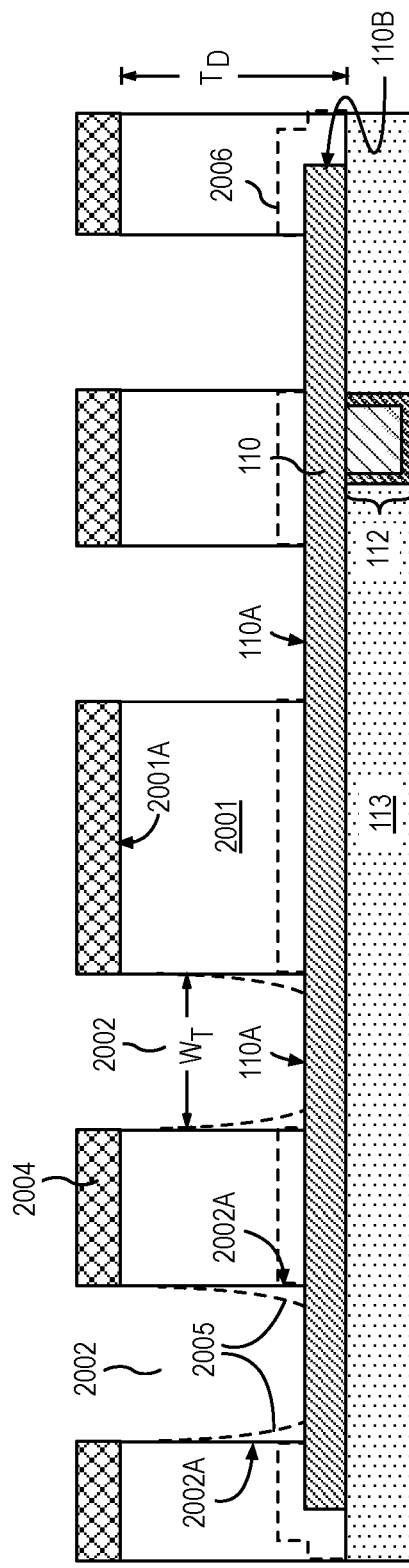
FIG. 20B is a cross-sectional illustration of the structure in FIG. 20A following the process to form openings in a first dielectric formed on the plate electrode, in accordance with an embodiment of the present disclosure.

FIG. 20B is a cross-sectional illustration of the structure in FIG. 20A following the process to form openings 2002 in dielectric 2001 formed on plate electrode 110, in accordance with an embodiment of the present disclosure. Openings 2002 may be trench openings or trenches. Openings 2002 may have a circular, elliptical or a rectangular plan view profile.

In an embodiment, dielectric 2001 is blanket deposited on plate electrode 110 and on etch stop layer 113. Dielectric 2001 may be blanket deposited by a CVD or a PECVD process. A planarization process may be performed to planarize dielectric 2001 to remove non planarity arising from topography of plate electrode 110. In an embodiment, the planarization process includes a chemical mechanical planarization process. The CMP process may form an uppermost surface 2001A that is substantially planar. It is to be appreciated that vertical thickness $T_D$ of dielectric 2001 may be reduced by downstream CMP process during fabrication of trench capacitors. However, dielectric 2001 may be deposited to thickness $T_D$ to account for losses during the CMP process.

Mask 2004 is formed on dielectric 2001. In an embodiment, mask 2004 includes a photoresist material and is formed by a lithographic process on dielectric 2001. In other embodiments, mask 2004 includes a sacrificial material that is removed during a planarization process utilized to form trench capacitors (described below).

Openings 2002 may be formed by a plasma etch process that etches dielectric 2001 but is selective to plate electrode 110. As such, uppermost surface 110A may be substantially planar. Openings 2002 may have a circular, elliptical or a rectangular plan view profile. In some embodiments, openings 2002 can have a width between 20 nm and 100 nm. The plasma etch may form openings 2002 which have sidewalls 2002A that are substantially vertical or flared (indicated by dashed lines 2005). In the illustrative embodiment, sidewalls 2002A are substantially vertical. After formation of openings 2002, mask 2004 may be removed.

In other embodiments, plate electrode 110 can be encapsulated by an encapsulation layer 2006, indicated by dashed lines, prior to deposition of dielectric 2001. Encapsulation layer 2006 may be deposited by a CVD, a PECVD, or an ALD process to a thickness of at least 1 nm. Encapsulation layer 2006 includes a material that is the same or substantially the same as the material of encapsulation layer 116 (FIG. 1A). As shown, encapsulation layer 2006 is formed on uppermost surface 110A and on sidewalls 110B. In some such embodiments, while forming openings 2002, and after etching dielectric 2001, the plasma etch process also etches portions of encapsulation layer 2006 deposited on uppermost surface 110A. The plasma etch process exposes uppermost surface 110A so that a lowermost conductive layer to be deposited to fabricate trench capacitors are in direct contact with plate electrode 110.

FIG. 20C is a cross-sectional illustration of the structure in FIG. 20B following the process to deposit layers to form trench capacitors into respective openings 2002.

In an embodiment, a dielectric spacer material is deposited in openings 2002, on sidewalls 2001B, on uppermost surface 2001A, and on plate electrode 110. The dielectric spacer material may include a material that is the same or substantially the same as the material of encapsulation layer 116 (FIG. 13A). A plasma etch process may be utilized to etch the dielectric spacer material to form dielectric spacer

209. The plasma etch process removes dielectric spacer material from uppermost surface 2001A and from uppermost surface 110A of plate electrode 110. Dielectric spacer 209 may be formed along an entire sidewall of individual openings 2002, as shown. In some embodiments, it may be desirable to recess dielectric spacer 209 relative to uppermost surface 2001A. Sidewall 209A is exposed after formation of dielectric spacer 209.

After formation of dielectric spacer 209, layers are deposited to form trench capacitors. In some embodiments, bottom electrode layer 2007 and top electrode layer 2011 can be deposited into openings 2002 by a PVD or a CVD process, while dielectric layer 2009 can be deposited by an ALD process due to thickness uniformity requirements. In other embodiments, an ALD process is utilized to sequentially deposit all layers within openings 2002.

In an embodiment, the ALD deposition process is performed at a temperature between 150° C. and 250° C.

In an embodiment, bottom electrode layer 2007 includes a material that is the same or substantially the same as the material of bottom electrode 214 (FIG. 2). In an embodiment, dielectric layer 2009 includes a material that is the same or substantially the same as the material of dielectric layer 216 (FIG. 2). In an embodiment, top electrode layer 2011 includes a material that is the same or substantially the same as the material of top electrode 218 (FIG. 2).

The deposition process forms bottom electrode layer 2007 on exposed sidewalls 209A of dielectric spacer 209, on a base of openings 2002, on plate electrode 110, and on uppermost surface 2001A. In an embodiment, bottom electrode layer 2007 is deposited to a thickness of at least 1 nm by an ALD, a PAALD, or a PELD process. The deposition process forms dielectric layer 2009 on the surface of bottom electrode layer 2007 and forms top electrode layer 2011 on dielectric layer 2009. An ALD deposition process may be utilized to sequentially deposit a single monolayer at a time. In an embodiment, the deposition process is carried out by dielectric layer 2009, including a ferroelectric or paraelectric nanocrystalline film having a requisite thickness between 1 nm and 30 nm, is formed.

Formation of dielectric spacer 209 reduces an originally formed width of respective opening 2002 to a new width $W_{TN}$. Depending on $W_{TN}$, and on a thickness of top electrode layer 2011 to be deposited, top electrode layer 2011 may or may not fill openings 2002. In an embodiment, top electrode layer 2011 is deposited to a thickness of at least 1 nm by an ALD, a PAALD, or a PELD process. In the illustrative embodiment, top electrode layer 2011 fills openings 2002. In other embodiments, an additional fill material may be required to fill the space between dielectric layer 2009 that is conformally deposited on bottom electrode layer 2007.

In other embodiments, dielectric spacer 209 is not present and bottom electrode layer 2007 is deposited on sidewalls 2001B of dielectric 2001.

FIG. 20D is a cross-sectional illustration of the structure in FIG. 20C following the process to form plurality of trench capacitors 204 (such as trench capacitors 204A, 204B, 204C, and 204D). Plurality of trench capacitors 204 may be formed by planarizing and removing excess trench capacitor layers deposited on and above dielectric 2001. In an embodiment, a chemical mechanical polish (CMP) process is utilized. The CMP process removes top electrode layer 2011, dielectric layer 2009, and bottom electrode layer 2007 from above dielectric 2001. The planarization process isolates top electrode 218, dielectric layer 216, and bottom electrode 214 within openings 2002 to form plurality of trench capacitors 204. It is to be appreciated that vertical thickness $T_D$ of dielectric 2001 may be reduced by the CMP process.

FIG. 20E is a cross-sectional illustration of the structure in FIG. 20D following the process to form openings 2014 in dielectric 2016 above respective trench capacitors 204A, 204B, 204C, and 204D.

Dielectric 2016 is deposited on dielectric 2001, and on plurality of trench capacitors 204. In an embodiment, dielectric 2016 includes an insulative material with a hydrogen barrier property. A hydrogen barrier is essential to prevent hydrogen from reaching an uppermost portion of dielectric layer 216. In some embodiments, dielectric 2016 includes silicon and nitrogen, or silicon, nitrogen, and carbon. In some embodiments, dielectric 2016 includes an insulator material having 90% of theoretical material density, such as but not limited to $Al_xO_y$, $HfO_x$, $AlSiO_x$, $ZrO_x$, $TiO_x$, $AlSiO_x$, $HfSiO_x$, $TaSiO_x$, AlN, ZrN, or HfN.

In other embodiments, dielectric 2016 is a bilayer stack where a first layer is a hydrogen barrier layer that is directly in contact with dielectric 2001 and plurality of trench capacitors 204, and a second layer, on the first layer, that is a low dielectric constant ILD material (a dielectric constant below 3 is considered to be sufficiently low). In some such embodiments, the second layer includes a material that is the same or substantially the same as the material of dielectric 2001. Methods of depositing dielectric 2016 and choice of materials of dielectric 2016 with hydrogen barrier property or low density films have been described above.

Mask 2017 may be formed on dielectric 2016. In an embodiment, mask 2017 includes a photoresist material and is formed by a lithographic process on dielectric 2016. Openings 2014 may be formed in dielectric 2016 by a plasma etch process. It is highly desirable for the plasma etch process to be selective to top electrode 218. In the illustrative embodiment, width $W_C$ of openings 2014 are substantially equal to a lateral width $W_{TL}$ of top electrode 218. Openings 2014 do not expose bottom electrode 214. After formation of openings 2014, mask 2017 may be removed.

FIG. 20F is a cross-sectional illustration of the structure in FIG. 20E following the process to form via electrode 2018 on a respective trench capacitor 2002.

In the illustrative embodiment, liner layer 122 is blanket deposited into openings 2014, on top electrode 218, on uppermost surface 2016B, and on sidewalls 2016A of dielectric 2016. A layer of conductive fill material is deposited on the conductive hydrogen barrier material in the remaining portions of openings 2014.

Liner layer 122 includes a material that is compatible with dielectric 2016 so that an interface between the conductive hydrogen barrier material and dielectric 2016 is not a source of dislocations.

In embodiments, liner layer 122 and conductive fill material 124 are deposited by an ALD, a CVD, a PVD or sputter deposition process.

Following the deposition process, a planarization process is performed to remove excess materials from above dielectric 2016 to form via electrode 2018 on a respective trench capacitor 204A, 204B, 204C, and 204D.

In an embodiment, the planarization process includes a chemical mechanical planarization (CMP) process. The CMP process removes conductive fill material 124 and liner layer 122 from uppermost surface 2016B. The planarization process isolates the materials inside openings 2014 to form conductive hydrogen barrier 120, and conductive fill material 124. Via electrode 2018 has many properties of via electrode 118, such as vertical and lateral thicknesses.

In some embodiments, a conductive hydrogen barrier material is blanket deposited in openings 2014, prior to deposition of liner layer 122 and conductive fill material 124 (such as illustrated in the structure of FIG. 3).

Figure 20G:
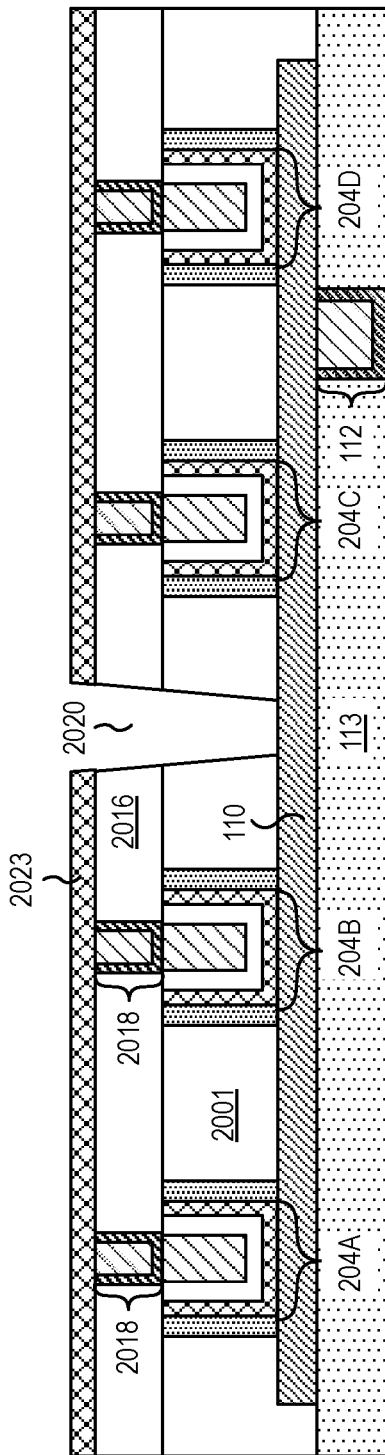
FIG. 20G is a cross-sectional illustration of the structure in FIG. 20F following the process to form an opening to form a signal electrode, in accordance with an embodiment of the present disclosure.

FIG. 20G is a cross-sectional illustration of the structure in FIG. 20F following the process to form a via opening 2020 to form via electrode 117, in accordance with an embodiment of the present disclosure.

In an embodiment, mask 2023 is formed on dielectric 2016 and on via electrodes 2018. In an embodiment, mask 2023 includes a photoresist material and is formed by a lithographic process on dielectric 2016. Openings 2020 may be formed in dielectric 2016 and dielectric 2001 by a plasma etch process. It is highly desirable for the plasma etch process to be selective to plate electrode 110. In one or more embodiments, the process utilized to form via opening 2020 is substantially similar to the etch process utilized to form openings 2002 (FIG. 20B). After formation of openings 2014, mask 2017 may be removed.

Figure 20H:
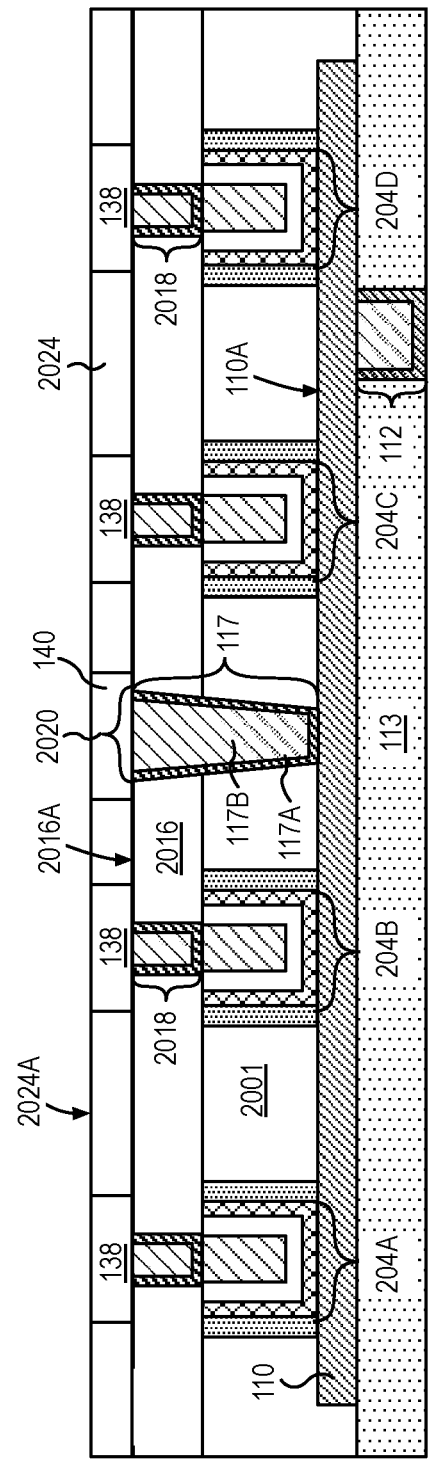
FIG. 20H is a cross-sectional illustration of the structure in FIG. 20G following the process to form a first signal electrode in the opening on the first plate electrode and following the formation of a plurality of metal interconnects above the memory devices, in accordance with an embodiment of the present disclosure.

FIG. 20H is a cross-sectional illustration of the structure in FIG. 20G following the process to form via electrode 117 in via opening 2020 on plate electrode 110 and following the formation of routing structure 138 above a respective trench capacitor 204A, 204B, 204C, 204D, in accordance with an embodiment of the present disclosure.

In an embodiment, a conductive material is deposited into via opening 2020. In an embodiment, depositing the conductive material includes depositing liner layer 117A in via opening 2020. In some such embodiments, liner layer 117A is also deposited on uppermost surface 110A, on sidewalls of dielectric 2016 and dielectric 2001, on uppermost surface 2016B and on surfaces of via electrodes 2018. Conductive fill material 117B is deposited on liner layer 117A. In some embodiments, conductive fill material 117B includes copper, tungsten, nickel, or cobalt, and liner layer 117A includes ruthenium, tantalum, or nitrides of tantalum or titanium. In other embodiments where no liner is implemented, a conductive fill material is directly deposited on uppermost surface 110A, on sidewalls of dielectric 2001 and 2016 on uppermost surface 2016B and on surfaces of via electrodes 2018.

A planarization process may be utilized to remove an excess conductive fill material 117B and liner layer 117A from above dielectric 2001 and via electrodes 2018. In an embodiment, the planarization process includes a chemical mechanical polish (CMP) process. The CMP process forms via electrode 117.

As shown, dielectric 2024 is deposited on dielectric 2001, on via electrodes 2018 and on via electrode 117. In an embodiment, dielectric 2024 includes a material of dielectric 2016. In other embodiments, dielectric 2024 includes a material of dielectric 2001.

Individual routing structures 138 are formed on a respective via electrode 2018 and routing structure 140 is formed on via electrode 117. In an embodiment, mask 2023 is formed on dielectric 2024. Openings are etched in dielectric 2024. The process utilized to form the mask on dielectric 2024 and the process utilized to etch dielectric 2024 to form the openings is similar to processes described above (in association with FIGS. 20E-20F). The openings formed in dielectric 2024 expose uppermost surfaces of via electrodes 2018 and via electrode 117. In an embodiment, the openings in dielectric 2024 are formed at the same time.

A conductive material is deposited into the openings and on via electrodes 2018 and on via electrode 117, and on uppermost surface 2024A of dielectric 2024. The conductive material deposited on uppermost surface 2024A is removed by a planarization process. In an embodiment, a chemical mechanical polish (CMP) process is utilized. The CMP process forms individual routing structures 138 on respective via electrode 2018, and routing structure 140 on via electrode 117.

Figure 20I:
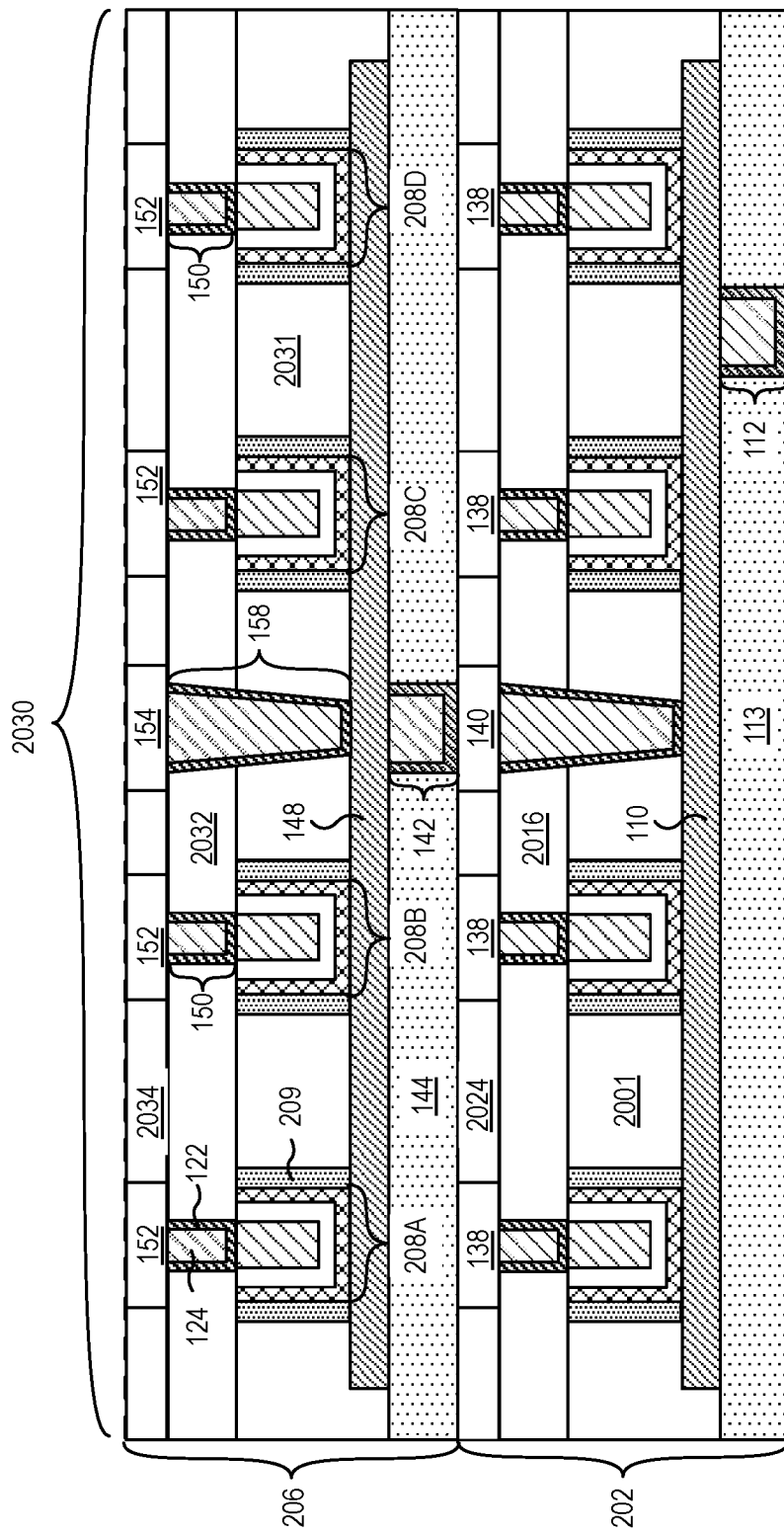
FIG. 20I is a cross-sectional illustration of the structure in FIG. 20H following the formation of a second electrode structure coupled with the first signal electrode, and the formation of a second plurality of memory devices in a second level above the first level.

FIG. 20I is a cross-sectional illustration following a process to form plurality of trench capacitors 208 in level 206, above plurality of trench capacitors 204. In various embodiments, the processes described above (in association with FIGS. 20A-20H) can be performed to fabricate memory device structure 2030 within level 206.

In an exemplary embodiment, etch stop layer 144 is blanket deposited on the structure of level 202. Etch stop layer 144 may be blanket deposited on routing structures 138, on interconnect structure 140, and on dielectric 2001 using a PVD, a CVD, or a PECVD deposition process.

Electrode structure 142 is fabricated on routing structure 140 by processes described above (in association with FIGS. 8A-11C). In the illustrative embodiment, electrode structure 142 is narrower (along the x-direction) than routing structure 140. In other embodiments, routing structure, 140 is narrower than electrode structure 142. Routing structure 140 may also extend into the plane of the figure in some embodiments.

Plate electrode 148 is fabricated by a process described above (in association with FIG. 20A). In an embodiment, dielectric 2031 is deposited on plate electrode 148 by a PVD, a CVD, or a PECVD deposition method.

Plurality of trench capacitors 208 are fabricated within openings formed within dielectric 2031 on plate electrode 148 by the method described above (in association with FIGS. 20B-20D).

After deposition of dielectric 2032, a plurality of via electrodes 150 and signal electrode 158 are fabricated by the process described above (in association with FIGS. 20E-20H). Signal electrode 158 maybe fabricated prior to or after fabrication of via electrodes 150.

In the illustrative embodiment, dielectric 2034 is deposited on dielectric 2032, on via electrodes 150, and on signal electrode 158. Dielectric 2034 may include a material that is the same or substantially the same as the material of dielectric 2024. In some embodiments, dielectric 2034 can be blanket deposited by a PVD, a CVD, or a PECVD deposition method.

In an embodiment, individual routing structure 152 is fabricated on respective via electrode 150 within the plurality of via electrodes 150, and routing structure 154 is fabricated on signal electrode 158. In some embodiments, routing structures 152 and 154 are fabricated by the process described above (in association with FIG. 20H).

Figure 20J:
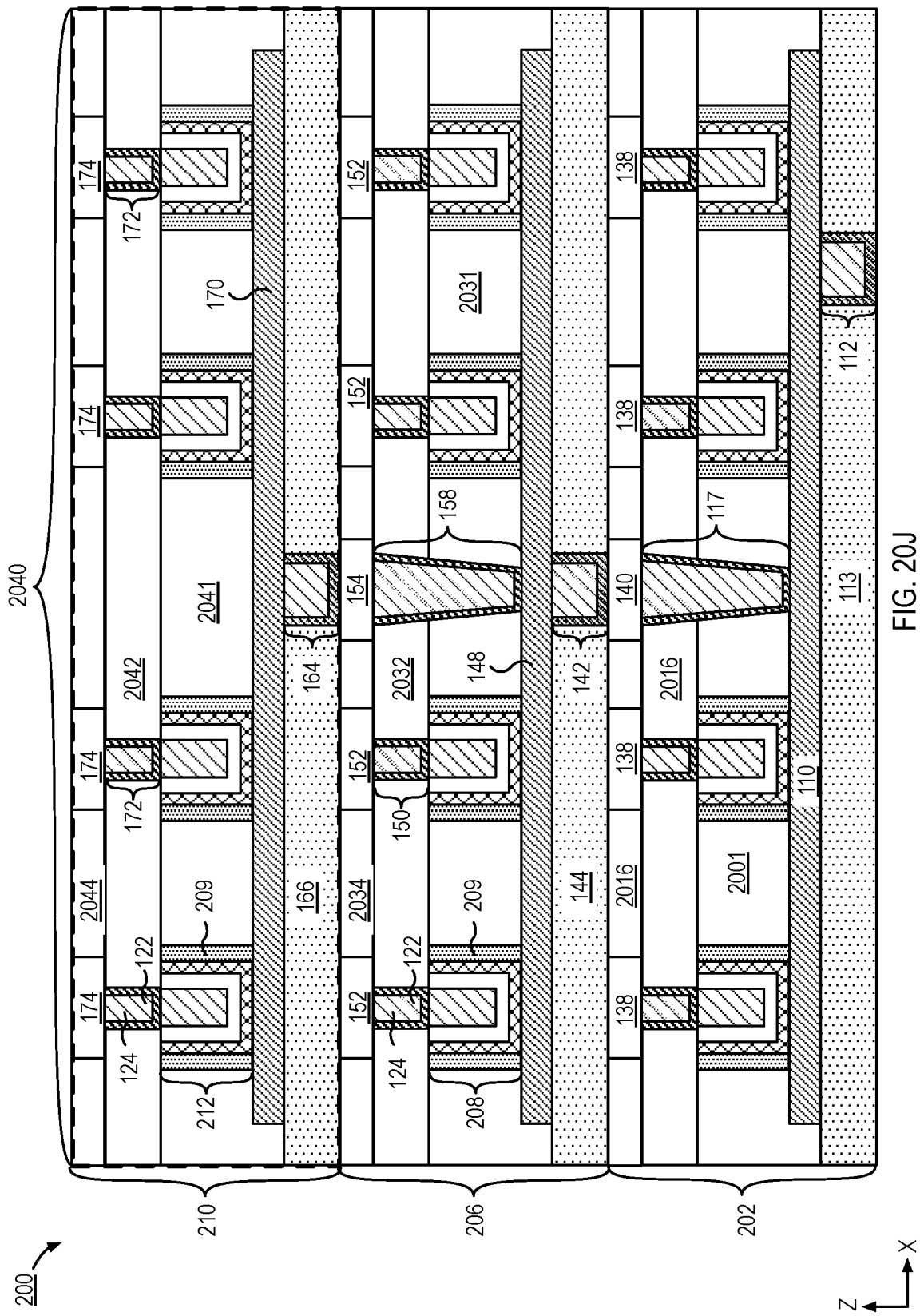
FIG. 20J is a cross-sectional illustration of the structure in FIG. 20I following the formation of a third electrode structure coupled with the second signal electrode, and the formation of a third plurality of memory devices in a third level above the second level.

FIG. 20J is a cross-sectional illustration of the structure in FIG. 20I following the formation of electrode structure 164 coupled with signal electrode 158, and the formation of plurality of trench capacitors 212 within level 210. In various embodiments, one or more processes described above (in association with FIGS. 20A-20H) can be performed to fabricate memory device structure 2040 within level 210.

In an exemplary embodiment, etch stop layer 166 is blanket deposited on the structure of level 206. Etch stop layer 166 is blanket deposited on interconnect structures 152, on interconnect structure 140, and on dielectric 2034 using a PVD, a CVD, or a PECVD deposition process.

Electrode structure 164 is fabricated on routing structure 154 by processes described above (in association with FIGS. 8A-11C). In the illustrative embodiment, electrode structure 164 is narrower (along the x-direction) than routing structure 154. In other embodiments, routing structure 154 is narrower than electrode structure 164. Routing structure 154 may also extend into the plane of the figure in some embodiments.

Plate electrode 170 is fabricated by the process described above (in association with FIG. 20A). In an embodiment, dielectric 2041 is deposited on plate electrode 170 by a PVD, a CVD, or a PECVD deposition method.

Plurality of trench capacitors 212 are fabricated within openings formed within dielectric 2041 on plate electrode 170 by the method described above (in association with FIGS. 20B-20D).

After deposition of dielectric 2042, a plurality of via electrodes 172 are fabricated by the process described above (in association with FIGS. 20E-20F). Dielectric 2042 may include a material that is the same or substantially the same as the material of dielectric 2032.

In the illustrative embodiment, dielectric 2044 is deposited on dielectric 2042 and on via electrodes 172. Dielectric 2044 may include a material that is the same or substantially the same as the material of dielectric 2034. In some embodiments, dielectric 2044 can be blanket deposited by a PVD, a CVD, or a PECVD deposition method.

In an embodiment, individual routing structure 174 is fabricated on individual via electrode 172. In some embodiments, routing structures 174 are fabricated by the process described above (in association with FIG. 20H).

While three levels, such as levels 202, 206, and 210 are illustrated, device structure 200 can include more than three levels. An increase in the number of levels can increase the number of total memory cells.

Furthermore, while plate electrodes 110, 148, and 170 are illustrated to be substantially aligned in x-direction in the figure, there may be misalignment between plate electrodes 110, 148, and 170 in both x and y directions. However, such misalignments may not be substantial to cause issues with aligning of signal electrodes 117 and 158.

Figure 21B:
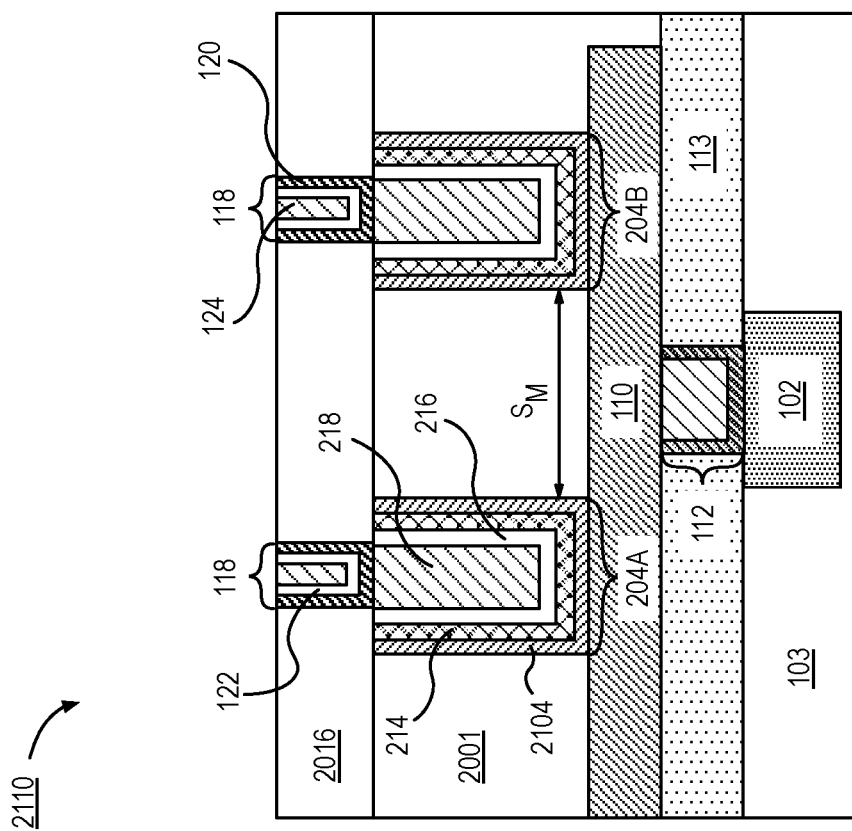
FIG. 21B is a cross-sectional illustration of a portion of the structure in FIG. 21A, following the process to planarize the material layer stack to form trench capacitors, and following the process to form a via electrode above a respective trench capacitor, in accordance with an embodiment of the present disclosure.
Figure 21A:
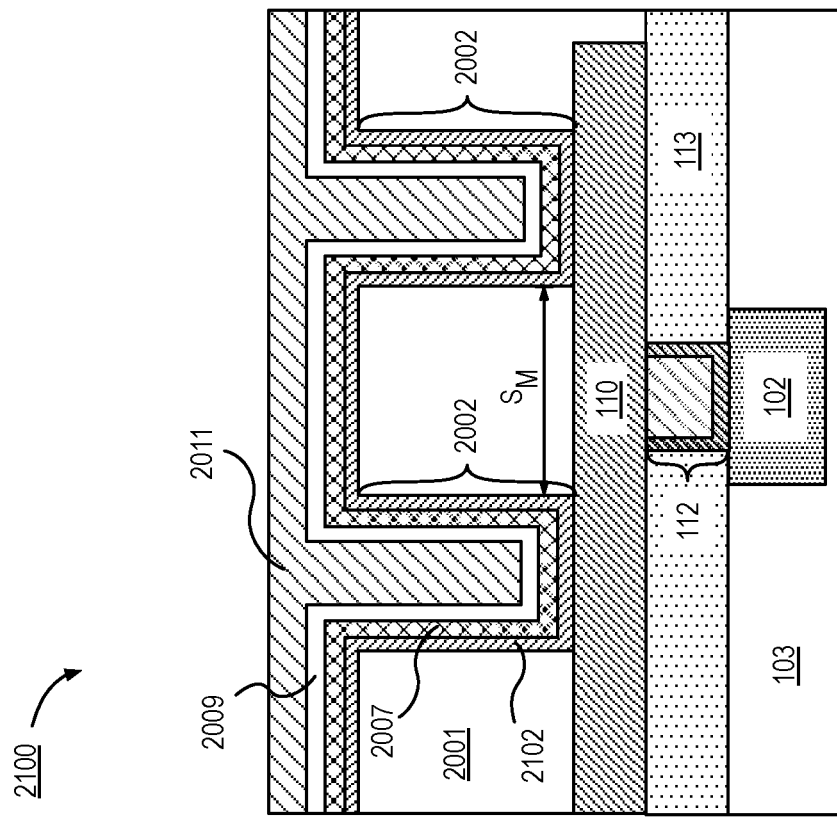
FIG. 21A is a cross-sectional illustration of a portion of the structure in FIG. 20B, following the process to deposit a material layer stack including a conductive hydrogen barrier layer within a trench, in accordance with an embodiment of the present disclosure.

FIG. 21A is a cross-sectional illustration of device structure 2100 representing a portion of the structure in FIG. 20B, following the process to deposit a material layer stack, in accordance with an embodiment of the present disclosure. In some embodiments, dielectric 2001 may not be a hydrogen barrier material. In some such embodiments, trench capacitors may include a conductive hydrogen barrier material adjacent to a bottom electrode.

In the illustrative embodiment, a conductive hydrogen barrier layer 2102 is deposited into openings 2002, on plate electrode 110, and on dielectric 2001. As shown, conductive hydrogen barrier layer 2102 is substantially U-shaped. Conductive hydrogen barrier layer 2102 provides protection against hydrogen diffusion from plate electrode 110, and from dielectric 2001. As such, dielectric spacers are not included in device structure 2100. In some embodiments, a dielectric spacer may be included to reduce a lateral thickness or diameter of trench capacitors to be formed. Conductive hydrogen barrier layer 2102 may include a material of conductive hydrogen barrier 114 or 120 (FIG. 1A). In embodiments, conductive hydrogen barrier layer 2102 is deposited by an ALD or a PAALD process and can be deposited to a thickness of at least 1 nm to provide a continuous film.

After deposition of conductive hydrogen barrier layer 2102, layers are deposited to form trench capacitors. In some embodiments, bottom electrode layer 2007 and top electrode layer 2011 can be deposited into openings 2002 by a PVD or a CVD process, while dielectric layer 2009 can be deposited by an ALD process due to thickness uniformity requirements. In other embodiments, an ALD process is utilized to sequentially deposit all layers within openings 2002.

FIG. 21B is a cross-sectional illustration of device structure 2110, following the process to form trench capacitors 204A and 204B, and form plurality of via electrodes 118, in accordance with an embodiment of the present disclosure.

Trench capacitors 204A and 204B may be formed by planarizing and removing excess layers in the material layer stack deposited on and above dielectric 2001. Methods of planarization have been described above (in association with FIG. 20D). The planarization process forms conductive hydrogen barrier 2104 of trench capacitors 204A and 204B.

A via electrode 118 may be formed on top electrode 218 of individual trench capacitors 204A and 204B by methods described above (in association with FIGS. 20E-20F).

Figure 22A:
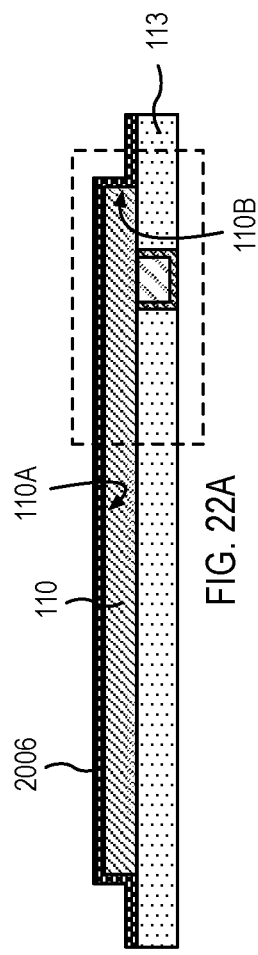
FIG. 22A is a cross-sectional illustration of the structure in FIG. 20A following the process to remove the mask and deposit an encapsulation layer on the plate electrode.

FIG. 22A is a cross-sectional illustration of the structure in FIG. 20A following the process to remove the mask and deposit encapsulation layer 2006 on plate electrode 110. In an embodiment, the process utilized to deposit encapsulation layer 2006 is the same or substantially the same as the process utilized to deposit encapsulation layer 116 described above (in association with FIG. 13A). Encapsulation layer 2006 is deposited substantially uniformly on uppermost surface 110A and on sidewalls 110B of plate electrode 110. While conformality is not essential, encapsulation layer 2006 is deposited to a thickness of at least 1 nm to form a contiguous film.

Figure 22B:
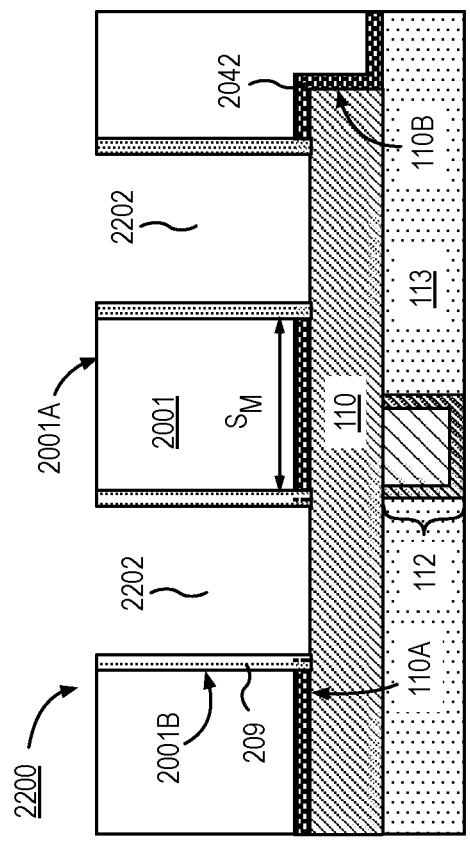
FIG. 22B is a cross-sectional illustration of the structure in FIG. 22A following the process to deposit a dielectric and form openings in the dielectric and in the encapsulation layer.

FIG. 22B is a cross-sectional illustration of a portion 2200 of the structure in FIG. 22A following the process to deposit dielectric 2001 on encapsulation layer 2006 and form openings 2202 in dielectric 2001 and encapsulation layer 2006. In an embodiment, dielectric 2001 may include materials with hydrogen barrier properties or a non-hydrogen barrier material, such as silicon and oxygen.

In an embodiment, openings 2202 may be formed by masking and etching as described above (in association with FIG. 20B). In the illustrative embodiment, the process to etch dielectric 2001 is extended further to etch and remove encapsulation layer 2006 selectively to plate electrode 110. In exemplary embodiments, encapsulation layer 2006 includes a dielectric material, which can be etched selectively with respect to plate electrode 110.

Following the formation of openings 2202, a dielectric spacer may be formed within openings 2202. In the illustrative embodiment, dielectric spacer 209 is formed directly adjacent to sidewalls 2001B and encapsulation layer 2006. Dielectric spacer 209 may be formed by depositing a spacer layer comprising a dielectric material in openings 2202, on uppermost surface 2001A, on sidewalls 2001B, and on plate electrode 110. The spacer layer can be etched, for example, by a plasma etch process to form spacers adjacent to sidewalls 2001B. Dielectric spacer 209 can include materials that prevent hydrogen and oxygen diffusion from dielectric 2001. In some embodiments, dielectric spacer 209 includes a material that is the same or substantially the same as the material of the encapsulation layer 2006.

Figure 23:
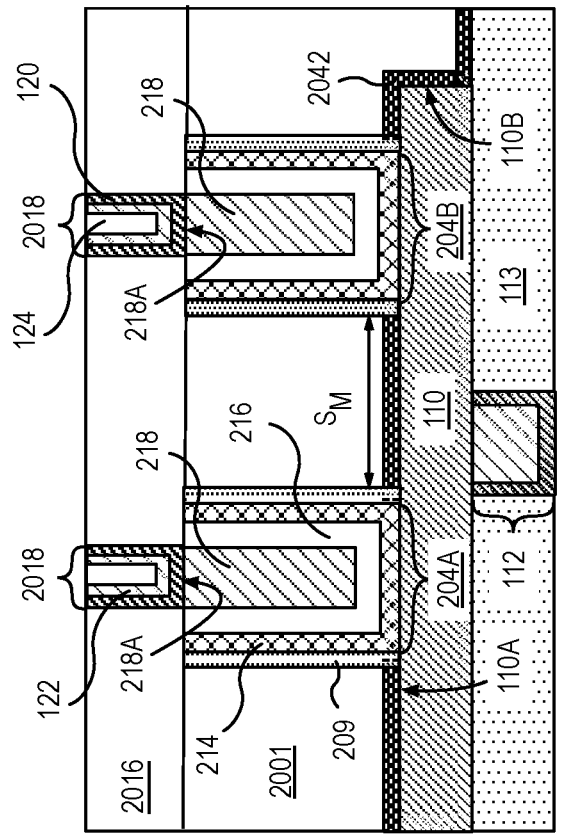
FIG. 23 is a cross-sectional illustration of the structure in FIG. 22B following the process to form trench capacitors in the openings and a via electrode on a respective trench capacitor.

FIG. 23 is a cross-sectional illustration of structure in FIG. 22B following the process to form trench capacitors and a via electrode on a respective trench capacitor. In the illustrative embodiment, trench capacitors 204A and 204B are fabricated by a method that is the same or substantially the same as the processes described above (in association with FIGS. 20C-20D). In the illustrative embodiment, via electrode 2018 is formed on electrode surface 218A of individual trench capacitors 204A and 204B. In exemplary embodiments, fabrication of via electrodes 2018 is substantially the same as the processes described in association with FIGS. 20E-20F and includes the same or substantially the same materials.

Figure 24:
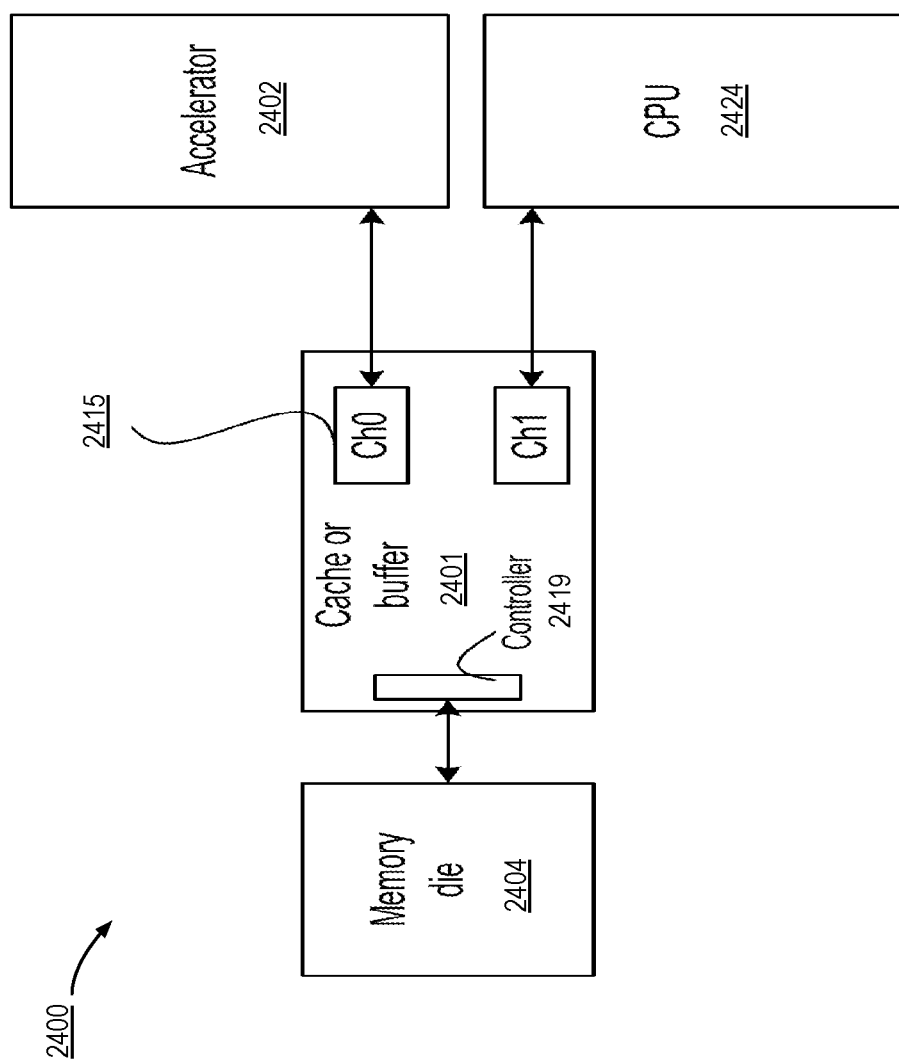
FIG. 24 illustrates a computing architecture with a coherent cache or memory-side buffer chiplet that includes a memory controller, wherein the coherent cache or memory-side buffer chiplet is coupled to an accelerator, a processor, and a memory, in accordance with some embodiments.

FIG. 24 illustrates computing architecture 2400 with a coherent cache or memory-side buffer chiplet that includes a memory controller, wherein the coherent cache or memory-side buffer chiplet is coupled to an accelerator, a processor, and a memory, in accordance with some embodiments. Computing architecture 2400 comprises coherent cache or memory-side buffer chiplet 2401, accelerator 2402 (e.g., inference chip), processor (e.g., central processing unit CPU 2424), and memory die 2404. In some embodiments, coherent cache or memory-side buffer chiplet 2401 comprises at least two channels 2415, which are configured to connect with accelerator 2402 and CPU 2424. In some embodiments, coherent cache or memory-side buffer chiplet 2401 comprises I/O and controller 2419 to manage data traffic with memory die 2404. By moving controller 2419 from CPU 2424 to coherent cache or memory-side buffer chiplet 2401, cost in terms of power and die area for CPU 2424 is reduced. In some embodiments, coherent cache or memory-side buffer chiplet 2401 is a cache memory that comprises ferroelectric memory cells. For example, coherent cache or memory-side buffer chiplet 2401 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 25:
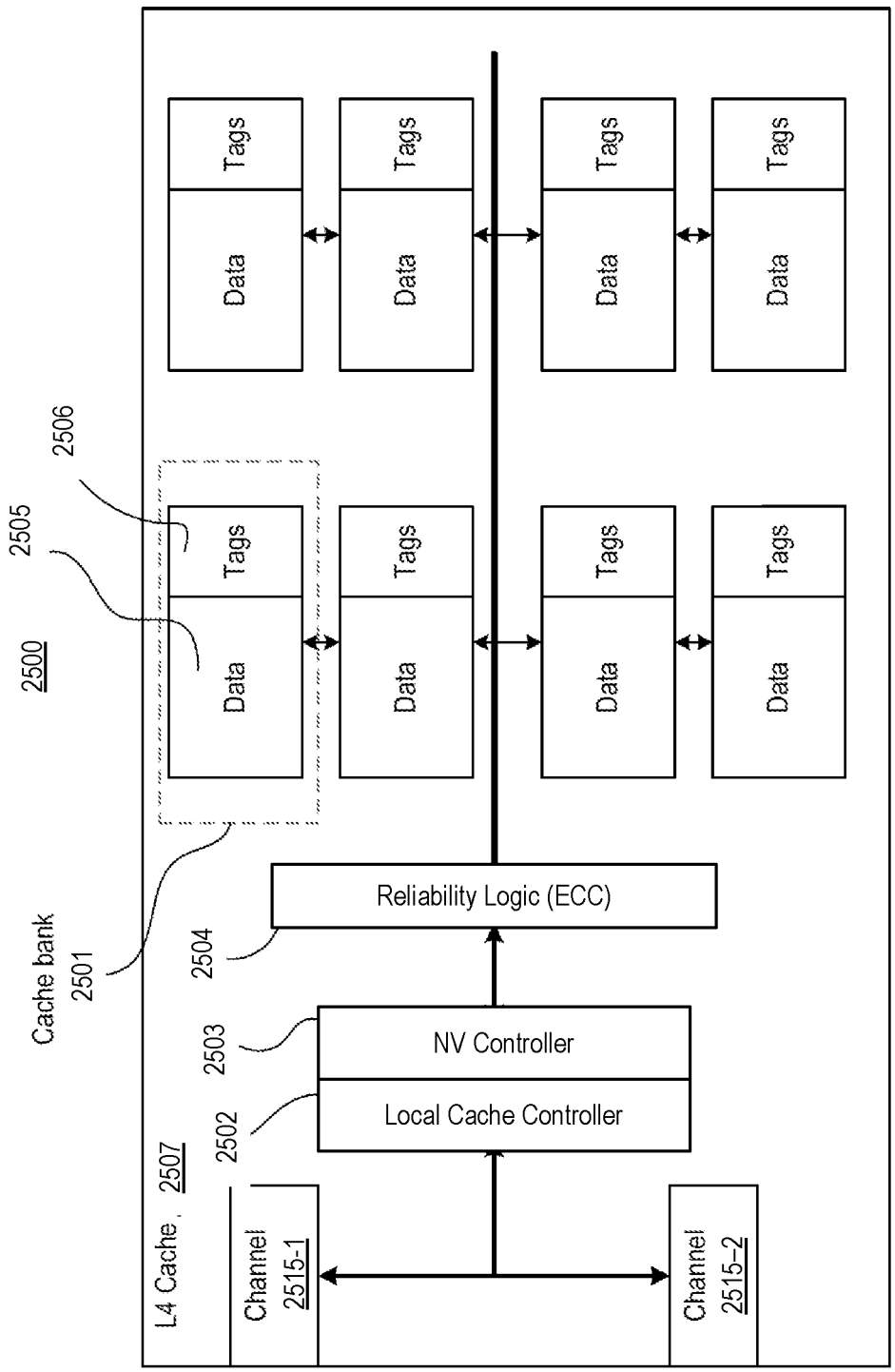
FIG. 25 illustrates an architecture of the coherent cache or memory-side buffer chiplet with multiple controllers and multiple cache banks, in accordance with some embodiments.

FIG. 25 illustrates architecture 2500 of the coherent cache or memory-side buffer chiplet (e.g., 2507) with multiple controllers and multiple cache banks, in accordance with some embodiments. In some embodiments, architecture 2500 comprises channels (e.g., ch0 2515-1 and ch1 2515-2), cache banks 2501, cache controller 2502, non-volatile (NV) controller 2503, and reliability logic 2504. Coherent cache or memory-side buffer chiplet 2507 may function as a cache or memory buffer. In some embodiments, cache lookups can map a large physical memory into a small physical cache using indirection via tags. Here, indirection refers to the use of tags to specify which address maps to which physical location. If multiple addresses can map to a single physical location, a tag is used to figure out which address is currently mapped.

In some embodiments, each cache bank 2501 includes data bank 2505 (e.g., comprising memory cells) and associated tags 2506. In some embodiments, data bank 2505 comprises ferroelectric memory cells. In some embodiments, data bank 2505 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In some embodiments, when data bank 2505 includes ferroelectric memory, it uses NV controller 2503 and a stronger reliability logic (e.g., error correction code) for security compared to non-ferroelectric memory for data bank 2505.

When data bank 2505 is used to implement a cache, tags may be used to identify which addresses map to which physical locations in the bank. The cache may be set associative, in which a particular address can map to several physical locations. The specific physical location a newly allocated address is mapped to may be determined by a replacement algorithm, such as LRU (least recently used) or pseudo-LRU, or even random. On the other hand, the cache might be direct mapped, with each address mapping to merely a single physical cache line. In both set associative and direct mapped caches, several addresses map to a single physical cache line. To identify the address currently occupying the physical cache line, tag 2506 may be coupled with each physical line. Tag 2506 may comprise some address bits, sufficient to uniquely identify which address currently occupies the physical line coupled with the tag.

In some embodiments, cache controller 2502 could be used to control state transitions required for cache look ups, such as comparing requested addresses with tags stored in the tags 2506 and identifying a candidate for replacement (replacement algorithm) when a cache miss occurs. In addition, the cache controller could be tasked with initializing the cache when the cache powers on. When FE memory of data bank 2505, which retains state across power cycles, is used, cache controller 2502 could write 0s to all memory locations to ensure that data associated with previously executed programs is erased, thus preventing any data leakage to subsequently executed programs. The non-volatile memory may also include an NV bit, which could indicate that cache data is meant to be non-volatile and remain across power cycles. Cache controller 2502 would skip locations marked thus when initializing memory.

In some embodiments, reliability logic 2504 performs error correction to the data. Any suitable error correction scheme (e.g., with error correction code (ECC)) may be used by reliability logic 2504. In some embodiments, NV controller 2503 is provided to explicitly clear the cache when using a non-volatile memory, such as FM memory for data bank 2505. NV controller 2503 may include an NV bit which indicates cache lines that should not be cleared but are expected to retain their contents across power cycles. The functions of NV controller 2503 can be combined in cache controller 2502, or vice versa.

Figure 26:
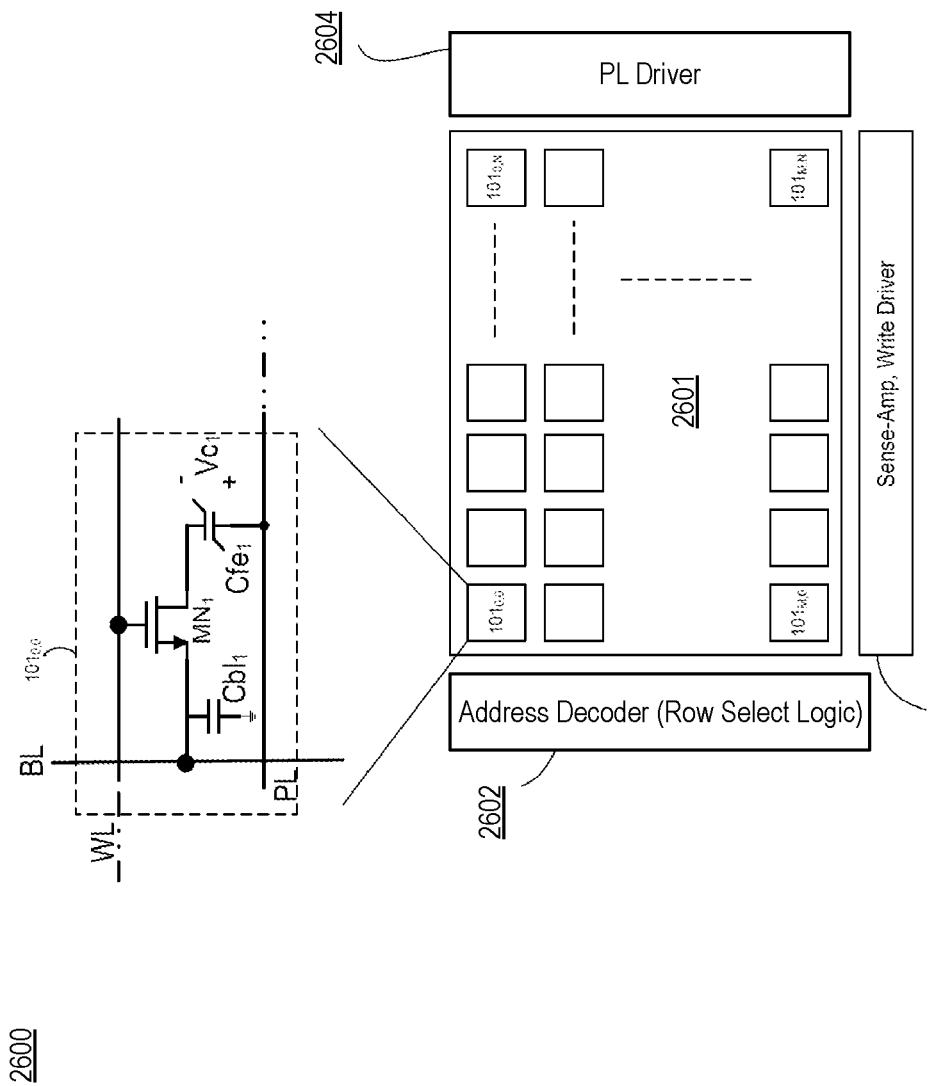
FIG. 26 illustrates an apparatus comprising memory and corresponding logic, wherein the memory comprises ferroelectric (FE) memory bit-cells, in accordance with some embodiments.

FIG. 26 illustrates apparatus 2600 comprising memory and corresponding logic, wherein the memory comprises ferroelectric (FE) memory bit-cells, in accordance with some embodiments. Apparatus 2600 comprises M×N memory array 2601 of bit-cells, logic circuitry 2602 for address decoding, sense amplifier and write drivers 2603, and plate-line (PL) driver 2604. Logic circuitry 2602 comprises address decoders for selecting a row of bit-cells and/or a particular bit-cell from M×N memory array 2601, where M and N are integers of same or different values. Logic circuitry 2602 comprises sense-amplifiers for reading the values from the selected bit-cell, while write drivers are used to write a particular value to a selected bit-cell. Here, a schematic of FE bit-cell $2601_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In some embodiments, bit-cell $2601_{0,0}$ comprises a word-line (WL), a plate-line (PL), a bit-line (BL), a complementary bit-line (BLB), and two half bit-cells $2601_{0,0\_A}$ and $2601_{0,0\_B}$. In some embodiments, bit-cell $2601_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, a BL capacitor $CBl_1$ is coupled to the source or drain terminal of first transistor $MN_1$ and to a reference node (e.g., ground such that the FE capacitor is not coupled to the same source or drain terminal. In some embodiments, the PL is parallel to the BL and orthogonal to the WL. In some embodiments, the PL is parallel to the WL and orthogonal to the BL.

In some embodiments, the FE capacitor is a planar capacitor. In some embodiments, the FE capacitor is a pillar or non-planar capacitor. In some embodiments, when the bit-cell is a 1TnC bit-cell, the FE capacitors are configured in a tower structure allowing the x-y foot-print to remain the same as for a 1T1C bit-cell but with taller bit-cell in the z-direction. In some embodiments, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 27:
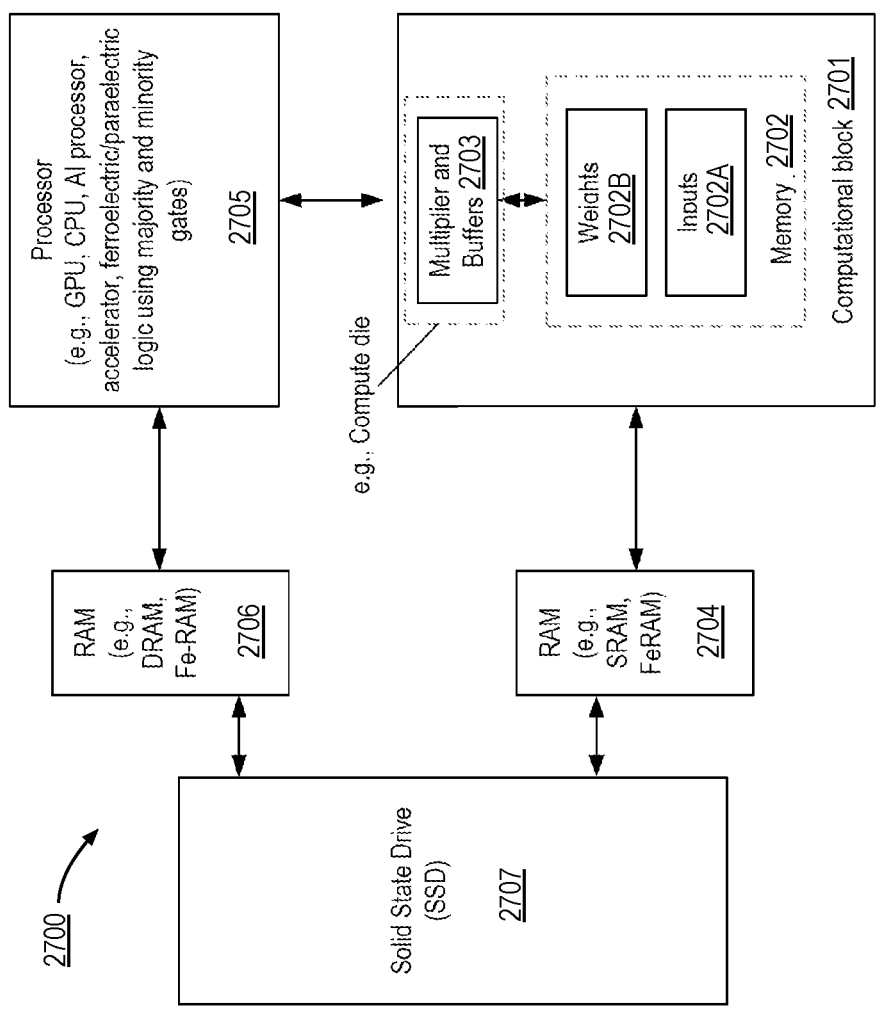
FIG. 27 illustrates a high-level architecture of an artificial intelligence (AI) machine comprising a compute die positioned on top of a memory die, in accordance with some embodiments.

FIG. 27 illustrates a high-level architecture of an artificial intelligence (AI) machine 2700 comprising a compute die positioned on top of a memory die, in accordance with some embodiments. AI machine 2700 comprises computational block 2701 or processor having memory 2702, such as random-access memory (RAM) 2702 and compute die 2703; first random-access memory 2704 (e.g., static RAM (SRAM), ferroelectric or paraelectric RAM (FeRAM), ferroelectric or paraelectric static random-access memory (FeSRAM)), main processor 2705, second random-access memory 2706 (dynamic RAM (DRAM), FeRAM), and solid-state memory or drive (SSD) 2707. In some embodiments, some or all components of AI machine 2700 are packaged in a single package forming a system-on-chip (SoC). The SoC can be configured as a logic-on-logic configuration, which can be in a 3D configuration or a 2.5D configuration.

In some embodiments, computational block 2701 is packaged in a single package and then coupled to main processor 2705 and first RAM 2704, second RAM 2706, and SSD 2707 on a printed circuit board (PCB). In some embodiments, computational block 2701 is configured as a logic-on-logic configuration, which can be in a 3D configuration or a 2.5D configuration. In some embodiments, computational block 2701 comprises a special purpose compute die 2703 or microprocessor. For example, compute die 2703 is a compute chiplet that performs a function of an accelerator or inference. In some embodiments, RAM 2702 is DRAM which forms a special memory/cache for the special purpose compute die 2703. The DRAM can be embedded DRAM (eDRAM), such as 1T-1C (one transistor and one capacitor) based memories. In some embodiments, RAM 2702 is ferroelectric or paraelectric RAM (Fe-RAM).

In some embodiments, compute die 2703 is specialized for applications, such as Artificial Intelligence, graph processing, and algorithms for data processing. In some embodiments, compute die 2703 further has logic computational blocks, for example, for multipliers and buffers, a special data memory block (e.g., buffers) comprising DRAM, FeRAM, or a combination of them. In some embodiments, RAM 2702 has weights and inputs stored in-order to improve the computational efficiency. The interconnects between main processor 2705 (also referred to as special purpose processor) first RAM 2704 and compute die 2703 are optimized for high bandwidth and low latency. The architecture of FIG. 27 allows efficient packaging to lower the energy, power, or cost, and provides for ultra-high bandwidth between RAM 2702 and compute die 2703 of computational block 2701.

In some embodiments, RAM 2702 is partitioned to store input data (or data to be processed) 2702A and weights 2702B. In some embodiments, input data 2702A is stored in a separate memory (e.g., a separate memory die) and weights 2702B are stored in a separate memory (e.g., separate memory die).

In some embodiments, computational logic or compute die 2703 comprises matrix multiplier, adder, concatenation logic, buffers, and combinational logic. In various embodiments, compute die 2703 performs multiplication operation on input data 2702A and weights 2702B. In some embodiments, weights 2702B are fixed weights. For example, main processor 2705 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2702. In various embodiments, the input data 2702A, that is to be analyzed using a trained model, is processed by computational block 2701 with computed weights 2702B to generate an output (e.g., a classification result).

In some embodiments, first RAM 2704 is ferroelectric or paraelectric based SRAM. For example, a six transistor (6T) SRAM bit-cells having ferroelectric or paraelectric transistors are used to implement a non-volatile FeSRAM. In some embodiments, SSD 2707 comprises NAND flash cells. In some embodiments, SSD 2707 comprises NOR flash cells. In some embodiments, SSD 2707 comprises multi-threshold NAND flash cells.

In various embodiments, the non-volatility of FeRAM is used to introduce new features, such as security, functional safety, and faster reboot time of AI machine 2700. The non-volatile FeRAM is a low power RAM that provides fast access to data and weights. First RAM 2704 can also serve as a fast storage for inference die (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 2700 mV). Threshold in the FE material has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by lanthanides). In various embodiments, when the FE material is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites, such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc., may be used for FE material. Perovskites can be suitably doped to achieve a spontaneous distortion in a range of 0.3 to 2%. For chemically substituted BiFeO3, BrCrO3, BuCoO3 class of materials, La or rare earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when the FE material is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OsO_2$, or $ReO_3$. In some embodiments, the perovskite is doped with La or lanthanides. In some embodiments, thin layer (e.g., approximately 10 nm) perovskite template conductors, such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O.

In some embodiments, the FE material comprises one or more of: hafnium (Hf), zirconium (Zr), aluminum (Al), silicon (Si), their oxides or their alloyed oxides. In some embodiments, the FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes one or more of: bismuth ferrite (BFO), or BFO with doping material.

In some embodiments, the FE material includes bismuth ferrite (BFO), BFO with a doping material where in the doping material is one of lanthanum, or any element from the lanthanide series of the periodic table. In some embodiments, the FE material includes a relaxor ferro-electric includes one of BARIUM titanium-Bismuth zinc niobium TANTALUM (BT-BZNT) or barium titanium-barium strontium titanium (BT-BST).

In some embodiments, the FE material includes hafnium oxides of the form, Hf1-x Ex Oy where E can be Al, Ca, Ce, Dy, Er, Gd, Ge, La, Sc, Si, Sr, Sn, or Y. In some embodiments, the FE material includes niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, the FE material comprises organic material. For example, polyvinylidene fluoride or polyvinylidene difluoride (PVDF).

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism, such as strain or buckling of the atomic order. Examples of improper FE material are LuFeO3 class of materials or super lattice of ferroelectric and paraelectric materials SnTiO3 (STO), respectively, and LaAlO3 (LAO) and STO, respectively. For example, a super lattice of [PTO/STO]n or [LAO/STO]n, where 'n' is between 1 to 2700. While various embodiments here are described with reference to ferroelectric material for storing the charge state, the embodiments are also applicable for paraelectric material. In some embodiments, paraelectric material includes one of: SrTiO3, Ba(x)Sr(y)TiO3 (where x is −0.5, and y is 0.95), HfZrO2, Hf—Si—O.

Figure 28:
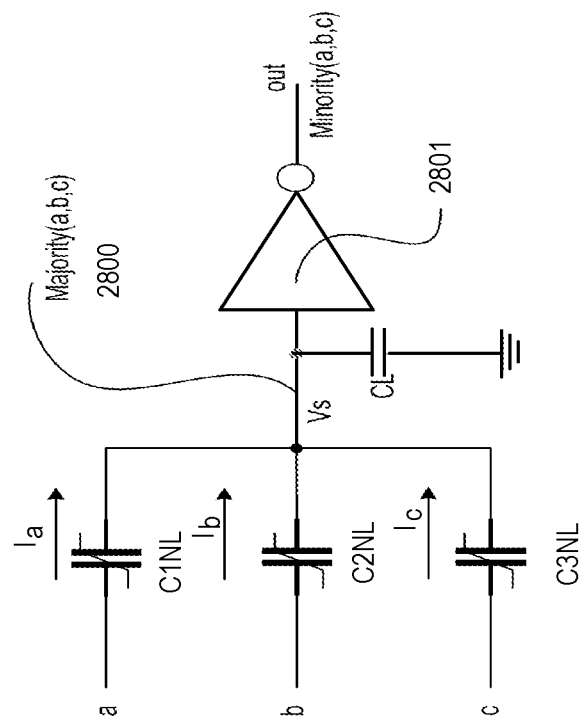
FIG. 28 illustrates a 3-input majority gate using non-linear input capacitors, in accordance with some embodiments.

FIG. 28 illustrates 3-input majority gate 2800 using non-linear input capacitors, in accordance with some embodiments. In some embodiments, 3-input majority gate 2800 comprises non-linear input capacitors C1n1, C2n1, and C3n1 that receives digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1, as shown. In some embodiments, 3-input majority gate 2800 comprises a driver circuitry 2801. In this example, driver circuitry 2801 is an inverter. In other embodiments, other types of driver circuitries can be used, such as NAND gate, NOR gate, multiplexer, buffer, and other logic gates. The majority function is performed at summing node Vs as Majority(a,b,c). In this example, since driver circuitry 2801 is an inverter, minority function is performed at output "out" as Minority(a,b,c).

In some embodiments, in addition to the gate capacitance of driver circuitry 2801, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, paraelectric capacitor, or non-linear dielectric capacitor. A dielectric capacitor comprises first and second metal plates with a dielectric between them. Examples of such dielectrics are: HfOX, ABO3 perovskites, nitrides, oxy-fluorides, oxides, etc. A paraelectric capacitor comprises first and second metal plates with a paraelectric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitors. The capacitor CL can be implemented as MIM (metal-insulator-metal) capacitor technology, transistor gate capacitor, or hybrid of metal capacitors or transistor capacitor.

In some embodiments, the non-linear input capacitors C1n1, C2n1, and C3n1 comprise non-linear polar material. In some embodiments, the non-linear polar material includes one of: ferroelectric (FE) material, paraelectric material, relaxor ferroelectric, or non-linear dielectric. In various embodiments, paraelectric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as paraelectric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O.

In various embodiments, the FE material can be any suitable low voltage FE material that allows the FE material to switch its state by a low voltage (e.g., 100 mV). In some embodiments, the FE material comprises a perovskite of the type ABO₃, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by lanthanides). Perovskites can be suitably doped to achieve a spontaneous distortion in a range of 0.3 to 2%. For example, for chemically substituted lead titanate, such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion. In some embodiments, perovskite includes one of: BaTiO3, KNbO3, or NaTaO3.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O2₈, LaNiO3, and ReO3.

In some embodiments, the FE material comprises a stack of layers including low voltage FE material between (or sandwiched between) conductive oxides. In various embodiments, when FE material is a perovskite, the conductive oxides are of the type AA'BB'O₃. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, FE material comprises improper FE material. An improper ferroelectric is a ferroelectric where the primary order parameter is an order mechanism, such as strain or buckling of the atomic order. Examples of improper FE material are LuFeO3 class of materials or super lattice of ferroelectric and paraelectric materials. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: hafnium (Hf), zirconium (Zr), aluminum (Al), silicon (Si), their oxides or their alloyed oxides. In some embodiments, FE material includes one of: Al(1-x)Sc(x)N, Ga(1-x)Sc(x)N, Al(1-x)Y(x)N, or Al(1-x-y)Mg(x)Nb(y)N, y doped HfO2, where y includes one of: Al, Ca, Ce, Dy, Er, Gd, Ge, La, Sc, Si, Sr, Sn, or Y, wherein 'x' is a fraction. In some embodiments, the FE material includes bismuth ferrite (BFO) or BFO with doping material.

In some embodiments, the FE material includes Bismuth ferrite (BFO), BFO with a doping material where in the doping material is one of lanthanum, or any element from the lanthanide series of the periodic table. In some embodiments, the FE material includes a relaxor ferroelectric including one of barium titanium-bismuth zinc niobium tantalum (BT-BZNT), or barium titanium-barium strontium titanium (BT-BST).

In some embodiments, the FE material includes Hafnium oxides of the form, Hf1-x Ex Oy where E can be Al, Ca, Ce, Dy, Er, Gd, Ge, La, Sc, Si, Sr, Sn, or Y. In some embodiments, FE material includes Niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO.

Examples of spinels include Fe3O4 and LiV2O4. Examples of cubic metals include indium tin oxide (ITO) such as Sn-doped In2O3.

The charge developed on node Vs produces a voltage and current that is the output of the majority gate 2800. Any suitable driver circuitry 2801 can drive this output. For example, a non-FE logic, FE logic, CMOS logic, BJT logic, etc., can be used to drive the output to a downstream logic. Examples of the drivers include inverters, buffers, NAND gates, NOR gates, XOR gates, amplifiers, comparators, digital-to-analog converters, analog-to-digital converters, multiplexers, etc. The majority function is performed at the summing node Vs, and the resulting voltage is projected on to capacitance of driver circuitry 2801. For example, the majority function of the currents ($I_a$, $I_b$, and $I_c$) on node Vs results in a resultant current that charges capacitor. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 2800. Any suitable driver circuitry 2801 can drive this output. For example, a non-FE logic, FE logic, CMOS logic, BJT logic, etc., can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 28 illustrates a 3-input majority gate, the same concept can be extended to more than 3 inputs to make an N-input majority gate, where N is greater than 2. In various embodiments, 'N' is an odd number. For example, a 5-input majority gate is like an input majority gate 2800 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configurate the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 2801 can be replaced with another majority or minority gate. In one such embodiment, the storage node Vs is directly coupled to a non-linear capacitor of another majority or minority gate.

Any logic function can be represented by two levels of logic as given by the min-term expansion:

where is either 0 or 1. When is 1, (the input is used in its original form). When is 0 (the input is used in its inverted form). The first level of logic is represented by at most AND gates, one for each of the possible combinations of 0 and 1 for. The second level of logic is represented by a single OR gate (V). Each operand of the OR gate is a representation of a row in the truth table for.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 29:
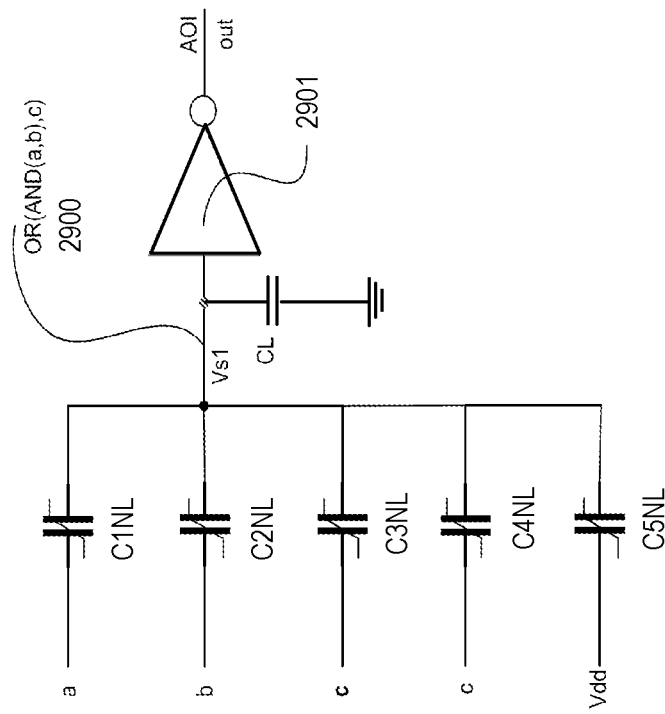
FIG. 29 illustrates a complex logic gate implemented using a 5-input majority gate, in accordance with some embodiments.

FIG. 29 illustrates complex logic gate 2900 implemented using a 5-input majority gate, in accordance with some embodiments. In some embodiments, an AOI (and-or-invert) logic comprises a 5-input majority gate. The 5-input majority gate includes non-linear capacitors C1n1, C2n1, C3n1, C4n1, and C5n1 and driving circuitry 2901 coupled as shown. In various embodiments, two of the non-linear capacitors receive the same input. Here, capacitors C3n1 and C4n1 receive input 'c'. In various embodiments, C5n1 is coupled to Vdd to produce an OR function at node Vs, where the OR function is OR(AND(a,b),c). In some embodiments, other logic gates can be realized by changing Vdd to ground for capacitor C5n1, and/or changing other inputs.

The method of forming the structures described herein are applicable to various logic embodiments. For example, the FeRAM devices or capacitive structures formed herein can be used to forming other ferroelectric/paraelectric circuits. These circuits can be implemented by majority gate, minority gate, and/or threshold gate.

FIG. 30A illustrates a multi-element FE gain bit-cell 3000 with plate-lines parallel to the bit-line, in accordance with some embodiments of the disclosure. In some embodiments, bit-cell 3000 (e.g., 3001$_{0,0}$) comprises n-type select transistor $MN_1$, n-type transistor $MTR_1$, bit-line (BL), word-line (WL), sense-line (SL), and 'n' number of ferroelectric (or paraelectric) capacitors Cfe1 through Cfen. In various embodiments, the gate terminal of the n-type transistor $MN_1$ is coupled to WL (e.g., WL1). In some embodiments, the drain or source terminal of the n-type transistor $MN_1$ is coupled to BL. In various embodiments, first terminals of each of the capacitors Cfe1 through Cfen is coupled to a storage node sn1. The storage node sn1 is coupled to a source or drain terminal of n-type transistor $MN_1$ and to a gate of transistor $MTR_1$. In various embodiments, drain or source terminal of $MTR_1$ is coupled to a bias voltage Vs. In some embodiments, Vs is a programmable voltage that can be generated by any suitable source. Vs voltage helps in biasing the gain transistor in conjunction with the sense-voltage that builds at sn1 node. In some embodiments, the source or drain terminal of transistor $MTR_1$ is coupled to SL (e.g., SL1). In some embodiments, a p-type transistor can be used as well for gain.

In some embodiments, second terminals of each of the capacitors Cfe1 through Cfen are coupled to a corresponding plate-line (PL). For example, the second terminal of Cfe1 is coupled to PL0_1, the second terminal of Cfe2 is coupled to PL0_2, and so on. Multi-element FE gain bit-cell 3000 has n-number of PLs (e.g., PL0_1 through PL0_n) per column which are parallel to a BL for that column, in accordance with some embodiments. In some embodiments, the SL is parallel to the PL. In some embodiments, the SL is parallel to the WL.

In some embodiments, ferroelectric (or paraelectric) capacitors Cfe1 through Cfen are planar capacitors such as those discussed with reference to various embodiments herein. In some embodiments, ferroelectric (or paraelectric) capacitors Cfe1 through Cfen are pillar capacitors such as those discussed with reference to various embodiments herein. In some embodiments, the ferroelectric (or paraelectric) capacitors Cfe1 through Cfen are vertically stacked and horizontally folded allowing for tall bit-cells (e.g., higher in the z-direction) but with x-y footprint of two transistors. By folding the capacitors, the diffusion capacitance on the BL reduces for a given array size, which improves reading speed. Further, folding the capacitors lowers the effective routing capacitance on the BL. The larger footprint in the x-y direction of multi-element FE gain bit-cell compared to the footprint in the x-y direction of 1TnC bit-cell, vertical height of the capacitor can be reduced as the capacitors can expand in the x-y direction more than before for a given height. As such, capacitors are folded more effectively. For example, n/2 capacitors per metal or via layer can be packed. In various embodiments, more capacitors can be stacked in multi-element FE gain bit-cell because storage node sn1 is decoupled from the BL. The multi-element FE gain bit-cell reduces the thickness scaling requirement for the pillar capacitor. The polarization density requirements are reduced for multi-element FE gain bit-cell compared to 1TnC bit-cell.

In this example, the x-y footprint is determined by the size of transistor $MN_1$ and its connections to BL, WL, and storage node sn1. In some embodiments, the footprint can still be decided by other factors such as: a number of capacitors that connect to the node; how the capacitors are arranged, e.g., more folding on the same node versus stacking; effective size constraints on those capacitors; and number of capacitors that share the same bit-cell. In some embodiments, PL (e.g., PL0_1, PL0_2, ... PL_n) controls which cell within the same access transistor gets programmed, and the value of programming. In some embodiments, BL acts as a sense-line. The voltage on BL (e.g., sense voltage) can create disturbance on other bit-lines during read operation. To mitigate such disturbances, in some embodiments, multi-element FE gain bit-cell (e.g., 3001$_{,0}$) is periodically refreshed (e.g., every 1 second). In some embodiments, periodic refresh is minimized by refreshing in active mode of operation that can be coupled with advanced schemes for wear leveling. In standby mode (e.g., low power mode), multi-element FE gain bit-cell (e.g., 3001$_{,0}$) is not refreshed as there is no disturb mechanism during standby. In some embodiments, multi-element FE gain bit-cell (e.g., 3001$_{,0}$) relies on isolating the read mode from BL or SL capacitance by isolating through access transistor $MN_1$, where $MN_1$ transistor facilitates pre-charging the sn1 node, prior to read operation.

In some embodiments, there is a possibility of disturbance at the storage node sn1 during read operation. In some embodiments, PL is toggled for other capacitors to the average value of the disturbance that will be seen on the sn1 node, i.e., when a read pulse of some polarity is applied at PL of the capacitor to be read, a non-zero voltage is applied on other PLs of multi-element FE gain bit-cell (e.g., $3001_{0,0}$), that matches the expected disturbance seen on the shared node. In one such example, the PL driver is configured to support driving different voltage levels on different PLs, FIG. 30B illustrates a multi-element FE gain bit-cell 3020 with plate-lines parallel to the word-line, in accordance with some embodiments of the disclosure. Multi-element FE gain bit-cell 3020 is similar to multi-element FE gain bit-cell 3000 but plate-lines are parallel to the word line.

Figure 31A:
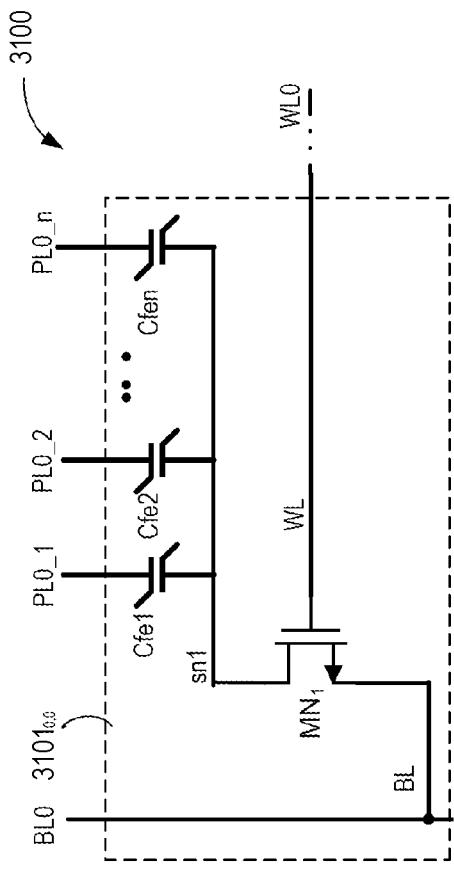
FIG. 31A illustrates a 1TnC bit-cell comprising non-linear polar material for its capacitors, where the plate-lines are parallel to the bit-line, in accordance with some embodiments.

FIG. 31A illustrates 1TnC bit-cell 3100 comprising non-linear polar material for its capacitors, where plate-lines are parallel to the bit-line, in accordance with some embodiments. In some embodiments, 1TnC bit-cell 3100 (e.g., $3101_{0,0}$) comprises one select transistor $MN_1$ and a plurality of capacitors Cfe1, Cfe2, through Cfen (where 'n' is a number greater than 1) comprising non-linear polar material (e.g., ferroelectric, paraelectric, or non-linear dielectric). The capacitors can be a planar or non-planar capacitor as described with reference to various embodiments. In some embodiments, the plurality of capacitors Cfe1, Cfe2, through Cfen are stacked and folded capacitors.

The gate terminal of transistors $MN_1$ is controllable by WL. In some embodiments, BL is coupled to a source or drain terminal of transistor $MN_1$. In some embodiments, an individual PL of a plurality of PLs is coupled to an individual capacitor. For example, capacitor Cfe1 is coupled to plate-line PL0_1, capacitor Cfe2 is coupled to plate_line PL0_2, and capacitor Cfen is coupled to plate_line PL0_n. In some embodiments, the plurality of capacitors is coupled to storage node sn1, which is coupled to a drain or source terminal of transistor $MN_1$. For example, a first terminal of capacitor Cfe1 is coupled to PL0_1 and a second terminal of capacitor Cfe1 is coupled to storage node sn1. In some embodiments, 1TnC bit-cell 3100 has n-number of PLs (e.g., PL0_1 through PL0_n) per column which are parallel to a BL for that column.

While the various embodiments are illustrated with reference to an n-type transistor, the embodiments are also applicable to a p-type transistor or a combination of n-type or p-type transistors. A person skilled in the art would appreciate that when a transistor of a different conductivity type is used than what is shown in FIG. 31A, then driving logic for BL, PLs, and/or WL may also change for proper read and/or write operations. In various embodiments, PLs are parallel to BL. For example, PL0_1, PL0_2, PL0_n are parallel to BL. In some embodiments, transistor $MN_1$ is fabricated on the front end of the die and capacitors are stacked over the transistor. For example, the capacitors are stacked along the z-direction and folded along the x-axis. The capacitors can be planar or non-planar capacitors. As such, a taller and wider bit-cell is formed with a footprint comparable to the footprint of the transistor $MN_1$. In some embodiments, the x-y footprint is determined by the size of transistor $MN_1$ and its connections to BL, WL, and storage node sn1.

In some embodiments, PL (e.g., PL0_1, PL0_2, . . . PL0_n) controls which capacitor of the bit-cell is programmed, and the value of programming. In some embodiments, BL acts as a sense-line. The voltage on BL (e.g., sense voltage) can create disturbance on other bit-lines during read operation. To mitigate such disturbances, in some embodiments, the 1TnC bit-cell is periodically refreshed (e.g., every 1 second). In some embodiments, periodic refresh is minimized by refreshing in active mode of operation. In some embodiments, in standby mode (e.g., low power mode), the 1TnC bit-cell is not refreshed as there is no disturb mechanism during standby.

In the 1TnC bit-cell case (e.g., bit-cell $3101_{0,0}$) with PL parallel to BL, the activities seen on an unselected or un-intended bit-cell while performing read/write operations on the same column as that of the selected bit-cell can have large disturb effects on the unselected or unintended bit-cells. This may be true if the PL within the same column toggles (during read or write) a particular value to the desired bit-cell. This signal on the PL of that column, which is shared with other unselected cells, can create a field across the non-linear polar material based capacitors or devices of the unselected cells. The field across the unselected non-linear polar material based capacitors or devices is a function of the dielectric component of individual non-linear polar material based capacitors or devices and the total capacitance on the storage node sn1 of those bit-cells. Since in the 1TnC bit-cells the storage capacitor has much larger capacitance load, the activity seen on the unselected bit-line can result in almost all voltage getting dropped across the ferroelectric capacitors (e.g., Vfe=Vp1*(Cp/(Cfed+Cp), which creates a disturb effect, which in turn causes unintentional modification of the polarization stage of the ferroelectric capacitor.

Figure 31B:
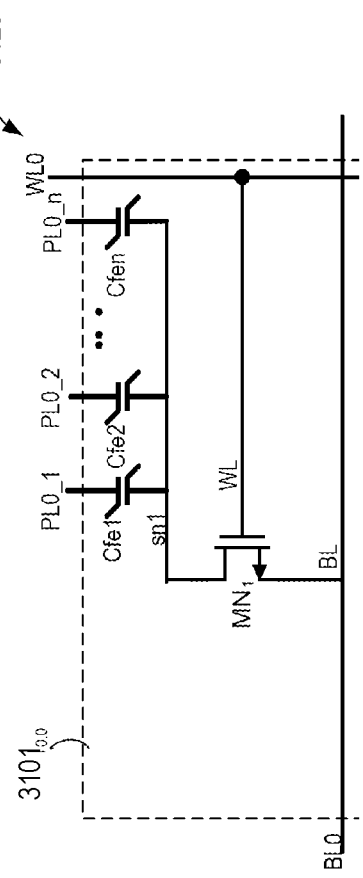
FIG. 31B illustrates a 1TnC bit-cell comprising non-linear polar material for its capacitors, where the plate-lines are parallel to the word-line, in accordance with some embodiments.

FIG. 31B illustrates 1TnC bit-cell 3120 comprising non-linear polar material for its capacitors, where plate-lines are parallel to the word-line, in accordance with some embodiments. 1TnC bit-cell 3120 is similar to 1TnC bit-cell 3100 but plate-lines are parallel to the word line.

Following examples are provided that illustrate the various embodiments. The examples can be combined with other examples. As such, various embodiments can be combined with other examples without changing the scope of the invention.

Example 1: A method of fabricating a system, the method comprising: fabricating a plurality of transistors within a first level, wherein individual ones of the plurality of transistors comprise a source, a drain, a gate between the source and the drain, a drain contact coupled with the drain and a gate contact coupled with the gate; forming a bridge structure connected between the gate contact of a first transistor in the plurality of transistors to the drain contact of a second transistor in the plurality of transistors; forming an electrode structure by forming an opening in an etch stop layer deposited above the bridge structure and by filling the opening with a conductive material, wherein the electrode structure is coupled with the bridge structure; depositing an electrode layer on the electrode structure; forming a first plurality of memory devices on the electrode layer by depositing and etching a material layer stack comprising a ferroelectric material or a paraelectric material; etching the electrode layer to form a first plate electrode; forming a signal electrode on the first plate electrode, wherein the signal electrode is formed between a pair of memory devices of the individual ones of the first plurality of memory devices; forming a second plate electrode above and coupled with the signal electrode; and forming a second plurality of memory devices on the second plate electrode.

Example 2: The method of example 1, wherein forming the first plate electrode comprises etching portions of the electrode layer to form the first plate electrode that extends beyond a perimeter of the individual ones of the plurality of transistors and the electrode structure.

Example 3: The method of example 1, further comprising: forming a first plurality of via electrodes, wherein individual ones of the first plurality of via electrodes are formed on an individual ones of the first plurality of memory devices; and forming a second plurality of via electrodes, wherein individual ones of the second plurality of via electrodes are formed on an individual ones of the second plurality of memory devices.

Example 4: The method of example 3, further comprising forming a first plurality of conductive vias, wherein individual ones of the first plurality of conductive vias are formed on individual ones of via electrodes in the first plurality of via electrodes and on the signal electrode.

Example 5: The method of example 1, wherein forming the signal electrode further comprises forming between an equal number of memory devices in the first plurality of memory devices on either side.

Example 6: The method of example 1, wherein etching to form the first plurality of memory devices comprises partially recessing the electrode layer to form the electrode layer having a variable thickness.

Example 7: The method of example 4, wherein immediately after forming the first plurality of conductive vias, the method further comprises: depositing a second etch stop layer above the first plurality of conductive vias; forming a second electrode structure coupled with the via electrode on the signal electrode, wherein forming the second electrode structure comprises forming a second opening in the second etch stop layer and by filling the opening with the conductive material; planarizing to form the second electrode structure; and depositing a material of the electrode layer on the second electrode structure.

Example 8: The method of example 7, wherein the material layer stack is a first material layer stack, wherein the electrode layer is a first electrode layer, and wherein forming the second plate electrode and the second plurality of memory devices further comprises: depositing a second electrode layer on the second electrode structure; depositing a second material layer stack on the second electrode structure and patterning the second material layer stack to form the second plurality of memory devices; and etching portions of the material of the second electrode layer to form the second plate electrode, wherein the second plate electrode extends beyond a perimeter of the individual ones of the plurality of transistors.

Example 9: The method of example 4, wherein forming the first plurality of via electrodes further comprises depositing a first dielectric above the first plurality of memory devices and forming a first via opening above individual ones of the first plurality of memory devices and depositing at least a first conductive hydrogen barrier material in the first via opening.

Example 10: The method of example 3, wherein forming the second plurality of via electrodes further comprises depositing a second dielectric above the second plurality of memory devices and forming a second via opening above individual ones of the second plurality of memory devices and depositing at least a second conductive hydrogen barrier material in the second via opening.

Example 11: The method of example 8, further comprising: forming a first dielectric spacer adjacent to individual ones of the first plurality of memory devices prior to etching the electrode layer, and forming a second dielectric spacer adjacent to the individual ones of the second plurality of memory devices prior to etching the second electrode layer.

Example 12: The method of example 9, wherein forming the first plurality of conductive vias further comprises depositing a third dielectric on the first dielectric, wherein the third dielectric comprises a material that is different from the first dielectric.

Example 13: The method of example 8, wherein depositing the first material layer stack and the second material layer stack comprises: depositing the ferroelectric material comprising one of: bismuth ferrite (BFO), BFO with a first doping material where in the first doping material is one of lanthanum, or elements from lanthanide series of periodic table; lead zirconium titanate (PZT), or PZT with a second doping material, wherein the second doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y (x)N or Al(1-x-y)Mg(x)Nb(y)N, y doped HfO2, where y includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100; or depositing the paraelectric material comprising SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 14: A method of fabricating a system, the method comprising: fabricating a plurality of transistors in a first level, wherein individual ones of the plurality of transistors comprise: a source; a drain; a gate between the source and the drain; and a drain contact coupled with the drain; and a gate contact coupled with the gate; forming a bridge structure connected between the gate contact of a first transistor in the plurality of transistors to the drain contact of a second transistor in the plurality of transistors; forming an electrode structure by forming an opening in an etch stop layer deposited above the bridge structure and by filling the opening with a conductive material, forming a first plurality of memory devices by depositing a first material layer stack comprising a first ferroelectric material or a first paraelectric material above a first electrode layer and etching the first material layer stack; depositing a first encapsulation layer on the first plurality of memory devices and on the first electrode layer; forming a first plate electrode; forming a signal electrode on the first plate electrode, wherein the signal electrode is formed between a pair of memory devices of the individual ones of the first plurality of memory devices; forming a second plurality of memory devices by depositing a second material layer stack comprising a second ferroelectric material or a second paraelectric material above a second electrode layer and etching the second material layer stack, wherein the second electrode layer is coupled with the signal electrode; depositing a second encapsulation layer on the second plurality of memory devices and on the second electrode layer; forming a second plate electrode.

Example 15: The method of example 14, wherein forming the first plate electrode further comprises: forming a first mask over the first encapsulation layer; and using the first mask to etch the first encapsulation layer and the first electrode layer to form the first plate electrode comprising a first perimeter that is substantially aligned with a second perimeter of the first encapsulation layer and wherein the first plate electrode extends beyond sidewalls of the first plurality of memory devices.

Example 16: The method of example 14, wherein forming the second plate electrode further comprises: forming a second mask over the second encapsulation layer; and using the second mask to etch the second encapsulation layer and the second electrode layer to form the second plate electrode comprising a third perimeter that is substantially aligned with a fourth perimeter of the second encapsulation layer and wherein the second plate electrode extends beyond sidewalls of the second plurality of memory devices.

Example 17: The method of example 14, wherein depositing the first encapsulation layer comprises conformally depositing a material comprising silicon nitride, carbon doped silicon nitride, $Al_xO_y$, $HfO_x$, $ZrO_x$, $TaO_x$, $TiO_x$, $AlSiO_x$, $HfSiO_x$ or $TaSiO_x$ on the first plurality of memory devices and on the first electrode layer, and wherein depositing the second encapsulation layer comprises conformally depositing a material comprising silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$ on the second plurality of memory devices and on the second electrode layer.

Example 18: The method of example 14, wherein the method comprises forming the first plurality of memory devices on a first plane and wherein the method further comprises forming a third plurality of memory devices on a second plane behind the first plane, wherein the first plurality of memory devices and the third plurality of memory devices are formed on a same level; and wherein the method comprises forming the second plurality of memory devices on the first plane and wherein the method further comprises forming a fourth plurality of memory devices on the second plane behind the first plane.

Example 19: A method of fabricating a system, the method comprising: fabricating a plurality of transistors in a first level, wherein individual ones of the plurality of transistors comprise: a source; a drain; a gate between the source and the drain; and a drain contact coupled with the drain; and a gate contact coupled with the gate; forming a bridge structure connected between the gate contact of a first transistor in the plurality of transistors to the drain contact of a second transistor in the plurality of transistors; forming a conductive interconnect in a first dielectric, wherein the conductive interconnect is coupled with the bridge structure; depositing an etch stop layer on the first dielectric and on the conductive interconnect; forming a first electrode structure on the conductive interconnect by a first process comprising: etching a first opening in the etch stop layer; and depositing a first conductive hydrogen barrier layer and a first conductive material in the first opening; depositing a first electrode layer on the first electrode structure and on the etch stop layer; forming a first plurality of memory devices by depositing a first material layer stack comprising a first ferroelectric material, a first paraelectric material or a first anti-ferroelectric material on the first electrode layer and etching the first material layer stack; depositing a first encapsulation layer on the first plurality of memory devices and on the first electrode layer; etching the first electrode layer and the first encapsulation layer to form a first plate electrode extending beyond sidewalls of the first plurality of memory devices; depositing a second encapsulation layer on the first encapsulation layer, on sidewalls of the first plate electrode and on the etch stop layer; depositing a second dielectric on the second encapsulation layer; forming a signal electrode on the first plate electrode by etching the second dielectric and the first encapsulation layer; forming a first plurality of via electrodes, wherein individual ones of the first plurality of via electrodes are formed on an individual ones of the first plurality of memory devices by a second process comprising: forming a second opening in the second dielectric and in the first encapsulation layer and in the second encapsulation layer; depositing a second conductive hydrogen barrier layer and a second conductive material in the second opening; forming a second electrode structure coupled with the signal electrode; depositing a second electrode layer on the second electrode structure, wherein the second electrode layer is above the first plurality of via electrodes; forming a second plurality of memory devices by depositing a second material layer stack comprising a second ferroelectric material, a second paraelectric material or a second anti-ferroelectric material on the second electrode layer and etching the second material layer stack; depositing a third encapsulation layer on the second plurality of memory devices and on the second electrode layer; etching the second electrode layer and the third encapsulation layer to form a second plate electrode extending beyond sidewalls of the second plurality of memory devices; depositing a fourth encapsulation layer on the second encapsulation layer, on sidewalls of the second plate electrode; and forming a second plurality of vias on individual ones of the second plurality of memory devices.

Example 20: The method of example 19, wherein depositing the first encapsulation layer and the second encapsulation layer comprise depositing substantially conformally by a physical vapor deposition or an atomic layer deposition process, and further wherein depositing the first encapsulation layer and the second encapsulation layer comprising depositing to a thickness that is less than two times a spacing between adjacent memory devices of the first and of the second plurality of memory devices.

Example 1a: A method of fabricating a system, the method comprising: fabricating a plurality of transistors within a first level, wherein individual ones of the plurality of transistors comprise a source, a drain, a gate between the source and the drain, a drain contact coupled with the drain and a gate contact coupled with the gate; forming a bridge structure connected between the gate contact of a first transistor in the plurality of transistors to the drain contact of a second transistor in the plurality of transistors; forming a first plate electrode above and coupled with the bridge structure, the first plate electrode; forming a first plurality of trench capacitors within a first dielectric on the first plate electrode wherein individual ones of the first plurality of trench capacitors comprise a first dielectric layer comprising a perovskite material; forming a signal electrode on the first plate electrode between a pair of trench capacitors of the individual ones of the first plurality of trench capacitors; forming a second plate electrode above and coupled with the signal electrode; and forming a second plurality of trench capacitors within a second dielectric on the second plate electrode wherein individual ones of the second plurality of trench capacitors comprise a second dielectric layer comprising the perovskite material.

Example 2a: The method of example 1a, wherein prior to forming the first plate electrode, the method further comprises: forming a conductive interconnect coupled with the bridge structure; forming a first electrode structure on the conductive interconnect by forming an opening in a first etch stop layer deposited on the conductive interconnect and by filling the opening with a conductive material; and depositing a first conductive layer on the first electrode structure; and wherein forming the first plate electrode further comprises etching the first conductive layer.

Example 3a: The method of example 2a, wherein prior to forming the second plate electrode, the method further comprises: forming a second electrode structure on the signal electrode by forming an opening in a second etch stop layer deposited on the signal electrode and by filling the opening with the conductive material; and depositing a second conductive layer on the signal electrode; and wherein forming the second plate electrode further comprises etching the second conductive layer.

Example 4a: The method of example 1a, wherein forming the first plurality of trench capacitors comprises: etching the first dielectric to form a first plurality of trenches, and exposing first portions of the first plate electrode; forming a first dielectric spacer on sidewalls of individual ones of the first plurality of trenches; depositing a first electrode layer on a first base of the individual ones of the first plurality of trenches and adjacent to the first dielectric spacer, wherein the first electrode layer comprises a first conductive nonlinear polar material; depositing the first dielectric layer comprising the perovskite material on the first electrode layer; and depositing a second electrode layer on the first dielectric layer, wherein the second electrode layer comprises a second conductive nonlinear polar material.

Example 5a: The method of example 4a, wherein forming the second plurality of trench capacitors comprises: etching the second dielectric to form a second plurality of trenches, and exposing second portions of the second plate electrode; forming a second dielectric spacer on sidewalls of individual ones of the second plurality of trenches; depositing a third electrode layer on a second base of the individual ones of the second plurality of trenches and adjacent to the second dielectric spacer, wherein the third electrode layer comprises the first conductive nonlinear polar material; depositing the second dielectric layer comprising the perovskite material on the third electrode layer; and depositing a fourth electrode layer on the second dielectric layer, wherein the fourth electrode layer comprises the second conductive nonlinear polar material.

Example 6a: The method of example 1a further comprising: forming a first plurality of via electrodes on the individual ones of the first plurality of trench capacitors by depositing a third dielectric on the first plurality of trench capacitors and on the first dielectric and forming a first plurality of openings in the third dielectric; and forming a second plurality of via electrodes on the individual ones of the second plurality of trench capacitors by depositing a fourth dielectric on the second plurality of trench capacitors and on the second dielectric and forming a second plurality of openings in the third dielectric.

Example 7a: The method of example 6a, further comprising forming a plurality of conductive vias, wherein individual ones of the plurality of conductive vias are formed on individual ones of the first plurality of via electrodes, and on the signal electrode, and wherein forming the plurality of conductive vias further comprises depositing a fifth dielectric on the third dielectric, and etching a third plurality of openings in the fifth dielectric.

Example 8a: The method of example 7a, wherein immediately after forming the plurality of conductive vias and prior to forming the second plate electrode, the method further comprises depositing a second etch stop layer above the plurality of conductive vias; forming a second electrode structure coupled with a conductive via of the plurality of conductive vias formed on the signal electrode, wherein forming the second electrode structure comprises forming an opening in the second etch stop layer and by filling the opening with a conductive material; and planarizing to form the second electrode structure.

Example 9a: The method of example 1a, wherein forming the signal electrode further comprises forming between an equal number of trench capacitors in the first plurality of trench capacitors on either side of the signal electrode.

Example 10a: The method of example 5a, wherein forming the first dielectric spacer comprises: conformally depositing a first insulator layer comprising silicon nitride, carbon doped silicon nitride, $Al_xO_y$, $HfO_x$, $ZrO_x$, $TaO_x$, $TiO_x$, $AlSiO_x$, $HfSiO_x$ or $TaSiO_x$ on the first base and on the sidewalls of the individual ones of the first plurality of trenches; and etching and removing the first insulator layer from the first base; and wherein forming the second dielectric spacer comprises: conformally depositing a second insulator layer comprising silicon nitride, carbon doped silicon nitride, $Al_xO_y$, $HfO_x$, $ZrO_x$, $TaO_x$, $TiO_x$, $AlSiO_x$, $HfSiO_x$ or $TaSiO_x$ on the second base and on the sidewalls of the individual ones of the second plurality of trenches; and etching and removing the second insulator layer from the second base.

Example 11a: The method of example 1a, wherein depositing the perovskite material comprises depositing one of: bismuth ferrite (BFO), BFO with a first doping material where in the first doping material is one of lanthanum, or elements from lanthanide series of periodic table; lead zirconium titanate (PZT), or PZT with a second doping material, wherein the second doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where y includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100; or a paraelectric material comprising SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 12a: The method of example 1a, wherein the signal electrode is a first signal electrode and the method further comprising: forming a second signal electrode on the second plate electrode between a pair of trench capacitors of the individual ones of the second plurality of trench capacitors; forming a third plate electrode above and coupled with the second signal electrode; and forming a third plurality of trench capacitors within a sixth dielectric on the third plate electrode, wherein individual ones of the third plurality of trench capacitors comprise a third dielectric layer comprising the perovskite material.

Example 13a: A method of fabricating a system, the method comprising: fabricating a plurality of transistors within a first level, wherein individual ones of the plurality of transistors comprise a source, a drain, a gate between the source and the drain, a drain contact coupled with the drain and a gate contact coupled with the gate; forming a bridge structure connected between the gate contact of a first transistor in the plurality of transistors to the drain contact of a second transistor in the plurality of transistors; forming a first plate electrode above and coupled with the bridge structure, the first plate electrode extending along a first direction; forming a first plurality of trench capacitors within a first dielectric on the first plate electrode wherein individual ones of the first plurality of trench capacitors comprise a first dielectric layer comprising a perovskite material and a first conductive hydrogen barrier layer, wherein the first conductive hydrogen barrier layer is in contact with the first plate electrode; forming a signal electrode on the first plate electrode between a pair of trench capacitors of the individual ones of the first plurality of trench capacitors; forming a second plate electrode above and coupled with the signal electrode; and forming a second plurality of trench capacitors within a second dielectric on the second plate electrode wherein individual ones of the second plurality of trench capacitors comprise a second dielectric layer comprising the perovskite material and a second conductive hydrogen barrier layer, wherein the second conductive hydrogen barrier layer is in contact with the second plate electrode.

Example 14a: The method of example 13a, wherein forming individual ones of the first plurality of trench capacitors comprises: etching the first dielectric to form a first trench, wherein the first trench exposes the first plate electrode; depositing the first conductive hydrogen barrier layer on a first base and along sidewalls of the first trench; depositing a first electrode layer on the first conductive hydrogen barrier layer, wherein the first electrode layer comprises a first conductive nonlinear polar material; depositing the first dielectric layer comprising the perovskite material on the first electrode layer; and depositing a second electrode layer on the first dielectric layer, wherein the second electrode layer comprises a second conductive nonlinear polar material.

Example 15a: The method of example 14a, wherein forming individual ones of the second plurality of trench capacitors comprises: etching the second dielectric to form a second trench, wherein the second trench exposes the second plate electrode; depositing the second conductive hydrogen barrier layer on a second base and along sidewalls of the second trench; depositing a third electrode layer on the second conductive hydrogen barrier layer, wherein the third electrode layer comprises a second conductive nonlinear polar material; depositing the second dielectric layer comprising the perovskite material on the third electrode layer; and depositing a fourth electrode layer on the second dielectric layer, wherein the fourth electrode layer comprises the second conductive nonlinear polar material.

Example 16a: The method of example 14a, wherein forming the first plurality of trench capacitors further comprises performing a chemical mechanical planarization process to form an uppermost surface comprising the second electrode layer surrounded by an annular ring of the first dielectric layer, wherein the annular ring of the first dielectric layer is further surrounded by the first electrode layer, and wherein the annular ring of the first electrode layer is further surrounded by the second conductive hydrogen barrier layer and wherein the second conductive hydrogen barrier layer, the first electrode layer and the first dielectric layer are a substantially U-shaped, and the second electrode layer is substantially cylindrical.

Example 17a: The method of example 13a, wherein forming the first plurality of trench capacitors further comprises forming on a first vertical plane and wherein the method further comprises forming a third plurality of trench capacitors on a second vertical plane behind the first vertical plane, wherein forming the second plurality of trench capacitors further comprises forming on the first vertical plane and wherein the method further comprises forming a fourth plurality of trench capacitors on the second vertical plane behind the first vertical plane.

Example 18a: The method of example 17a, wherein the signal electrode is formed on the first vertical plane, the second vertical plane, or on a third vertical plane between the first vertical plane and the second vertical plane.

Example 19a: A method of fabricating a system, the method comprising: fabricating a plurality of transistors within a first level, wherein individual ones of the plurality of transistors comprise a source, a drain, a gate between the source and the drain, a drain contact coupled with the drain and a gate contact coupled with the gate; forming a bridge structure connected between the gate contact of a first transistor in the plurality of transistors to the drain contact of a second transistor in the plurality of transistors; forming a first plate electrode above and coupled with the bridge structure; depositing a first encapsulation layer on the first plate electrode; depositing a first dielectric on the first encapsulation layer; forming a first plurality of trench capacitors within the first dielectric and the first encapsulation layer, wherein individual ones of the first plurality of trench capacitors comprise a first dielectric layer comprising a perovskite material; forming a signal electrode on the first plate electrode between a pair of trench capacitors of the individual ones of the first plurality of trench capacitors; forming a second plate electrode above and coupled with the signal electrode; depositing a second encapsulation layer on the second plate electrode; depositing a second dielectric on the second encapsulation layer; and forming a second plurality of trench capacitors within a second dielectric on the second plate electrode wherein individual ones of the second plurality of trench capacitors comprise a second dielectric layer comprising the perovskite material.

Example 20a: The method of example 19a, wherein forming individual ones of the first plurality of trench capacitors comprises: etching the first dielectric and the first encapsulation layer to form a first trench, wherein the first trench exposes the first plate electrode; forming a first dielectric spacer on sidewalls of the first trench; depositing a first electrode layer on a first base and adjacent to the first dielectric spacer, wherein the first electrode layer comprises a first conductive nonlinear polar material; depositing a first dielectric layer comprising a perovskite material on the first electrode layer; and depositing a second electrode layer on the first dielectric layer, wherein the second electrode layer comprises a second conductive nonlinear polar material; and wherein forming individual ones of the second plurality of trench capacitors comprises: etching the second dielectric and the second encapsulation layer to form a second trench, wherein the second trench exposes the second plate electrode; forming a second dielectric spacer on sidewalls of the second trench; depositing a third electrode layer on a second base and adjacent to the second dielectric spacer, wherein the third electrode layer comprises the first conductive nonlinear polar material; depositing the second dielectric layer comprising the perovskite material on the third electrode layer; and depositing a fourth electrode layer on the second dielectric layer, wherein the fourth electrode layer comprises the second conductive nonlinear polar material.

Example 1b: A device, comprising: a first level comprising: a first electrode structure; a first plate electrode on the first electrode structure; a first plurality of plate capacitors on the first plate electrode, wherein the first plurality of plate capacitors comprise a first perovskite material; a first signal electrode on the first plate electrode, wherein the first signal electrode is between a first pair of plate capacitors in the first plurality of plate capacitors; a second level above the first level, the second level comprising: a second electrode structure coupled with the first signal electrode; a second plate electrode on the second electrode structure; a second plurality of plate capacitors on the second plate electrode, wherein the second plurality of plate capacitors comprise a second perovskite material; and a second signal electrode on the second plate electrode, wherein the second signal electrode is between a second pair of plate capacitors in the second plurality of plate capacitors; and a third level above the second level, the second level comprising: a third electrode structure coupled with the second signal electrode; a third plate electrode on the third electrode structure; a third plurality of plate capacitors on the third plate electrode, wherein the first plurality of plate capacitors comprise a third perovskite material.

Example 2b: The device of claim 1b, wherein the first plate electrode extends continuously beyond a first perimeter of individual ones of the first plurality of plate capacitors, wherein the second plate electrode extends continuously beyond a second perimeter of individual ones of the second plurality of plate capacitors, and wherein the third plate electrode extends continuously beyond a third perimeter of individual ones of the third plurality of plate capacitors.

Example 3b: The device of claim 1b, wherein the first plate electrode, the second plate electrode, and the third plate electrode are vertically aligned and have a substantially same planar surface area.

Example 4b: The device of claim 1b, wherein the first electrode structure is laterally surrounded by a first etch stop layer, and where in the first electrode structure comprises a first layer comprising a conductive hydrogen barrier material, and wherein the second electrode structure is laterally surrounded by a second etch stop layer, and where in the second electrode structure comprises a second layer comprising the conductive hydrogen barrier material, and wherein the third electrode structure is laterally surrounded by a third etch stop layer, and where in the third electrode structure comprises a second layer comprising the conductive hydrogen barrier material.

Example 5b: The device of claim 1b, wherein individual ones of the first plurality of plate capacitors, individual ones of the second plurality of plate capacitors and individual ones of the third plurality of plate capacitors comprise: a first electrode, a second electrode and a dielectric layer comprising a perovskite material.

Example 6b: The device of claim 5b, further comprising: a first insulative hydrogen barrier layer encapsulating on at least a sidewall of the individual ones of the first plurality of plate capacitors; a second insulative hydrogen barrier layer encapsulating on at least a sidewall of the individual ones of the second plurality of plate capacitors; and a third insulative hydrogen barrier layer encapsulating on at least a sidewall of the individual ones of the third plurality of plate capacitors.

Example 7b: The device of claim 6b, wherein the first insulative hydrogen barrier layer is on portions of the first plate electrode, wherein the second insulative hydrogen barrier layer is on portions of the second plate electrode, and wherein the third insulative hydrogen barrier layer is on portions of the third plate electrode.

Example 8b: The device of claim 7b, further comprising: a fourth insulative hydrogen barrier layer on the first insulative hydrogen barrier layer and on sidewalls of the first plate electrode, a fifth insulative hydrogen barrier layer on the second insulative hydrogen barrier layer and on sidewalls of the second plate electrode, and a sixth insulative hydrogen barrier layer on the third insulative hydrogen barrier layer and on sidewalls of the third plate electrode.

Example 9b: The device of claim 8b, wherein the fourth insulative hydrogen barrier layer is adjacent to vertical portions of the first insulative hydrogen barrier layer that is adjacent to sidewalls of the individual ones of the first plurality of plate capacitors, wherein the fifth insulative hydrogen barrier layer is adjacent to vertical portions of the second insulative hydrogen barrier layer that is adjacent to sidewalls of the individual ones of the second plurality of plate capacitors, and wherein the sixth insulative hydrogen barrier layer is adjacent to vertical portions of the third insulative hydrogen barrier layer that is adjacent to sidewalls of the individual ones of the third plurality of plate capacitors.

Example 10b: The device of claim 1b, further comprises: a first plurality of via electrodes, wherein individual ones of the first plurality of via electrodes are on a respective one of the individual ones of the first plurality of plate capacitors; a second plurality of via electrodes, wherein individual ones of the second plurality of via electrodes are on a respective one of the individual ones of the second plurality of plate capacitors; and a third plurality of via electrodes, wherein individual ones of the third plurality of via electrodes are on a respective one of the individual ones of the third plurality of plate capacitors.

Example 11b: The device of claim 10b, further comprises: a first plurality of conductive vias, wherein individual ones of the first plurality of conductive vias are on a respective one of the individual ones of the first plurality of via electrodes and on the first signal electrode; a second plurality of conductive vias, wherein individual ones of the second plurality of conductive vias are on a respective one of the individual ones of the second plurality of via electrodes and on the second signal electrode; and a third plurality of conductive vias, wherein individual ones of the third plurality of conductive vias are on a respective one of the individual ones of the third plurality of via electrodes.

Example 12b: The device of claim 1b, wherein the first plate electrode comprises a first thickness under individual ones of the first plurality of plate capacitors and a second thickness away from the individual ones of the first plurality of plate capacitors, wherein the second plate electrode comprises a third thickness under individual ones of the second plurality of plate capacitors and a fourth thickness away from the individual ones of the second plurality of plate capacitors, and wherein the third plate electrode comprises a fifth thickness under individual ones of the third plurality of plate capacitors and a fourth thickness away from the individual ones of the third plurality of plate capacitors.

Example 13b: The device of claim 1b, wherein the first perovskite material, the second perovskite material and the third perovskite material comprise: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; hafnium oxides as Hf1-x Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where y includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100; or a paraelectric material comprising SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 14b: A device, comprising: a first level, comprising: a first electrode structure; a first plate electrode on the first electrode structure; a first plurality of trench capacitors comprising a first perovskite material on the first plate electrode; and a first signal electrode on the first plate electrode, wherein the first signal electrode is between a first pair of trench capacitors in the first plurality of trench capacitors; a second level above the first level, the second level comprising: a second electrode structure coupled with the first signal electrode; a second plate electrode on the second electrode structure; a second plurality of trench capacitors comprising a second perovskite material on the second plate electrode; and a second signal electrode on the second plate electrode, wherein the second signal electrode is between a second pair of trench capacitors in the second plurality of trench capacitors; and a third level above the second level, the third level comprising: a third electrode structure coupled with the second signal electrode; a third plate electrode on the third electrode structure; and a third plurality of trench capacitors comprising a third perovskite material on the third plate electrode.

Example 15b: The device of claim 14b, wherein individual ones of the first plurality of trench capacitors, individual ones of the second plurality of trench capacitors and individual ones of the third plurality of trench capacitors comprise: a dielectric spacer along a sidewall of individual ones of a plurality of trenches within a dielectric; a first electrode on a base and on the dielectric spacer along the sidewall of the individual ones of the plurality of trenches; a dielectric layer comprising a ferroelectric material, or a paraelectric material substantially conformal to the first electrode; and a second electrode in contact with the dielectric layer.

Example 16b: The device of claim 15b further comprises: a first plurality of via electrodes, wherein individual ones of the first plurality of via electrodes are on the second electrode of the individual ones of the first plurality of trench capacitors; a second plurality of via electrodes, wherein individual ones of the second plurality of via electrodes are on the second electrode of the individual ones of the second plurality of trench capacitors; and a third plurality of via electrodes, wherein individual ones of the third plurality of via electrodes are on the second electrode of the individual ones of the third plurality of trench capacitors.

Example 17b: The device of claim 16b further comprises: a first plurality of conductive vias, wherein the individual ones of the first plurality of conductive vias are on the individual ones of the first plurality of via electrodes and on the first signal electrode; a second plurality of conductive vias, wherein the individual ones of the second plurality of conductive vias are on the individual ones of the second plurality of via electrodes and on the second signal electrode; and a third plurality of conductive vias, wherein the individual ones of the third plurality of conductive vias are on the individual ones of the third plurality of via electrodes.

Example 18b: The device of claim 15b further comprises a first encapsulation layer on the first plate electrode and adjacent to the second electrode of the individual ones of the first plurality of trench capacitors, a second encapsulation layer on the second plate electrode and adjacent to the second electrode of the individual ones of the second plurality of trench capacitors, and a third encapsulation layer on the third plate electrode and adjacent to the second electrode of the individual ones of the third plurality of trench capacitors.

Example 19b: A system, comprising: a memory structure in a first level, the memory structure comprising: a first electrode structure; a first plate electrode on the first electrode structure; a first plurality of capacitors on the first plate electrode, wherein the first plurality of capacitors comprise a first perovskite material; a first signal electrode on the first plate electrode, wherein the first signal electrode is between a first pair of capacitors in the first plurality of capacitors; a second level above the first level, the second level comprising: a second electrode structure coupled with the first signal electrode; a second plate electrode on the second electrode structure; a second plurality of capacitors on the second plate electrode, wherein the second plurality of capacitors comprise a second perovskite material; and a second signal electrode on the second plate electrode, wherein the second signal electrode is between a second pair of capacitors in the second plurality of capacitors; and a third level above the second level, the second level comprising: a third electrode structure coupled with the second signal electrode; a third plate electrode on the third electrode structure; a third plurality of capacitors on the third plate electrode, wherein the third plurality of capacitors comprise a third perovskite material; and a fourth level below the first level, the fourth level comprising: a plurality of transistors, wherein individual ones of the plurality of transistors comprise: a source;

a drain; a gate between the source and the drain; a drain contact coupled with the drain; and a gate contact coupled with the gate; a bridge structure connected between the gate contact of a first transistor in the plurality of transistors to the drain contact of a second transistor in the plurality of transistors, wherein the memory structure is coupled to the bridge structure.

Example 20b: The system of claim 19b, wherein the first plurality of capacitors, the second plurality of capacitors and the third plurality of capacitors are planar plate capacitors or trench capacitors, and wherein the first perovskite material, the second perovskite material and the third perovskite material comprise a same material.

What is claimed is:

1. A method of fabricating a system, the method comprising:
    fabricating a plurality of transistors within a first level, wherein individual ones of the plurality of transistors comprise a source, a drain, and a gate between the source and the drain, a drain contact coupled with the drain and a gate contact coupled with the gate;
    forming a bridge structure connected between the gate contact of a first transistor in the plurality of transistors to the drain contact of a second transistor in the plurality of transistors;
    forming a first plate electrode above and coupled with the bridge structure;
    forming a first plurality of trench capacitors within a first dielectric on the first plate electrode wherein individual ones of the first plurality of trench capacitors comprise a first dielectric layer comprising a perovskite material;
    forming a signal electrode on the first plate electrode between a pair of trench capacitors of the individual ones of the first plurality of trench capacitors;
    forming a second plate electrode above and coupled with the signal electrode; and
    forming a second plurality of trench capacitors within a second dielectric on the second plate electrode wherein individual ones of the second plurality of trench capacitors comprise a second dielectric layer comprising the perovskite material.

2. The method of claim 1, wherein prior to forming the first plate electrode, the method further comprises:
    forming a conductive interconnect coupled with the bridge structure;
    forming a first electrode structure on the conductive interconnect by forming an opening in a first etch stop layer deposited on the conductive interconnect and by filling the opening with a conductive material; and
    depositing a first conductive layer on the first electrode structure,
    wherein forming the first plate electrode further comprises etching the first conductive layer.

3. The method of claim 2, wherein prior to forming the second plate electrode, the method further comprises:
    forming a second electrode structure on the signal electrode by forming an opening in a second etch stop layer deposited on the signal electrode and by filling the opening with the conductive material; and
    depositing a second conductive layer on the signal electrode,
    wherein forming the second plate electrode further comprises etching the second conductive layer.

4. The method of claim 1, wherein forming the first plurality of trench capacitors comprises:
    etching the first dielectric to form a first plurality of trenches, and exposing first portions of the first plate electrode;
    forming a first dielectric spacer on sidewalls of individual ones of the first plurality of trenches;
    depositing a first electrode layer on a first base of the individual ones of the first plurality of trenches and adjacent to the first dielectric spacer, wherein the first electrode layer comprises a first conductive layer;
    depositing the first dielectric layer comprising the perovskite material on the first electrode layer; and
    depositing a second electrode layer on the first dielectric layer, wherein the second electrode layer comprises a second conductive layer.

5. The method of claim 4, wherein forming the second plurality of trench capacitors comprises:
    etching the second dielectric to form a second plurality of trenches, and exposing second portions of the second plate electrode;
    forming a second dielectric spacer on sidewalls of individual ones of the second plurality of trenches;
    depositing a third electrode layer on a second base of the individual ones of the second plurality of trenches and adjacent to the second dielectric spacer, wherein the third electrode layer comprises the first conductive layer;
    depositing the second dielectric layer comprising the perovskite material on the third electrode layer; and
    depositing a fourth electrode layer on the second dielectric layer, wherein the fourth electrode layer comprises the second conductive layer.

6. The method of claim 1 further comprising:
    forming a first plurality of via electrodes, wherein individual ones of the first plurality of via electrodes are formed on the individual ones of the first plurality of trench capacitors by depositing a third dielectric on the first plurality of trench capacitors and on the first dielectric and forming a first plurality of openings in the third dielectric; and
    forming a second plurality of via electrodes, wherein individual ones of the second plurality of via electrodes are formed on the individual ones of the second plurality of trench capacitors by depositing a fourth dielectric on the second plurality of trench capacitors and on the second dielectric and forming a second plurality of openings in the third dielectric.

7. The method of claim 6, further comprising forming a plurality of conductive vias, wherein individual ones of the plurality of conductive vias are formed on the individual ones of the first plurality of via electrodes, and on the signal electrode, and wherein forming the plurality of conductive vias further comprises depositing a fifth dielectric on the third dielectric, and etching a third plurality of openings in the fifth dielectric.

8. The method of claim 7, wherein immediately after forming the plurality of conductive vias and prior to forming the second plate electrode, the method further comprises:
    depositing a second etch stop layer above the plurality of conductive vias;
    forming a second electrode structure coupled with a conductive via in the plurality of conductive vias formed on the signal electrode, wherein forming the second electrode structure comprises forming an opening in the second etch stop layer and by filling the opening with a conductive material; and
    planarizing to form the second electrode structure.

9. The method of claim 1, wherein forming the signal electrode further comprises forming between an equal number of trench capacitors in the first plurality of trench capacitors on either side of the signal electrode.

10. The method of claim 5, wherein forming the first dielectric spacer comprises:
conformally depositing a first insulator layer comprising silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$ on the first base and on the sidewalls of the individual ones of the first plurality of trenches; and
etching and removing the first insulator layer from the first base,
wherein forming the second dielectric spacer comprises:
conformally depositing a second insulator layer comprising silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$ on the second base and on the sidewalls of the individual ones of the second plurality of trenches; and
etching and removing the second insulator layer from the second base.

11. The method of claim 1, wherein depositing the perovskite material comprises depositing one of:
bismuth ferrite (BFO) or BFO with a first doping material, where in the first doping material is one of lanthanum or elements from lanthanide series of periodic table;
lead zirconium titanate (PZT) or PZT with a second doping material, wherein the second doping material is one of La or Nb;
a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST);
a perovskite material which includes one of: $BaTiO_3$, $PbTiO_3$, $KNbO_3$, or $NaTaO_3$; hexagonal ferroelectric which includes one of: $YMnO_3$, or $LuFeO_3$;
hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
hafnium (Hf), zirconium (Zr), aluminum (Al), silicon (Si), their oxides, or their alloyed oxides;
hafnium oxides as $Hf_{(1-x)}E_xO_y$, where E can be Al, Ca, Ce, Dy, Er, Gd, Ge, La, Sc, Si, Sr, Sn, Zr, or Y, where x and y are first and second fractions, resepectively;
$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where x and y third and fourth fractions, respectively,
y doped $HfO_2$, where y includes one of: Al, Ca, Ce, Dy, Er, Gd, Ge, La, Sc, Si, Sr, Sn, or Y;
niobate type compounds $LiNbO_3$, $LiTaO_3$, lithium iron tantalum oxy fluoride, barium strontium niobate, sodium barium niobate, or potassium strontium niobate;
an improper ferroelectric material which includes one of: [PTO/STO]n or [LAO/STO]n, where 'n' is between 1 and 100; or
a paraelectric material comprising $SrTiO_3$, $Ba_{(x)}Sr_{(y)}TiO_3$ (where x is −0.05, and y is 0.95), $HfZrO_2$, Hf—Si—O, La-substituted $PbTiO_3$, or a PMN-PT based relaxor ferroelectrics.

12. The method of claim 1, wherein the signal electrode is a first signal electrode and the method further comprising:
forming a second signal electrode on the second plate electrode between a pair of trench capacitors of the individual ones of the second plurality of trench capacitors;
forming a third plate electrode above and coupled with the second signal electrode; and
forming a third plurality of trench capacitors within a sixth dielectric on the third plate electrode, wherein individual ones of the third plurality of trench capacitors comprise a third dielectric layer comprising the perovskite material.

13. A method of fabricating a system, the method comprising:
fabricating a plurality of transistors within a first level, wherein individual ones of the plurality of transistors comprise a source, a drain, a gate between the source and the drain, a drain contact coupled with the drain and a gate contact coupled with the gate;
forming a bridge structure connected between the gate contact of a first transistor in the plurality of transistors to the drain contact of a second transistor in the plurality of transistors;
forming a first plate electrode above and coupled with the bridge structure, the first plate electrode extending along a first direction;
forming a first plurality of trench capacitors within a first dielectric on the first plate electrode, wherein individual ones of the first plurality of trench capacitors comprise a first dielectric layer comprising a perovskite material and a first conductive hydrogen barrier layer, wherein the first conductive hydrogen barrier layer is in contact with the first plate electrode;
forming a signal electrode on the first plate electrode between a pair of trench capacitors of the individual ones of the first plurality of trench capacitors;
forming a second plate electrode above and coupled with the signal electrode; and
forming a second plurality of trench capacitors within a second dielectric on the second plate electrode wherein individual ones of the second plurality of trench capacitors comprise a second dielectric layer comprising the perovskite material and a second conductive hydrogen barrier layer, and wherein the second conductive hydrogen barrier layer is in contact with the second plate electrode.

14. The method of claim 13, wherein forming the individual ones of the first plurality of trench capacitors comprises:
etching the first dielectric to form a first trench, wherein the first trench exposes the first plate electrode;
depositing the first conductive hydrogen barrier layer on a first base and along sidewalls of the first trench;
depositing a first electrode layer on the first conductive hydrogen barrier layer, wherein the first electrode layer comprises a first conductive layer;
depositing the first dielectric layer comprising the perovskite material on the first electrode layer; and
depositing a second electrode layer on the first dielectric layer, wherein the second electrode layer comprises a second conductive layer.

15. The method of claim 14, wherein forming individual ones of the second plurality of trench capacitors comprises:
- etching the second dielectric to form a second trench, wherein the second trench exposes the second plate electrode;
- depositing the second conductive hydrogen barrier layer on a second base and along sidewalls of the second trench;
- depositing a third electrode layer on the second conductive hydrogen barrier layer, wherein the third electrode layer comprises the second conductive layer;
- depositing the second dielectric layer comprising the perovskite material on the third electrode layer; and
- depositing a fourth electrode layer on the second dielectric layer, wherein the fourth electrode layer comprises the second conductive layer.

16. The method of claim 14, wherein forming the first plurality of trench capacitors further comprises performing a chemical mechanical planarization process to form an uppermost surface comprising the second electrode layer surrounded by an annular ring of the first dielectric layer, wherein the annular ring of the first dielectric layer is further surrounded by the first electrode layer, and wherein the annular ring of the first electrode layer is further surrounded by the second conductive hydrogen barrier layer and wherein the second conductive hydrogen barrier layer, the first electrode layer and the first dielectric layer are a substantially U-shaped, and the second electrode layer is substantially cylindrical.

17. The method of claim 13, wherein forming the first plurality of trench capacitors further comprises forming on a first vertical plane and wherein the method further comprises forming a third plurality of trench capacitors on a second vertical plane behind the first vertical plane, wherein forming the second plurality of trench capacitors further comprises forming on the first vertical plane, and wherein the method further comprises forming a fourth plurality of trench capacitors on the second vertical plane behind the first vertical plane.

18. The method of claim 17, wherein the signal electrode is formed on the first vertical plane, the second vertical plane or on a third vertical plane between the first vertical plane and the second vertical plane.

19. A method of fabricating a system, the method comprising:
- fabricating a plurality of transistors within a first level, wherein individual ones of the plurality of transistors comprise a source, a drain, and a gate between the source and the drain, a drain contact coupled with the drain and a gate contact coupled with the gate;
- forming a bridge structure connected between the gate contact of a first transistor in the plurality of transistors to the drain contact of a second transistor in the plurality of transistors;
- forming a first plate electrode above and coupled with the bridge structure;
- depositing a first encapsulation layer on the first plate electrode;
- depositing a first dielectric on the first encapsulation layer;
- forming a first plurality of trench capacitors within the first dielectric and the first encapsulation layer, wherein individual ones of the first plurality of trench capacitors comprise a first dielectric layer comprising a perovskite material;
- forming a signal electrode on the first plate electrode between a pair of trench capacitors of the individual ones of the first plurality of trench capacitors;
- forming a second plate electrode above and coupled with the signal electrode;
- depositing a second encapsulation layer on the second plate electrode;
- depositing a second dielectric on the second encapsulation layer; and
- forming a second plurality of trench capacitors within a second dielectric on the second plate electrode, wherein individual ones of the second plurality of trench capacitors comprise a second dielectric layer comprising the perovskite material.

20. The method of claim 19, wherein forming individual ones of the first plurality of trench capacitors comprises:
- etching the first dielectric and the first encapsulation layer to form a first trench, wherein the first trench exposes the first plate electrode;
- forming a first dielectric spacer on sidewalls of the first trench;
- depositing a first electrode layer on a first base and adjacent to the first dielectric spacer, wherein the first electrode layer comprises a first conductive layer;
- depositing a first dielectric layer comprising a perovskite material on the first electrode layer; and
- depositing a second electrode layer on the first dielectric layer, wherein the second electrode layer comprises a second conductive layer; and wherein forming individual ones of the second plurality of trench capacitors comprises:
- etching the second dielectric and the second encapsulation layer to form a second trench, wherein the second trench exposes the second plate electrode;
- forming a second dielectric spacer on sidewalls of the second trench;
- depositing a third electrode layer on a second base and adjacent to the second dielectric spacer, wherein the third electrode layer comprises the first conductive layer;
- depositing the second dielectric layer comprising the perovskite material on the third electrode layer; and
- depositing a fourth electrode layer on the second dielectric layer, wherein the fourth electrode layer comprises the second conductive layer.

* * * * *